(12) United States Patent
Nishiyama et al.

(10) Patent No.: US 8,995,090 B2
(45) Date of Patent: Mar. 31, 2015

(54) WIRING CIRCUIT FLEXIBLE SUBSTRATE INCLUDING A TERMINAL SECTION AND A CONNECTING SECTION

(75) Inventors: Jin Nishiyama, Tokyo-to (JP); Yuji Narita, Tokyo-to (JP)

(73) Assignee: Dai Nippon Printing Co., Ltd., Tokyo (JP)

(*) Notice: Subject to any disclaimer, the term of this patent is extended or adjusted under 35 U.S.C. 154(b) by 0 days.

(21) Appl. No.: 14/003,372

(22) PCT Filed: Feb. 24, 2012

(86) PCT No.: PCT/JP2012/054634
§ 371 (c)(1),
(2), (4) Date: Sep. 5, 2013

(87) PCT Pub. No.: WO2012/121032
PCT Pub. Date: Sep. 13, 2012

(65) Prior Publication Data
US 2013/0342936 A1     Dec. 26, 2013

(30) Foreign Application Priority Data

Mar. 8, 2011   (JP) ................................. 2011-050569

(51) Int. Cl.
| G11B 5/48 | (2006.01) |
| H05K 1/11 | (2006.01) |
| H05K 1/05 | (2006.01) |
| H05K 3/42 | (2006.01) |
| H05K 1/03 | (2006.01) |

(52) U.S. Cl.
CPC ............... *H05K 1/118* (2013.01); *G11B 5/486* (2013.01); *H05K 1/0393* (2013.01); *H05K 1/056* (2013.01); *H05K 1/111* (2013.01); *G11B 5/4806* (2013.01); *H05K 3/42* (2013.01)

USPC .................... 360/234.5; 360/245.8; 360/245.9

(58) Field of Classification Search
USPC ............. 360/234.5, 245.8, 245.9, 246, 264.2, 360/234.6
See application file for complete search history.

(56) References Cited

U.S. PATENT DOCUMENTS

| 7,466,519 | B2 * | 12/2008 | Wakaki et al. ............. 360/245.9 |
| 8,395,866 | B1 * | 3/2013 | Schreiber et al. .......... 360/245.9 |

(Continued)

FOREIGN PATENT DOCUMENTS

| JP | 2003-031915 A | 1/2003 |
| JP | 2006-004599 A | 1/2006 |
| JP | 2006-310491 A | 11/2006 |
| JP | 2007-537562 A | 11/2006 |
| JP | 2010-218626 A | 9/2010 |
| JP | 2011-044228 A | 3/2011 |

OTHER PUBLICATIONS

International Search Report mailed Apr. 10, 2012; PCT/JP2012/054634.

*Primary Examiner* — Jefferson Evans
(74) *Attorney, Agent, or Firm* — Ladas & Parry LLP

(57) ABSTRACT

A wiring circuit substrate, comprising: a metal support layer; an insulating layer formed on the metal support layer; a conductive layer for wiring formed on the insulating layer; and an opening formed so as to open at a same location in the insulating layer and the conductive layer for wiring, wherein the metal support layer includes: a support section that supports the insulating layer and the conductive layer for wiring, and a terminal section that extends from one edge side to the other edge side of the opening, the terminal section being separated from the support section; and the conductive layer for wiring includes a wiring that is connected to the terminal section by a connecting section.

24 Claims, 32 Drawing Sheets

(56) References Cited

U.S. PATENT DOCUMENTS

| | | | |
|---|---|---|---|
| 8,462,464 B1 * | 6/2013 | Dunn | 360/245.9 |
| 8,553,364 B1 * | 10/2013 | Schreiber et al. | 360/245.9 |
| 2005/0254175 A1 | 11/2005 | Swanson et al. | |
| 2005/0280944 A1 | 12/2005 | Yang et al. | |
| 2010/0182721 A1 * | 7/2010 | Ogawa | 360/245.8 |
| 2010/0238581 A1 | 9/2010 | Nakamura et al. | |
| 2012/0113547 A1 * | 5/2012 | Sugimoto | 360/245.8 |

* cited by examiner

FIG. 47A
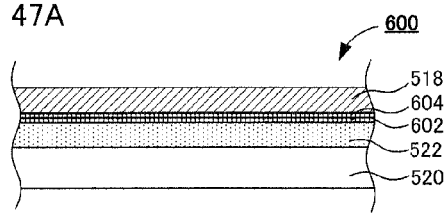
FIG. 47B
FIG. 47C
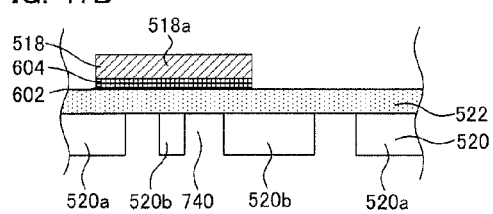
FIG. 47D
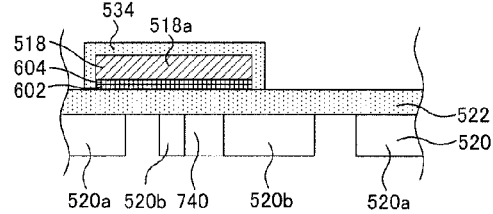
FIG. 47E
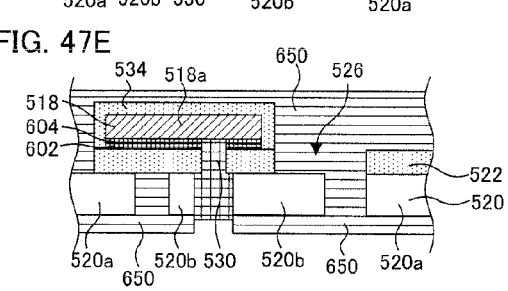
FIG. 47F
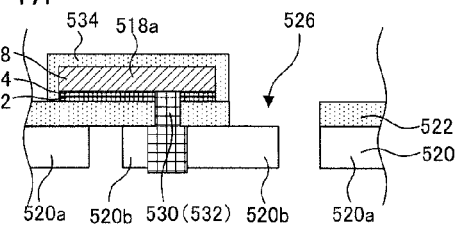
FIG. 47G
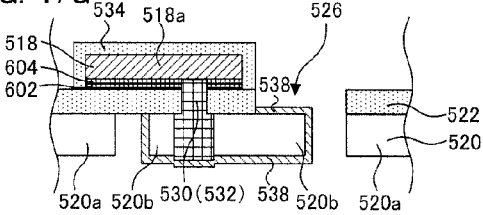
FIG. 47H
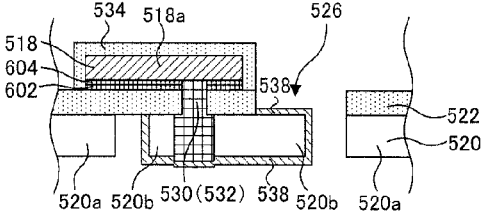

WIRING CIRCUIT FLEXIBLE SUBSTRATE INCLUDING A TERMINAL SECTION AND A CONNECTING SECTION

TECHNICAL FIELD

The present invention relates to a wiring circuit substrate, and relates to a wiring circuit substrate which can be used in a flexible substrate for suspension of, for example, a hard disk drive (hereinafter, abbreviated as HDD).

Also, the present invention relates to a flexible substrate for suspension which can be used in an HDD, and a producing method thereof.

BACKGROUND ART

In a wiring circuit substrate used in an electronic/electric device or the like, a terminal for connection to an external circuit is formed. As such a terminal, there is known a flying lead (hereinafter, abbreviated as FL) in which not only one side of a conductive layer but also both sides thereof are used as a terminal in order to cope with high density and miniaturization of a recent electronic/electric device.

For example, in a suspension substrate with circuit, which is a wiring circuit substrate used in an HDD, an FL may be included as a terminal. A suspension substrate with circuit, which has an FL, includes a metal support layer made of stainless steel, a first insulating layer formed on the metal support layer and made of polyimide, a conductive layer for wiring formed on the first insulating layer, used as a wiring and made of copper, and a second insulating layer formed on the conductive layer for wiring and made of polyimide.

In such a suspension substrate with circuit, an FL is formed by: exposing a front surface of the conductive layer for wiring by opening the second insulating layer and simultaneously exposing a rear surface of the conductive layer for wiring by opening the metal support layer and the first insulating layer; and performing Ni plating or Au plating and the like on both exposed surfaces of the conductive layer for wiring. The FL formed in the above manner is connected to a terminal of an external circuit by applying ultrasonic vibration by using, for example, a bonding tool.

However, since such an FL is provided with the exposed conductive layer for wiring made of copper, there have been problems in that mechanical strength is weak, and a wiring is easily disconnected due to stress concentration on the exposed conductive layer for wiring during ultrasonic bonding.

In Patent Literature 1, as a method for coping with such problems, there is proposed a technique that reinforces mechanical strength of an FL in such a manner that an edge section in an opening exposing a conductive layer for wiring constituting the FL, and a wide section expanding in a width direction substantially perpendicular to an extending direction of the conductive layer for wiring in a portion intersecting with the conductive layer for wiring are formed on the conductive layer for wiring.

Moreover, in Patent Literature 1, there is also proposed a technique that reinforces mechanical strength of an FL in such a manner that, in a first insulating layer and a second insulating layer, a protrusion protruding from the edge section side of the above-described opening to a central section side is formed along front and rear surfaces of the conductive layer for wiring exposed to the opening.

Also, in Patent Literature 2, there is proposed a technique that reinforces mechanical strength of an FL in such a manner that, in a conductive layer for wiring constituting the FL, a thickness of a portion exposed to the above-described opening is made thicker than a thickness of a portion not exposed to the opening by a copper plating method or the like.

As described above, in the suspension substrate with wiring circuit having the FL proposed in Patent Literatures 1 and 2, the mechanical strength of the FL is reinforced. Therefore, in these suspension substrates with wiring circuit, the wiring disconnection of the FL is prevented when bonding the FL and the terminal of the external circuit, leading to an improvement in connection reliability therebetween.

On the other hand, in a flexible substrate for suspension used in an HDD, a terminal section for connection to an external circuit is formed for connection to the external circuit. As such a terminal section for connection to the external circuit, there is known an FL in which a wiring conductive layer, whose front surface and rear surface are exposed, is used in order to cope with high density and miniaturization of a recent electronic/electric device.

The mechanical strength of the FL may be insufficient because the front surface and the rear surface of the FL are exposed, and the wiring conductive layer used in the FL is made of copper (hereinafter, abbreviated as Cu). For this reason, when the FL is connected to the terminal of the external circuit side by the bonding tool such as ultrasonic bonding, problems such as the wiring disconnection of the FL have occurred. In order to solve such problems, there are proposed the flexible substrates for suspension having the FL proposed in Patent Literatures 1 and 2.

CITATION LIST

Patent Literature

PTL 1: Japanese Patent Application Publication Laid-Open (JP-A) No. 2003-031915
PTL 2: JP-A No. 2006-310491

SUMMARY OF INVENTION

Technical Problem

The FL proposed in Patent Literature 1 has had a problem that might not obtain sufficient mechanical strength. Also, in the FL proposed in Patent Literature 2, there occurs a problem in that production costs increase because the extra process of forming the portion exposed to the above-described opening thicker than the portion not exposed to the opening by the copper plating method or the like is required in the conductive layer for wiring constituting the FL.

The present invention has been made in view of the above problems, and a first object of the present invention is to provide a wiring circuit substrate that can be produced without requiring the extra process and has sufficient mechanical strength.

On the other hand, in a flexible substrate for suspension, an element such as a slider mounted with a magnetic head is mounted and, like the above-described terminal section for connection to the external circuit, a terminal section formed of a wiring conductive layer is used as a terminal section to be connected to an element-side terminal included in the element.

Also, in order to increase reliability of connection to the element-side terminal, like the above-described FL, in particular, a conductive layer for wiring, whose front surface and rear surface are exposed, is used as a terminal section to be connected to the element-side terminal. Furthermore, when such a terminal section is connected to the element-side terminal, soldering or the like is used, and thus, heat is applied. Therefore, the terminal section is easily deformed. As these results, when the terminal section to be connected to the element-side terminal is connected to the element-side terminal, there occur problems such as the deformation and/or wiring disconnection thereof.

The present invention has been made in view of the above problems, and a second object of the present invention is to provide a flexible substrate for suspension in which the terminal section to be connected to the element-side terminal has sufficient mechanical strength.

Solution to Problem

In order to achieve the first object, the present invention provides a wiring circuit substrate, comprising: a metal support layer; an insulating layer formed on the metal support layer; a conductive layer for wiring formed on the insulating layer; and an opening formed so as to open at a same location in the insulating layer and the conductive layer for wiring, characterized in that the metal support layer includes: a support section that supports the insulating layer and the conductive layer for wiring, and a terminal section that extends from one edge side to the other edge side of the opening, the terminal section being separated from the support section; and the conductive layer for wiring includes a wiring that is connected to the terminal section by a connecting section.

According to the present invention, an FL is provided with the terminal section that is formed of the metal support layer. Therefore, the mechanical strength of the FL can be increased more than an FL provided with an exposed conductive layer for wiring.

In the invention, it is preferable that the connecting section is a conductor inside a via hole formed in the insulating layer. This is because the mechanical strength of the FL can be increased in the wiring circuit substrate having a simple structure.

In the invention, it is preferable that the conductive layer for wiring further comprises a separating section that is formed between the conductor inside the via hole and the opening and is separated from the wiring. This is because the mechanical strength of the wiring circuit substrate can be increased.

In the invention, it is preferable that a conductive layer for connection is formed on the terminal section, and the conductive layer for connection is used as the connecting section. This is because the mechanical strength of the FL can be increased in the wiring circuit substrate having a simple structure.

Also, this is because when the wiring is connected to the terminal section through the conductor inside the via hole, the area where the conductive layer for connection contacts the terminal section can be increased more than the area where the conductor inside the via hole contacts the terminal section. Therefore, the resistance between the wiring and the terminal section can be reduced more than the case where the wiring is connected to the terminal section through the conductor inside the via hole.

In the invention, it is preferable that the conductive layer for connection is formed from one edge side to the other edge side of the opening on the terminal section. This is because the FL is provided with the terminal section and the conductive layer for connection, and the conductive layer for connection has higher electrical conductivity than the metal support layer constituting the terminal section, and thus, the resistance of the FL itself can be reduced.

In the invention, it is preferable that a plated layer including at least one of Ni and Au are formed on front surfaces and rear surfaces of the terminal section and the conductive layer for connection. This is because when the FL is provided with the terminal section and the plated layer and the FL is connected to the external circuit, the external circuit contacts the plated layer, and thus the contact resistance between the FL and the external circuit is reduced.

Also, the present invention provides a method of producing a wiring circuit substrate, which produces the wiring circuit substrate, the method comprising steps of: forming the terminal section; connecting the wiring to the terminal section by the connecting section; and forming the plated layers each including at least one of Ni and Au on front surfaces and rear surfaces of the terminal section and the conductive layer for connection.

According to the present invention, it is possible to produce the wiring circuit substrate in which the FL is provided with the terminal section and the plated layer. Therefore, it is possible to produce the wiring circuit substrate in which the FL has larger mechanical strength than the FL provided with the exposed conductive layer for wiring, and the contact resistance between the FL and the external circuit is reduced.

Also, the present invention provides the flexible substrate for suspension, comprising the wiring circuit substrate.

According to the present invention, since the wiring circuit substrate is used in the flexible substrate for suspension, the wiring disconnection of the FL can be prevented, and the connection reliability between the FL and the external circuit can be improved.

Also, the present invention provides the suspension, comprising the wiring circuit substrate.

According to the present invention, since the wiring circuit substrate is used in the suspension, the wiring disconnection of the FL can be prevented and thus the connection reliability between the FL and the external circuit can be improved.

Also, the present invention provides a suspension with element, comprising: the suspension; and an element to be mounted in the element mounting region.

According to the present invention, since the suspension is used in the suspension with element, the wiring disconnection of the FL can be prevented and thus the connection reliability between the FL and the external circuit can be improved.

Also, the present invention provides a hard disk drive, comprising the above-described suspension with element.

According to the present invention, since the suspension with element is used in the hard disk drive, the wiring disconnection of the FL can be prevented and thus the connection reliability between the FL and the external circuit can be improved.

On the other hand, in order to achieve the second object, the present invention provides a flexible substrate for suspension, comprising: a metal support layer; an insulating layer formed on the metal support layer; a conductive layer for wiring formed on the insulating layer; and an element mounting region, characterized in that the metal support layer includes: a support section that supports the insulating layer and the conductive layer for wiring, and a terminal section that is separated from the support section; the terminal section is connected to an element-side terminal included in an element to be mounted in the element mounting region; and the conductive layer for wiring includes an inter-terminal wiring that is connected to the terminal section by a connecting section.

According to the present invention, in the flexible substrate for suspension, the terminal section included in the metal support layer is used as the terminal section to be connected to the element-side terminal included in the element to be mounted in the element mounting region. Therefore, the mechanical strength of the terminal section to be connected to the element-side terminal can be increased more than the case of using the terminal section included in the conductive layer for wiring. This can prevent the deformation and/or wiring disconnection of the terminal section to be connected to the element-side terminal.

In the invention, it is preferable that the connecting section is a conductor filled in a via hole that is formed in the insulating layer and passes from a side of the conductive layer for wiring to a side of the metal support layer. In the flexible substrate for suspension having a simple structure, it is possible to prevent the deformation and/or wiring disconnection of the terminal section to be connected to the element-side terminal.

In the present invention, it is preferable that the connecting section is a conductor filled in a via hole that is formed in the metal support layer and the insulating layer and passes from a side of the metal support layer opposite to a side of the insulating layer to a side of the conductive layer for wiring of the insulating layer. In the flexible substrate for suspension having a simple structure, it is possible to prevent the deformation and/or wiring disconnection of the terminal section to be connected to the element-side terminal, and it is possible to improve the wiring degree of freedom of the wiring included in the conductive layer for wiring.

In the invention, it is preferable that the connecting section is a conductive layer for connection formed on the terminal section. This is because the area contacting the terminal section is larger in the conductive layer for connection side than the above-described conductor filled in the via hole, and thus, the resistance between the connecting section and the terminal section is reduced. Also, this is because when the element-side terminal is connected to the terminal section by ball bonding using solder, the connection area is increased and thus the connection reliability between the terminal section and the element-side terminal is increased.

In the invention, it is preferable that a plated layer including at least one of Ni and Au are formed on a front surface and a rear surface of the terminal section. This is because when the terminal section is connected to the element-side terminal included in the element to be mounted in the element mounting region, the resistance between the terminal section and the element-side terminal is reduced.

Also, the present invention provides a method of producing a flexible substrate for suspension, which produces the above-described flexible substrate for suspension, comprising steps of: forming the terminal section; and forming the connecting section.

According to the present invention, by the method of producing the flexible substrate for suspension, it is possible to produce the flexible substrate for suspension in which the terminal section separated from the support section of the metal support layer is used as the terminal section to be connected to the element-side terminal that is included in the element to be mounted in the element mounting region. Therefore, it is possible to produce the flexible substrate for suspension in which the mechanical strength of the terminal section to be connected to the element-side terminal can be increased more than the case of using the terminal section included in the conductive layer for wiring. This can prevent the deformation and/or wiring disconnection of the terminal section to be connected to the element-side terminal.

Also, the present invention provides a suspension, comprising the above-described flexible substrate for suspension.

According to the present invention, since the above-described flexible substrate for suspension is used in the suspension, the mechanical strength of the terminal section to be connected to the element-side terminal can be increased more than the case where the conductive layer for wiring is used as the terminal section. This can prevent the deformation and/or wiring disconnection of the terminal section to be connected to the element-side terminal.

Also, the present invention provides a suspension with element, comprising: the suspension; and an element to be mounted in the element mounting region.

According to the present invention, since the above-described suspension is used in the suspension with element, the mechanical strength of the terminal section to be connected to the element-side terminal can be increased more than the case where the conductive layer for wiring is used as the terminal section. This can prevent the deformation and/or wiring disconnection of the terminal section to be connected to the element-side terminal.

In the invention, it is preferable that an element-side terminal included in the element to be mounted in the element mounting region is provided in a side of the conductive layer for wiring with reference to the metal support layer, and the terminal section is exposed by a removal section in which the insulating layer and the conductive layer for wiring are removed, such that the terminal section is connectable to the element-side terminal. This is because the terminal section can be connected to the element-side terminal provided in the conductive layer for wiring side with reference to the metal support layer.

In the invention, the element-side terminal is preferably provided on a surface facing the metal support layer in the element to be mounted in the element mounting region. In the flexible substrate for suspension, it is possible to solve the problem that the terminal section is deformed because the thickness of the element mounting region is increased, the weight is increased, and the weight of the slider-side terminal is loaded to the terminal section.

In the invention, an element-side terminal included in the element to be mounted in the element mounting region is preferably provided in a side opposite to a side of the conductive layer for wiring with reference to the metal support layer. This is because the terminal section included in the metal support layer can be connected without passing through the removal section in which the insulating layer and the conductive layer for wiring are removed.

In the invention, it is preferable that the suspension with element includes a slider and a heat-assisted element as the element to be mounted in the element mounting region, the heat-assisted element includes, as an element-side terminal to be connected to the terminal section, a heat-assisted element-side terminal provided in a side opposite to a side of the conductive layer for wiring with reference to the metal support layer, the slider includes a slider-side terminal provided in the side of the conductive layer for wiring with reference to the metal support layer, and the conductive layer for wiring includes a slider-side terminal connection wiring to be connected to the slider-side terminal. This is because when the flexible substrate for suspension includes the slider and the heat-assisted element as the element to be mounted in the element mounting region, the slider-side terminal can be provided at a location close to the conductive layer for wiring.

Also, the present invention provides a hard disk drive, comprising the above-described suspension with element.

According to the present invention, since the above-described suspension with element is used in the hard disk drive, the mechanical strength of the terminal section to be connected to the element-side terminal can be increased more than the case where the conductive layer for wiring is used as the terminal section. This can prevent the deformation and/or wiring disconnection of the terminal section to be connected to the element-side terminal.

Advantageous Effects of Invention

In the present invention, in the wiring circuit substrate, it is advantageously possible to increase the mechanical strength of the FL.

Also, in the present invention, in the flexible substrate for suspension, it is advantageously possible to prevent the deformation and/or wiring disconnection of the terminal section to be connected to the element-side terminal that is included in the element to be mounted in the element mounting region.

BRIEF DESCRIPTION OF DRAWINGS

FIGS. 47A to 47H are schematic process cross-sectional views illustrating a fourth example of the method of producing the flexible substrate for suspension of the present invention.

DESCRIPTION OF EMBODIMENTS

Figure 1:
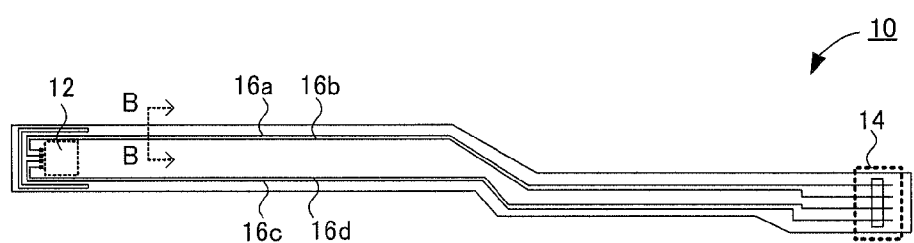
FIG. 1 is a schematic plan view illustrating an example of a wiring circuit substrate of the present invention.

Hereinafter, a wiring circuit substrate, a flexible substrate for suspension, a suspension, a suspension with element, a hard disk drive, and a method of producing a wiring circuit substrate of the present invention will be described in detail.

A. Wiring Circuit Substrate

First, a wiring circuit substrate of the present invention will be described. The wiring circuit substrate of the present invention comprises: a metal support layer; an insulating layer formed on the metal support layer; a conductive layer for wiring formed on the insulating layer; and an opening formed so as to open at a same location in the insulating layer and the conductive layer for wiring, characterized in that the metal support layer includes: a support section that supports the insulating layer and the conductive layer for wiring, and a terminal section that extends from one edge side to the other edge side of the opening, the terminal section being separated from the support section; and the conductive layer for wiring includes a wiring that is connected to the terminal section by a connecting section.

According to the present invention, an FL is provided with the terminal section that is formed of the metal support layer. Therefore, the mechanical strength of the FL can be increased more than an FL provided with an exposed conductive layer for wiring.

Also, since the mechanical strength of the FL can be increased, a dimension of the FL in a width direction can be reduced. Therefore, the number of wirings in the FL is increased, making it possible to provide the wirings in FL at high density.

Furthermore, as in the prior art, when the FL is provided with the exposed conductive layer for wiring, the insulating layer and the metal support layer exist under the FL. Therefore, when the FL and an external circuit are connected together, a distance from the FL to the external circuit is increased. On the contrary, according to the present invention, the FL can be provided with the terminal section included in the metal support layer. Therefore, when the FL and the external circuit are connected together under the FL, a distance from the FL to the external circuit can be reduced. Since this reduces a bonding distance, a gold plating thickness of the terminal section or a gold plating thickness of the external circuit can be reduced, and the use of a material in a bonding section can be reduced. Furthermore, since the boding distance is reduced, bonding position accuracy of the external circuit and the FL can be improved.

Also, in the present invention, since the mechanical strength of the FL can be increased by providing the FL with the terminal section, the metal support layer including the terminal section can be formed thinly. In this case, since the thickness of the entire flexible can be reduced, it is possible to cope with a reduction in the weight of the wiring circuit substrate.

Hereinafter, the wiring circuit substrate of the present invention will be described in detail.

FIG. 1 is a schematic plan view illustrating an example of the wiring circuit substrate of the present invention, and more specifically, a schematic plan view illustrating a flexible substrate for suspension used in a hard disk drive. Incidentally, for convenience, a description of a cover layer is omitted. The flexible substrate 10 for suspension illustrated in FIG. 1 comprises an element mounting region 12 for mounting an element at a leading end of one side, and a connecting region 14 for performing connection to an external circuit at a leading end of the other side. Furthermore, the flexible substrate 10 for suspension comprises a conductive layer 16 for wiring including wirings 16a to 16d for connecting the element mounting region 12 and the connecting region 14. The wirings 16a and 16b, and the wirings 16c and 16d form wiring pairs, respectively. One is for recording, and the other is for reproduction.

Figure 2:
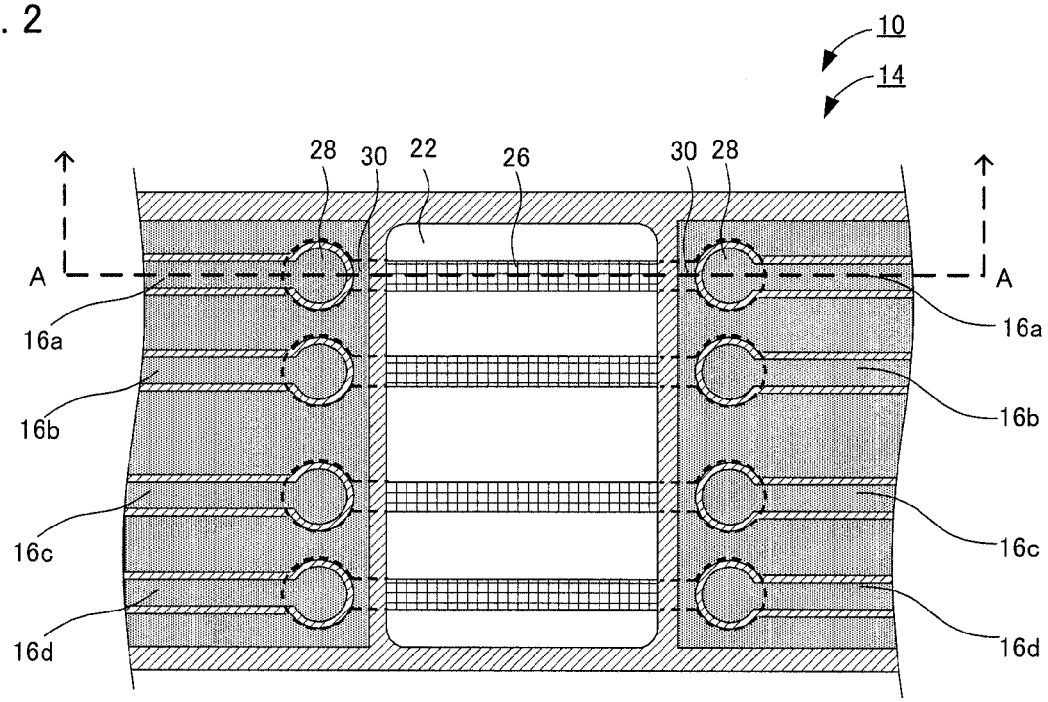
FIG. 2 is a schematic top view illustrating a first example of a connecting region illustrated in FIG. 1.
Figure 3:
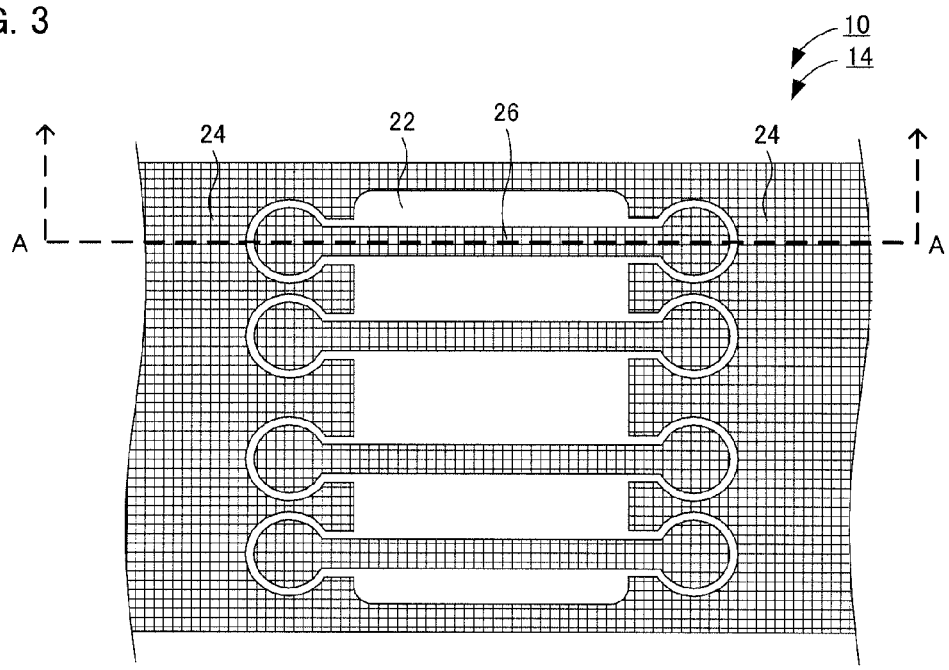
FIG. 3 is a schematic top view illustrating only a metal support layer in the first example of the connecting region illustrated in FIG. 1.
Figure 4:
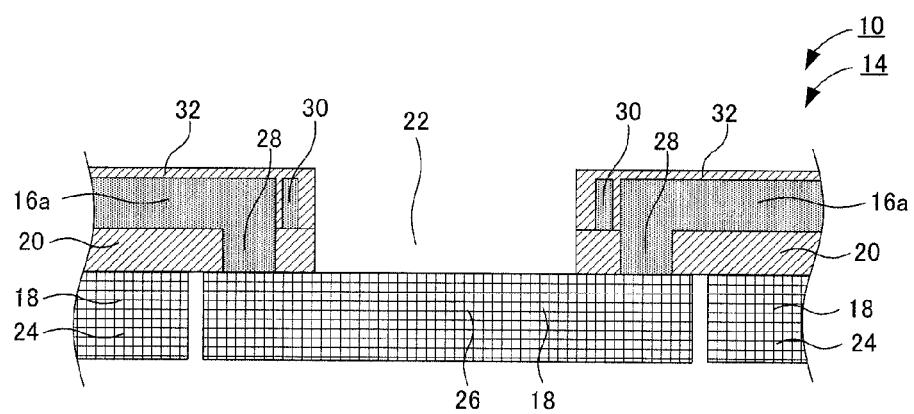
FIG. 4 is an A-A cross-sectional view of FIGS. 2 and 3.

FIG. 2 is a schematic top view illustrating a first example of the connecting region 14 illustrated in FIG. 1. FIG. 3 is a schematic top view illustrating only a metal support layer in the first example of the connecting region 14 illustrated in FIG. 1. FIG. 4 is an A-A cross-sectional view of FIGS. 2 and 3. As illustrated in FIGS. 2 to 4, the flexible substrate 10 for suspension comprises a metal support layer 18 made of stainless steel (hereinafter, abbreviated as SUS), an insulating layer 20 formed on the metal support layer 18, and the above-described conductive layer 16 for wiring formed on the insulating layer 20 and made of copper. In the flexible substrate 10 for suspension, a same location of the metal support layer 18, the insulating layer 20, and the conductive layer 16 for wiring is opened to form an opening 22.

The metal support layer 18 includes a support section 24 that supports the insulating layer 20 and the conductive layer 16 for wiring, and a terminal section 26 that extends from one edge side to the other edge side of the opening 22 and is separated from the support section 24. Also, in an inside of a via hole formed in the insulating layer 20, a conductor 28 inside the via hole is filled, and the wirings 16a to 16d are connected to the terminal section 26 through the conductor 28 inside the via hole. Furthermore, in addition to the above-described wirings 16a to 16d, the conductive layer 16 for wiring further includes a separating section 30 that is formed between the conductor 28 inside the via hole and the opening 22 and is separated from the wirings 16a to 16d. Also, the conductive layer 16 for wiring is covered by a cover layer 32.

In the wiring circuit substrate of the present invention, a method of connecting the wirings to the terminal section is not specially limited, but, as illustrated in FIGS. 2 to 4, a method of connecting the wirings to the terminal section by the conductor inside the via hole is preferable. This is because the mechanical strength of the FL can be increased in the flexible substrate for suspension having a simple structure.

In the wiring circuit substrate of the present invention, it is preferable that the conductive layer 16 for wiring further includes the separating section separated from the wirings as illustrated in FIGS. 2 to 4. This is because the mechanical strength of the wiring circuit substrate can be increased.

The separating section is not specially limited, but, as illustrated in FIGS. 2 to 4, it is preferable that the separating section is formed to surround the conductor inside the via hole and the wirings. This is because the mechanical strength of the wiring circuit substrate can be more effectively increased.

Figure 5:
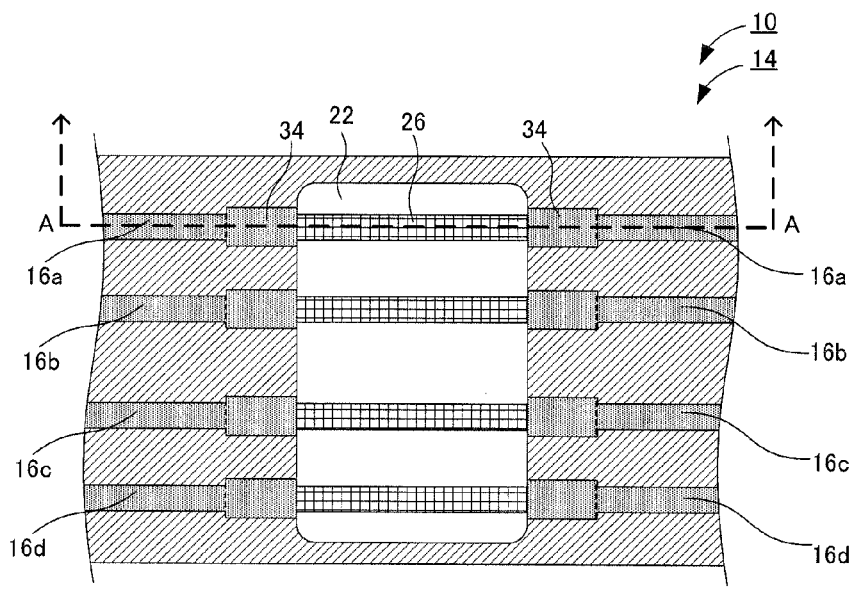
FIG. 5 is a schematic top view illustrating a second example of the connecting region illustrated in FIG. 1.
Figure 6:
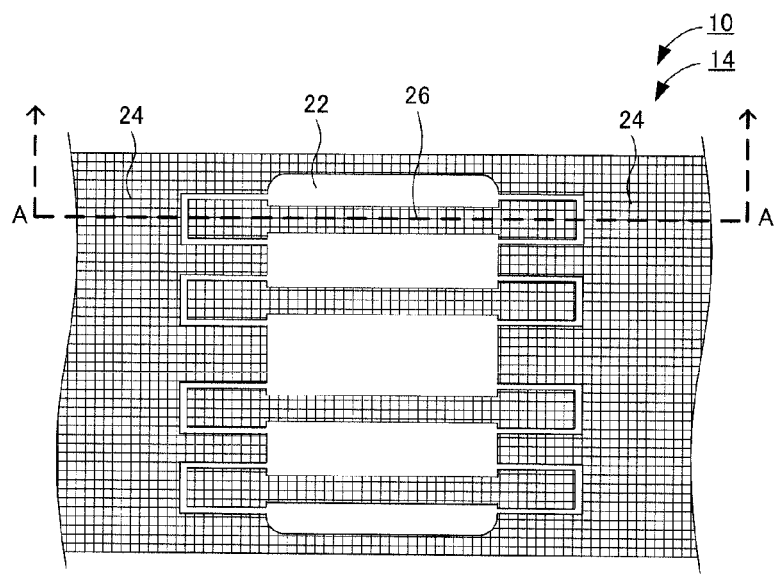
FIG. 6 is a schematic top view illustrating only a metal support layer in the second example of the connecting region illustrated in FIG. 1.
Figure 7:
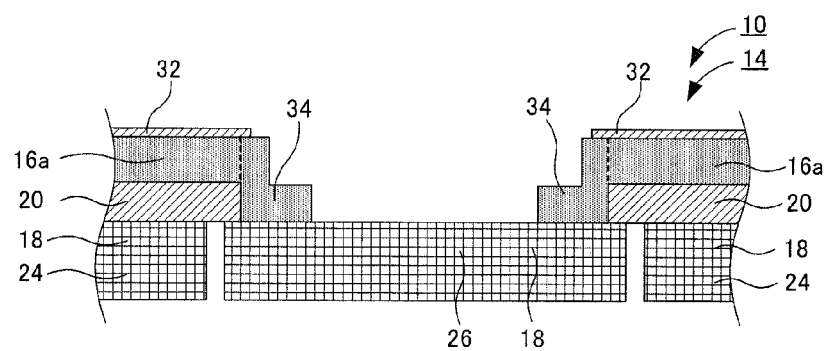
FIG. 7 is an A-A cross-sectional view of FIGS. 5 and 6.

FIG. 5 is a schematic top view illustrating a second example of the connecting region 14 illustrated in FIG. 1. FIG. 6 is a schematic top view illustrating only a metal support layer in the second example of the connecting region 14 illustrated in FIG. 1. FIG. 7 is an A-A cross-sectional view of FIGS. 5 and 6. Regarding this example, differences from the first example described above will be described. As illustrated in FIGS. 5 to 7, the flexible substrate 10 for suspension comprises a conductive layer 34 for connection formed on a terminal section 26. Wirings 16a to 16d are connected to the terminal section 26 through the conductive layer 34 for connection. As illustrated in FIGS. 2 to 4, an area where the conductive layer 34 for connection contacts the terminal section 26 can be increased more than an area where the conductor 28 inside the via hole contacts the terminal section 26.

In the wiring circuit substrate of the present invention, a method of connecting the wiring to the terminal section is not specially limited, but, as illustrated in FIGS. 5 to 7, a method of connecting the wiring to the terminal section by the conductive layer for connection is preferable. This is because the mechanical strength of the FL can be increased in the flexible substrate for suspension having a simple structure.

Also, the reason why this method is preferable is as follows: as illustrated in FIGS. 2 to 4, when the wiring is connected to the terminal section by the conductor inside the via hole, the area where the conductive layer for connection contacts the terminal section can be increased more than the area where the conductor inside the via hole contacts the terminal section. In this case, the resistance between the wiring and the terminal section can be reduced more than the case where the wiring is connected to the terminal section by the conductor inside the via hole.

Figure 8:
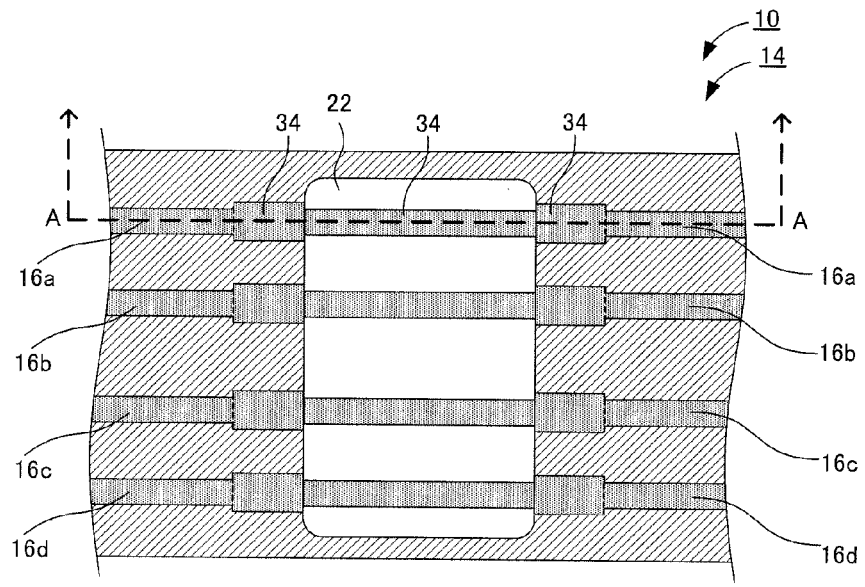
FIG. 8 is a schematic top view illustrating a third example of the connecting region illustrated in FIG. 1.
Figure 9:
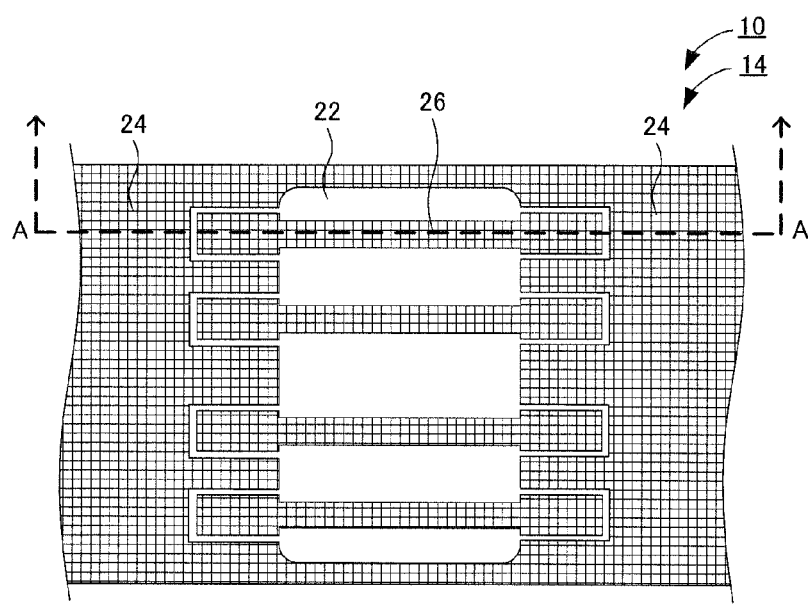
FIG. 9 is a schematic top view illustrating only a metal support layer in the third example of the connecting region illustrated in FIG. 1.
Figure 10:
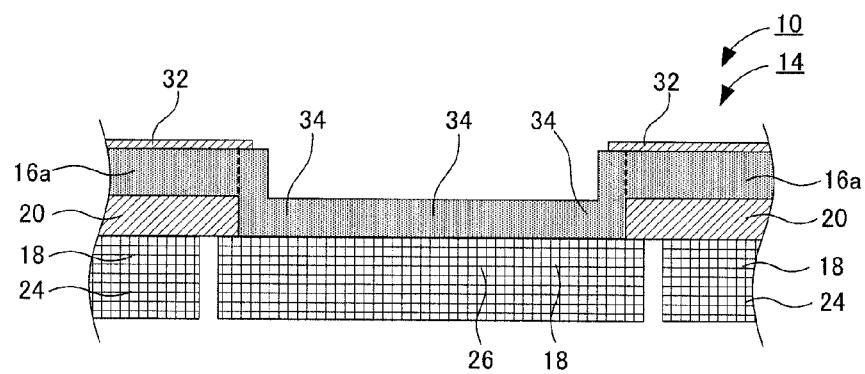
FIG. 10 is an A-A cross-sectional view of FIGS. 8 and 9.

FIG. 8 is a schematic top view illustrating a third example of the connecting region 14 illustrated in FIG. 1. FIG. 9 is a schematic top view illustrating only a metal support layer in the third example of the connecting region 14 illustrated in FIG. 8. FIG. 10 is an A-A cross-sectional view of FIGS. 8 and 9. Regarding this example, only differences from the second example described above will be described. As illustrated in FIGS. 8 to 10, the conductive layer 34 for connection is formed from one edge side to the other edge side of the opening 22 on the terminal section 26.

In the wiring circuit substrate of the present invention, the conductive layer for connection is not specially limited, but, as illustrated in FIGS. 8 to 10, it is preferable that the conductive layer for connection is formed from one edge side to the other edge side of the opening on the terminal section. This is because the FL is provided with the terminal section and the conductive layer for connection, and copper constituting the conductive layer for connection has higher conductivity than SUS constituting the terminal section, and therefore, the resistance of the FL itself can be reduced. Moreover, this is because the FL is provided with the terminal section and the conductive layer for connection, and the conductive layer for connection made of copper has lower contact resistance than the terminal section made of SUS, and therefore, the contact resistance between the FL and the external circuit is reduced. Hereinafter, the wiring circuit substrate of the present invention will be described in more detail.

1. Metal Support Layer

In the present invention, the metal support layer includes a support section that supports the insulating layer and the conductive layer for wiring, and the terminal section that extends from one edge side to the other edge side of the opening and is separated from the support section. Also, the material of the metal support layer is not specially limited as long as the mechanical strength thereof is stronger than that of the conductive layer for wiring, but SUS is preferable. This is because the mechanical strength of SUS is stronger than that of copper that is commonly used as the material of the conductive layer for wiring. Incidentally, the mechanical strength as used herein means stiffness, yield strength, or the like (the same elsewhere in this specification)

Also, it is preferable that a wiring plated layer 120 having lower contact resistance than the terminal section is formed on the exposed front surface or a rear surface of the terminal section, like a wiring circuit substrate illustrated in FIG. 17H to be described below. Examples of such a wiring plated layer 120 may include a plated layer including at least one of Ni and Au. This is because in the wiring circuit substrate of the present invention, when the FL is provided with the terminal section and the wiring plated layer, and the FL is connected to the external circuit, the contact resistance between the FL and the external circuit is reduced.

Also, it is preferable that a copper plated layer is formed by copper plating on the exposed front surface or a rear surface of the terminal section. This is because the FL is provided with the terminal section and the copper plated layer, and copper constituting the copper plated layer has higher conductivity than SUS constituting the terminal section, and therefore, the resistance of the FL itself can be reduced. Furthermore, in this case, it is preferable that the wiring plated layer 120 having lower contact resistance than the terminal section is formed on the front surface or a rear surface of the copper plated layer as explained above. This is because the contact resistance between the FL and the external circuit is reduced.

Also, it is preferable that, although different according to a kind of the material, the thickness of the support section is in a range of 10 μm to 30 μm, particularly in a range of 15 μm to 25 μm, and more particularly in a range of 18 μm to 20 μm.

Furthermore, the thickness of the terminal section is generally equal to the thickness of the support section, but may be thinner than the thickness of the support section. In this case, since the support section protrudes with respect to the terminal section, a short circuit between the terminal section and the external circuit or the like can be suppressed when the terminal section is connected to the terminal of the external circuit, or the like. Also, the weight of the terminal section can be reduced.

Also, it is preferable that the thickness of the terminal section is in a range of 3 μm to 30 μm, particularly in a range of 5 μm to 25 μm, and more particularly in a range of 5 μm to 20 μm. This is because if exceeding the above range, the short-circuit suppression effect and the weight reduction effect are reduced, and if less than the above range, the mechanical strength of the wiring circuit substrate cannot be ensured.

Figure 11:
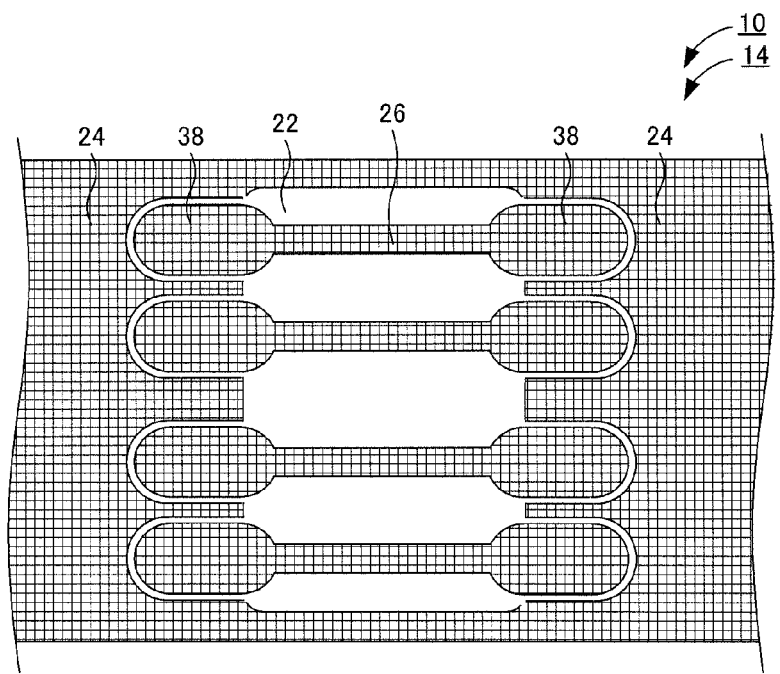
FIG. 11 is a schematic top view illustrating a modification of the metal support layer in the first example of the connecting region illustrated in FIG. 1.

Also, FIG. 11 is a schematic top view illustrating another aspect of the metal support layer in the first example of the connecting region 14 illustrated in FIG. 1. As illustrated in FIG. 11, it is preferable that the terminal section includes a wide section 38 expanding in a width direction substantially perpendicular to an extending direction of the terminal section in a portion intersecting with the edge section in the opening. This is because the mechanical strength of the FL provided with the terminal section can be further increased.

2. Conductive Layer for Wiring

The conductive layer for wiring in the present invention includes the wiring that is connected to the terminal section by the connecting section. It is preferable that the conductive layer for wiring in the present invention further includes a separating section that is formed between the conductor inside the via hole and the opening and is separated from the wiring. This is because the mechanical strength of the wiring circuit substrate can be increased. The material of the conductive layer for wiring is not specially limited as long as the mechanical strength of the metal support layer is stronger than that of the conductive layer for wiring, but copper is preferable. This is because copper has high conductivity. Hereinafter, the conductive layer for wiring in the present invention will be described in detail.

(1) Wiring

The wirings in the present invention are not specially limited as long as the wirings are connected to the terminal section by the connecting section, but it is common that the wirings are connected to both ends of the terminal section as illustrated in FIGS. 4, 7 and 10. This is because when the terminal section is plated, it becomes easier to feed power to the terminal section since the connection to both ends of the terminal section can feed power to the terminal section from both ends, and the mechanical strength of the FL provided with the terminal section can be increased since the terminal section is supported from both ends.

Also, the reason why the wirings are not specially limited as long as the wirings are connected to the terminal section by the connecting section is that the wirings can be electrically conducted with the external circuit through the FL constituting the terminal section as long as the wirings are connected to the terminal section by the connecting section.

Figure 12:
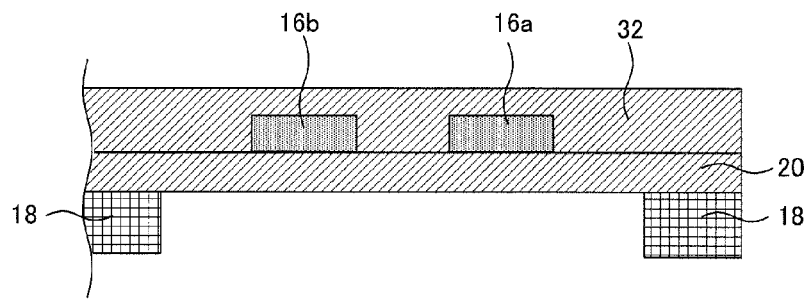
FIG. 12 is a B-B cross-sectional view of FIG. 1 and a schematic cross-sectional view illustrating an example of a wiring in the present invention.
Figure 13:
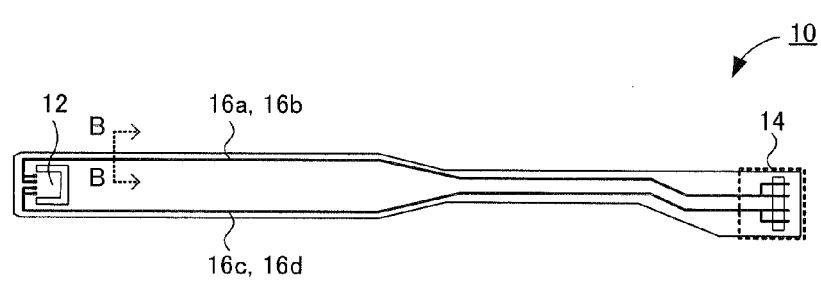
FIG. 13 is a schematic cross-sectional view illustrating another example of the wiring in the present invention.
Figure 14:
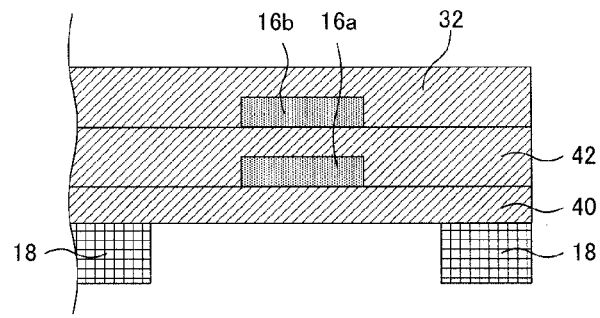
FIG. 14 is a B-B cross-sectional view of FIG. 13.

Herein, FIG. 12 is a B-B cross-sectional view of FIG. 1 and a schematic cross-sectional view illustrating an example of the wiring in the present invention. Also, FIG. 13 is a schematic cross-sectional view illustrating another example of the wiring in the present invention. Generally, as illustrated in FIG. 12, the wirings in the present invention are provided with both the wirings 16a and 16b that define wiring pair and are formed on the same plane of the insulating layer, but they are not limited thereto (the same with respect to the wirings 16c and 16d). As illustrated in FIG. 13, the wirings in the present invention may be provided by forming the wiring 16a on a first insulating layer 40 and forming the wiring 16b on a second insulating layer 42 formed to cover the wiring 16a (the same with respect to the wirings 16c and 16d). Even in this case, the wirings are connected to the terminal section through the conductor inside the via hole, which passes through the first insulating layer 40 and the second insulating layer 42, or the conductive layer for connection.

(2) Separating Section

The separating section in the present invention is not specially limited as long as the separating section is formed between the conductor inside the via hole and the opening and is separated from the wirings, but it is preferable that the separating section is formed to surround the conductor inside the via hole and it is more preferable that the separating section is formed to surround the wirings. This is because the mechanical strength of the wiring circuit substrate can be more effectively increased.

3. Connecting Section

The connecting section in the present invention is not specially limited as long as the connecting section connects the wirings to the terminal section, but it is common that the connecting section connects the wirings to both ends of the terminal section as illustrated in FIGS. 4, 7 and 10. This is because when the wirings are connected to both ends of the terminal section, the terminal section is supported from both ends and thus the mechanical strength of the FL constituting the terminal section can be increased. Also, the reason why the connecting section in the present invention is not specially limited as long as the connecting section connects the wirings to the terminal section is that the wirings have only to be electrically conducted with the external circuit through the terminal section. Hereinafter, the connecting section will be described in detail.

(1) Conductor Inside Via Hole

Examples of the connecting section in the present invention may include the conductor inside the via hole as described above.

The via hole inside the present invention is formed on the insulating layer at a location overlapped with the terminal section in a planar view, so as to connect the conductor inside the via hole to the terminal section.

The conductor inside the via hole in the present invention is a conductor filled in the inside of the via hole. A material of the conductor inside the via hole is not specially limited as long as the wirings can be electrically conducted with the terminal section through the conductor inside the via hole, but examples of the material of the conductor inside the via hole may include nickel (Ni), copper (Cu), silver (Ag), gold (Au), and solder.

Also, it is preferable that a metal thin-film layer is formed between the conductor inside the via hole and the metal support layer. This is because adhesion between the conductor inside the via hole and the metal support layer can be improved. A material of the metal thin-film layer is not specially limited as long as the adhesion between the conductor inside the via hole and the metal support layer can be improved, but examples of the material of the metal thin-film layer may include nickel (Ni), copper (Cu), chrome (Cr), and an alloy thereof. Also, it is preferable that the metal thin-film layer is a layer that is formed by a sputtering method. A film thickness of the metal thin-film layer is not specially limited as long as desired adhesion can be obtained, but the film thickness of the metal thin-film layer is generally in a range from 10 nm to 300 nm.

(2) Conductive Layer for Connection

Another example of the connecting section in the present invention may include the conductive layer for connection as described above. The conductive layer for connection in the present invention is not specially limited as long as the conductive layer for connection is formed on the terminal section and connects the wirings to the terminal section, but it is preferable that the conductive layer for connection is formed from one edge side to the other edge side of the opening on the terminal section. This is because the FL is provided with the terminal section and the conductive layer for connection, and copper constituting the conductive layer for connection has higher conductivity than SUS constituting the terminal section, and therefore, the resistance of the FL itself can be reduced.

A material of the conductive layer for connection is not specially limited as long as the wirings can be electrically conducted with the terminal section through the conductive layer for connection, but examples of the material of the conductive layer for connection may include copper (Cu) and nickel (Ni).

Also, it is preferable that a metal thin-film layer is formed between the conductive layer for connection and the metal support layer. This is because adhesion between the conductive layer for connection and the metal support layer can be improved. A material of the conductive layer for connection is not specially limited as long as the adhesion between the conductive layer for connection and the metal support layer can be improved, but examples of the material of the conductive layer for connection may include nickel (Ni), copper (Cu), chrome (Cr), and an alloy thereof. Also, it is preferable that the metal thin-film layer is a layer that is formed by a sputtering method. A film thickness of the metal thin-film layer is not specially limited as long as desired adhesion can be obtained, but the film thickness of the metal thin-film layer is generally in a range from 10 nm to 300 nm.

Also, it is preferable that a wiring plated layer 120 having lower contact resistance than the conductive layer for connection is formed on the exposed front surface of the conductive layer for connection, like a wiring circuit substrate illustrated in FIG. 21H to be described below. Examples of such a wiring plated layer 120 may include a plated layer including at least one of Ni and Au. This is because in the wiring circuit substrate of the present invention, when the FL is provided with the terminal section, the conductive layer for connection, and the wiring plated layer, and the FL is connected to the external circuit, the contact resistance between the FL and the external circuit is reduced.

4. Insulating Layer

The insulating layer in the present invention is a layer that is formed on the metal support layer. A material constituting the insulating layer is not specially limited as long as the material has desired insulating properties, but examples of the material may include a polyimide resin (hereinafter, abbreviated as PI). Also, the insulating layer may be a photosensitive material or a non-photosensitive material. Also, it is preferable that the thickness of the insulating layer, for example, is in a range of 5 μm to 30 μm, and particularly, in a range of 5 μm to 15 μm. This is because if the insulating layer is too thin, a hole defect such as a pit easily occurs, and on the contrary, if the insulating layer is too thick, the flexible substrate cannot have stiffness as a whole and thus warpage occurs.

Figure 15:
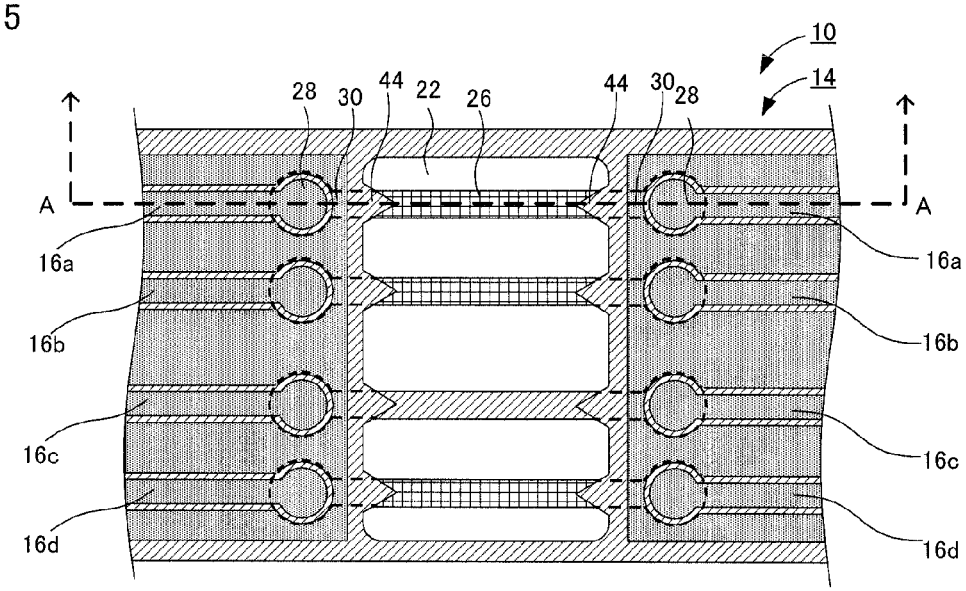
FIG. 15 is a schematic top view illustrating a modification of an insulating layer in the first example of the connecting region illustrated in FIG. 1.
Figure 16:
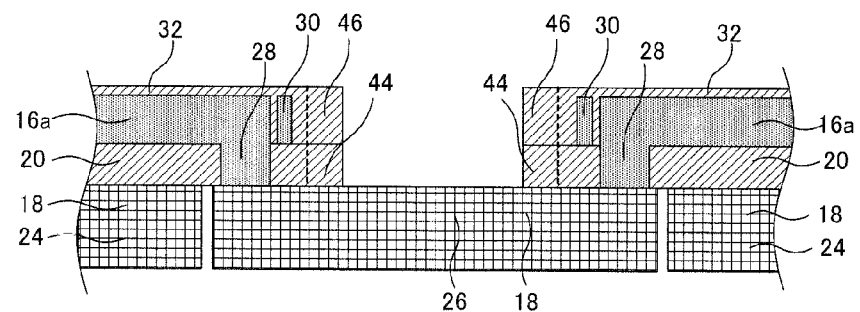
FIG. 16 is an A-A cross-sectional view of FIG. 15.

Also, FIG. 15 is a schematic top view illustrating a modification of the first example of the connection region illustrated in FIG. 1. FIG. 16 is an A-A cross-sectional view of FIG. 15. Like the insulating layer 20 illustrated in FIGS. 15 and 16, it is preferable that the insulating layer protrudes from the edge section side to the center side of the opening 22 and includes a protrusion 44 formed to support the terminal section 26. This is because the mechanical strength of the FL provided with the terminal section can be reinforced by the protrusion.

5. Configurations other than Wiring Circuit Substrate

The wiring circuit substrate of the present invention may further include a cover layer that is formed on the conductive layer for wiring and covers the conductive layer for wiring. Examples of a material of the cover layer may include polyimide (PI). Also, the material of the cover layer may be a photosensitive material or a non-photosensitive material. Furthermore, the photosensitive material may be a positive type or may be a negative type. Also, a thickness of the cover layer is not specially limited as long as the cover layer is thick enough to protect the conductive layer for wiring.

Like the cover layer 32 illustrated in FIGS. 15 and 16, it is preferable that the cover layer protrudes from the edge side to the center side of the opening 22 and further includes a protrusion 46 formed to support the terminal section 26 through the protrusion 44 included in the above-described insulating layer 20. This is because the mechanical strength of the FL provided with the terminal section can be reinforced by the protrusion.

6. Method of Producing Wiring Circuit Substrate

Next, a method of producing a wiring circuit substrate of the present invention will be described. FIGS. 17 and 18 are schematic process cross-sectional views each illustrating an example of a method of producing a substrate for wiring circuit of the present invention. The method of producing the substrate for wiring circuit illustrated in FIGS. 17 and 18 is a method by which the flexible substrate for suspension including the conductor inside the via hole illustrated in FIGS. 1 to 4 is produced with a two-layer material. FIGS. 17A to 17H each illustrates a cross-section corresponding to the A-A cross-section of FIG. 2 and is a schematic process cross-sectional view illustrating the first example of the connecting region. FIGS. 18A to 18I each illustrates a cross-section corresponding to the B-B cross-section of FIG. 1 and is a schematic process cross-sectional view illustrating the wirings.

Hereinafter, an example of the method of producing the wiring circuit substrate of the present invention will be described with reference to FIGS. 17 and 18.

Figure 17A:
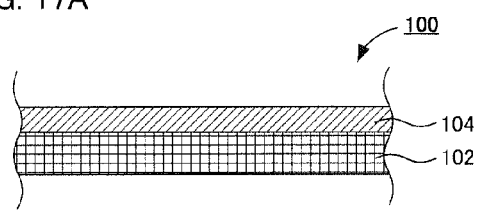
FIGS. 17A to 17H are schematic process cross-sectional views illustrating an example of a method of producing a substrate for wiring circuit of the present invention.
Figure 18A:
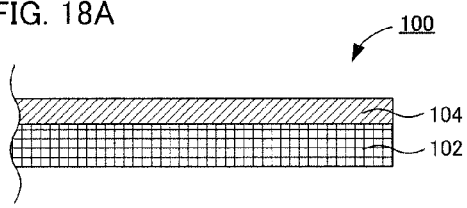
FIGS. 18A to 18I are schematic process cross-sectional views illustrating an example of the method of producing the substrate for wiring circuit of the present invention.

First, a two-layer material 100 is prepared (FIGS. 17A and 18A). The prepared two-layer material 100 includes a metal support layer 102 made of SUS, and an insulating layer 104 formed on the metal support layer 102 and made of PI.

Figure 17B:
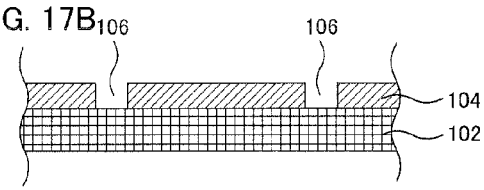
Figure 18F:
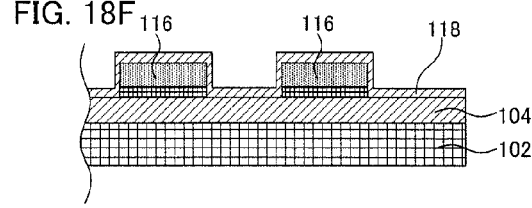
Figure 18B:
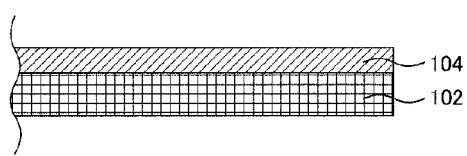

Subsequently, a resist pattern is formed in the metal support layer 102 and the insulating layer 104 by, for example, a dry film resist (hereinafter, abbreviated as DFR), and the resist pattern is removed by etching the metal support layer 102 and the insulating layer 104 exposed from the resist pattern (FIGS. 17B and 18B). In this manner, a mark to be used for alignment is formed in the metal support layer 102, and a via hole 106 is formed in the insulating layer 104.

Figure 17C:
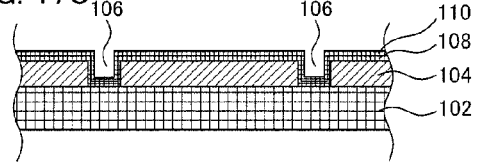
Figure 18G:
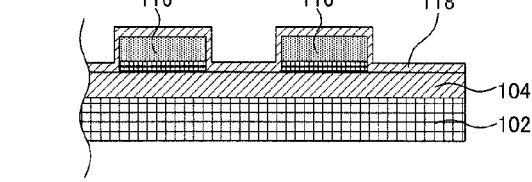
Figure 18C:
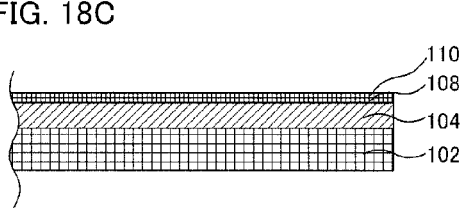

Subsequently, a metal thin-film layer (for example, Cr thin-film layer or Ni thin-film layer) 108 is formed on the metal support layer 102 exposed from the insulating layer 104 by a sputtering method, and then, a Cu sputtering layer 110 is formed on the metal thin-film layer 108 by a sputtering method (FIGS. 17C and 18C).

Figure 17D:
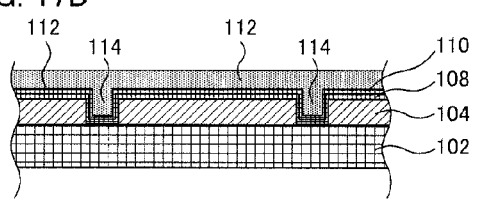
Figure 18H:
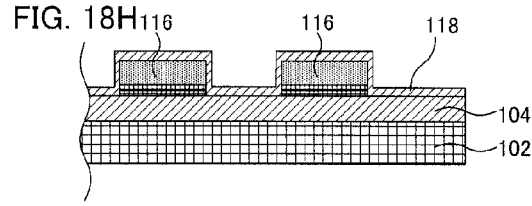
Figure 18D:
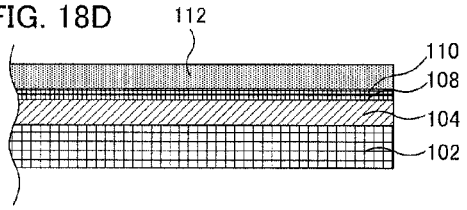

Subsequently, a conductive layer 112 made of copper is formed on the Cu sputtering layer 110 by electrolytic plating (FIGS. 17D and 18D). At this time, the conductive layer 112 is also formed inside the via hole 106, and thus, a conductor 114 is formed inside the via hole.

Figure 17E:
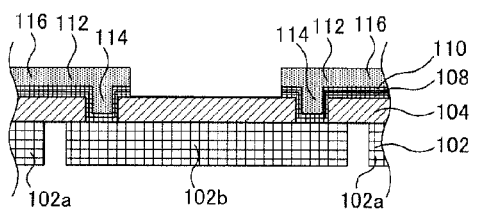
Figure 18I:
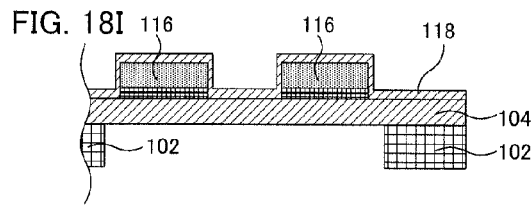
Figure 18E:
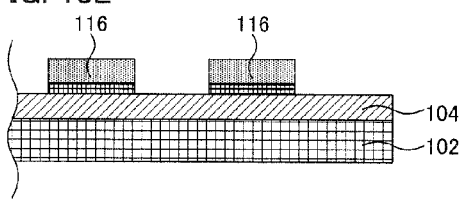

Subsequently, a resist pattern is formed on the metal support layer 102 and the conductive layer 112 by, for example, a DFR, and the resist pattern is removed by etching the metal support layer 102, the conductive layer 112, and the Cu sputtering layer 110 exposed from the resist pattern. (FIGS. 17E and 18E). In this manner, the metal support layer 102 is separated, and a support section 102*a* and a terminal section 102*b* are formed. The conductive layer 112 on the terminal section 102*b* is opened, and a wiring 116 is formed from the conductive layer 112.

Also, in order to prevent short-circuit of the wiring 116, the metal thin-film layer 108 is removed, except for a region directly below the wiring 116.

Figure 17F:
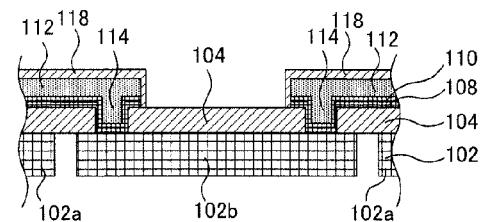

Subsequently, a cover layer 118 made of PI is formed on the conductive layer 112, a resist pattern is formed on the cover layer 118 by a DFR, and the resist pattern is removed by etching the cover layer 118 exposed from the resist pattern (FIGS. 17F and 18F). In this manner, the cover layer 118 is formed to cover the wiring 116.

Figure 17G:
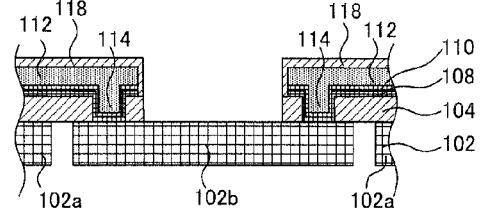

Subsequently, a resist pattern is formed on the insulating layer 104 by, for example, a DFR, and the resist pattern is removed by etching the insulating layer 104 exposed from the resist pattern (FIGS. 17G and 18G). In this manner, the insulating layer 104 on the terminal section 102*b* is opened.

Figure 17H:
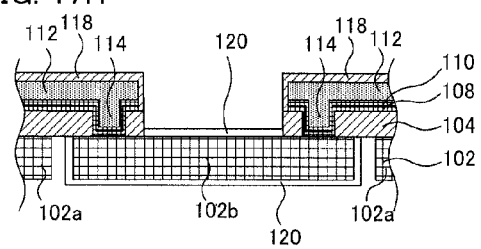

Subsequently, a resist pattern is formed on the metal support layer 102 by, for example, a DFR, and a wiring plated layer 120 including at least one of Ni and Au is formed on a front surface or a rear surface of the terminal section 102*b* exposed from the resist pattern (FIGS. 17H and 18H).

Subsequently, a resist pattern is formed on the metal support layer 102 by, for example, a DFR, and the metal support layer 102 exposed from the resist pattern is etched. In this manner, the metal support layer 102 is removed at the support section 102a, the terminal section 102b, and locations other than an outer frame that supports the flexible substrate for suspension (FIG. 18I). By the above manner, the flexible substrate for suspension is formed.

FIGS. 19 and 20 are schematic process cross-sectional views each illustrating another example of the method of producing the substrate for wiring circuit of the present invention. The method of producing the substrate for wiring circuit illustrated in FIGS. 19 and 20 is a method by which the flexible substrate for suspension including the conductive layer for connection illustrated in FIGS. 5 to 7 is produced with a two-layer material. FIGS. 19A to 19H each illustrates a cross-section corresponding to the A-A cross-section of FIG. 5 and is a schematic process cross-sectional view illustrating the second example of the connecting region. FIGS. 20A to 20I are each a schematic process cross-sectional view illustrating a cross-section corresponding to the B-B cross-section of FIG. 1.

Hereinafter, another example of the method of producing the wiring circuit substrate of the present invention will be described with reference to FIGS. 19 and 20.

Figure 19A:
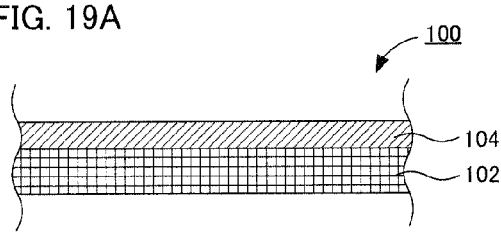
FIGS. 19A to 19H are schematic process cross-sectional views illustrating another example of the method of producing the substrate for wiring circuit of the present invention.
Figure 20A:
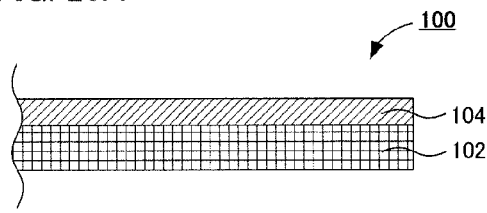
FIGS. 20A to 20I are schematic process cross-sectional views illustrating another example of the method of producing the substrate for wiring circuit of the present invention.

First, a two-layer material 100 is prepared (FIGS. 19A and 20A). The prepared two-layer material 100 is the same as the two-layer material illustrated in FIGS. 17A and 18A.

Figure 19B:
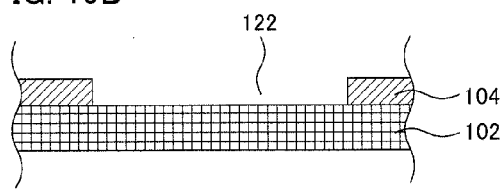
Figure 20F:
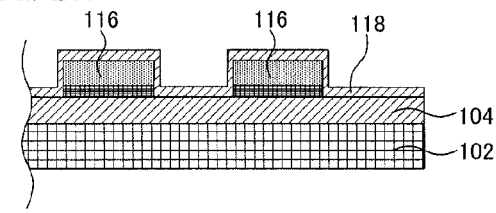
Figure 20B:
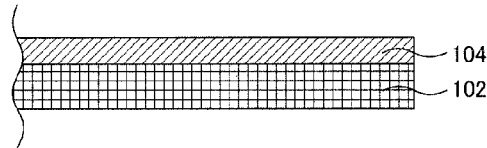

Subsequently, a resist pattern is formed in the metal support layer 102 and the insulating layer 104 by, for example, a DFR, and the resist pattern is removed by etching the metal support layer 102 and the insulating layer 104 exposed from the resist pattern (FIGS. 19B and 20B). In this manner, a mark to be used for alignment is formed in the metal support layer 102, and an insulating layer removal section 122, in which the insulating layer is moved, is formed in the insulating layer 104.

Figure 19C:
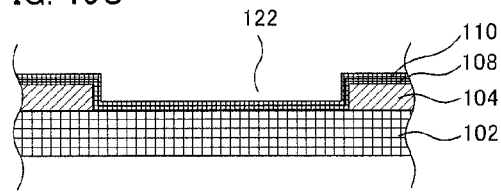
Figure 20G:
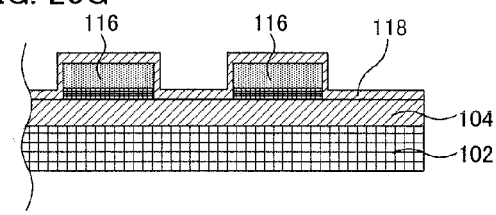
Figure 20C:
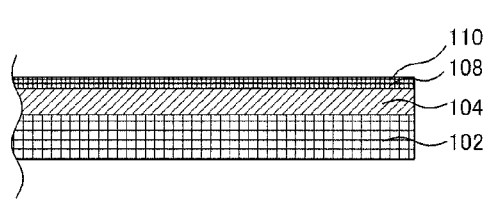

Subsequently, a metal thin-film layer (for example, Cr thin-film layer or Ni thin-film layer) 108 is formed on the metal support layer 102 exposed from the insulating layer 104 by a sputtering method, and then, a Cu sputtering layer 110 is formed on the metal thin-film layer 108 by a sputtering method (FIGS. 19C and 20C).

Figure 19D:
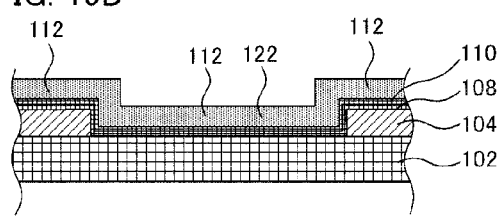
Figure 20H:
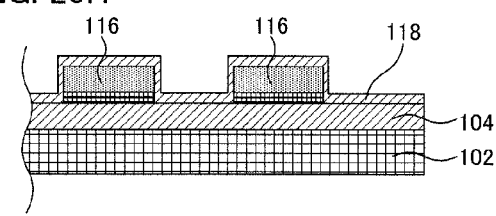
Figure 20D:
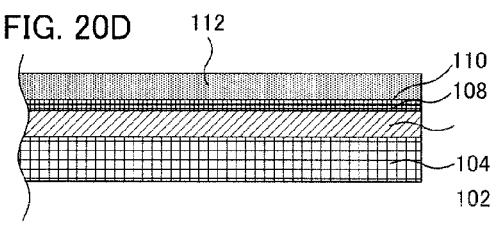

Subsequently, a conductive layer 112 made of copper is formed on the Cu sputtering layer 110 by electrolytic plating (FIGS. 19D and 20D). At this time, the conductive layer 112 is also formed in the insulating layer removal section 122.

Figure 20I:
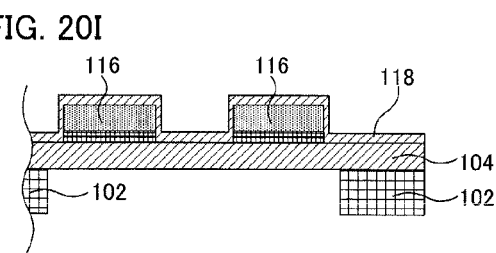
Figure 20E:
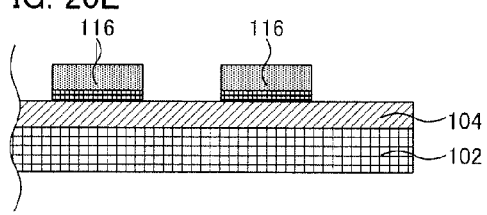

Subsequently, a resist pattern is formed on the metal support layer 102 and the conductive layer 112 by, for example, a DFR, and the resist pattern is removed by etching the metal support layer 102, the conductive layer 112, and the Cu sputtering layer 110 exposed from the resist pattern (FIGS. 20E and 20E). In this manner, the metal support layer 102 is separated, and a support section 102a and a terminal section 102b are formed. The conductive layer 112 on the terminal section 102b is opened, and a wiring 116 and a conductive layer 124 for connection are formed from the conductive layer 112. The wiring 116 is connected to the terminal section 102b through the conductive layer 124 for connection.

Also, in this manner, the metal thin-film layer 108 is removed, except for a region directly below the wiring 116 and the conductive layer 124 for connection.

Figure 19E:
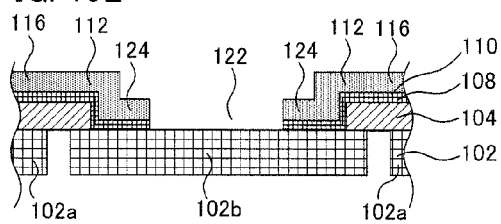
Figure 19F:
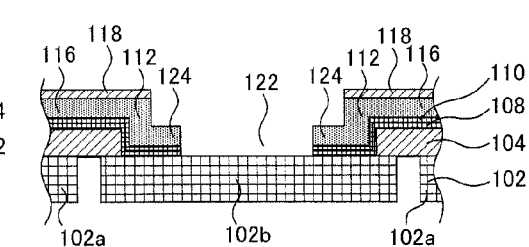

Subsequently, a cover layer 118 made of PI is formed on the conductive layer 112, a resist pattern is formed on the cover layer 118 by a DFR, and the resist pattern is removed by etching the cover layer 118 exposed from the resist pattern (FIGS. 19F and 20F). In this manner, the cover layer 118 is formed to cover the wiring 116.

Figure 19G:
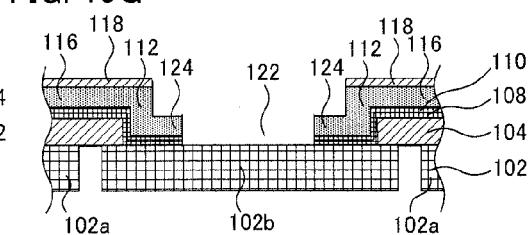

Subsequently, a resist pattern is formed on the insulating layer 104 by, for example, a DFR, and the resist pattern is removed by etching the insulating layer 104 exposed from the resist pattern (FIGS. 19G and 20G). In this manner, unnecessary portions of the insulating layer 104 are eliminated.

Figure 19H:
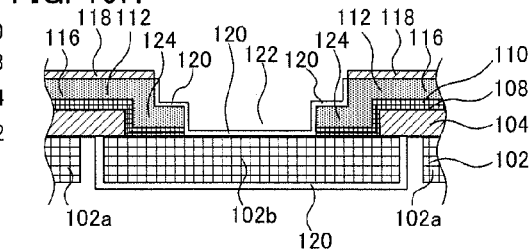

Subsequently, a resist pattern is formed on the metal support layer 102 by, for example, a DFR, and a wiring plated layer 120 including at least one of Ni and Au is formed on a front surface or a rear surface of the terminal section 102b exposed from the resist pattern (FIGS. 19H and 20H). At this time, the wiring plated layer 120 is also formed in a portion exposed from the cover layer 118 in the conductive layer 112 and the conductive layer 124 for connection (FIGS. 19H and 20H).

Subsequently, a resist pattern is formed on the metal support layer 102 by, for example, a DFR, and the metal support layer 102 exposed from the resist pattern is etched. In this manner, the metal support layer 102 is removed at the support section 102a, the terminal section 102b, and locations other than an outer frame that supports the flexible substrate for suspension (FIG. 20I). By the above manner, the flexible substrate for suspension is formed.

FIGS. 21 and 22 are each schematic process cross-sectional views illustrating another example of the method of producing the substrate for wiring circuit of the present invention. The method of producing the substrate for wiring circuit illustrated in FIGS. 21 and 22 is a method by which the flexible substrate for suspension including the conductive layer for connection illustrated in FIGS. 8 to 10 is produced with a two-layer material. FIGS. 21A to 21H each illustrates a cross-section corresponding to the A-A cross-section of FIG. 8 and is a schematic process cross-sectional view illustrating the third example of the connecting region. FIGS. 22A to 22I are each a schematic process cross-sectional view illustrating a cross-section corresponding to the B-B cross-section of FIG. 1.

Hereinafter, another example of the method of producing the wiring circuit substrate of the present invention will be described with reference to FIGS. 21 and 22.

Figure 21A:
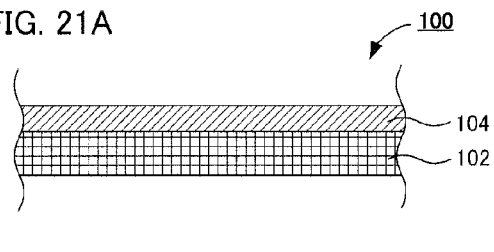
FIGS. 21A to 21H are schematic process cross-sectional views illustrating another example of the method of producing the substrate for wiring circuit of the present invention.
Figure 22A:
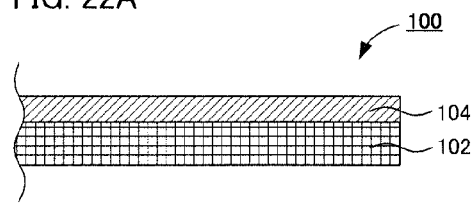
FIGS. 22A to 22I are schematic process cross-sectional views illustrating another example of the method of producing the substrate for wiring circuit of the present invention.

First, a two-layer material 100 is prepared (FIGS. 21A and 22A). The prepared two-layer material 100 is the same as the two-layer material illustrated in FIGS. 17A and 18A.

Figure 21F:
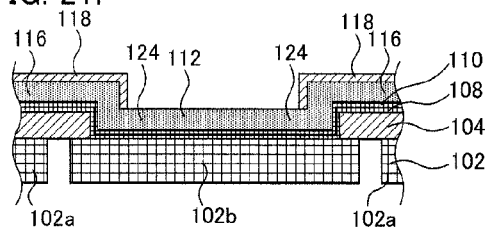
Figure 21B:
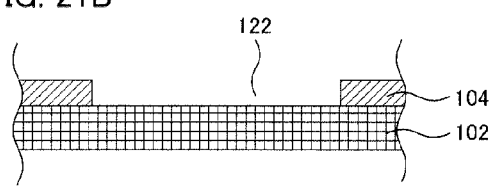
Figure 22B:
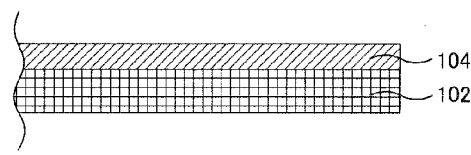

Subsequently, a resist pattern is formed in the metal support layer 102 and the insulating layer 104 by, for example, a DFR, and the resist pattern is removed by etching the metal support layer 102 and the insulating layer 104 exposed from the resist pattern (FIGS. 21B and 22B). In this manner, a mark to be used for alignment is formed in the metal support layer 102, and an insulating layer removal section 122, in which the insulating layer is moved, is formed in the insulating layer 104.

Figure 21G:
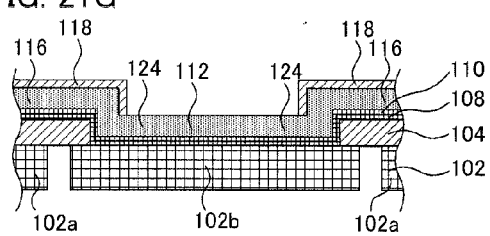
Figure 21C:
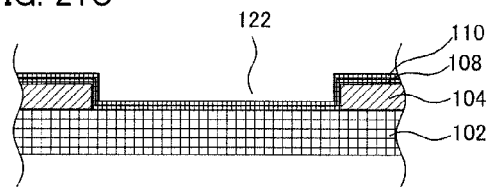
Figure 22C:
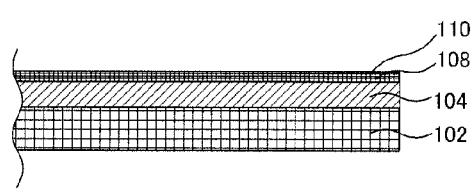

Subsequently, a metal thin-film layer (for example, Cr thin-film layer or Ni thin-film layer) 108 is formed on the metal support layer 102 exposed from the insulating layer 104 by a sputtering method, and then, a Cu sputtering layer 110 is formed on the metal thin-film layer 108 by a sputtering method (FIGS. 21C and 22C).

Figure 21H:
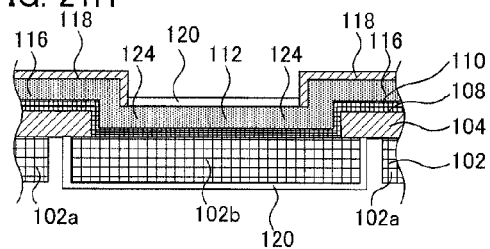
Figure 21D:
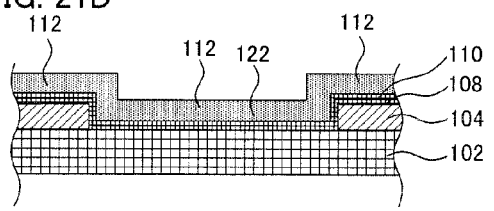
Figure 22D:
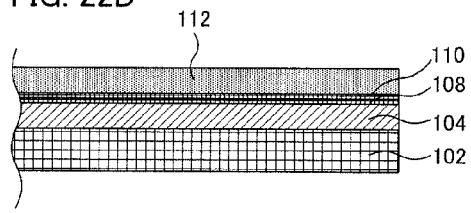

Subsequently, a conductive layer 112 made of copper is formed on the Cu sputtering layer 110 by electrolytic plating (FIGS. 21D and 22D). At this time, the conductive layer 112 is also formed in the insulating layer removal section 122.

Figure 21E:
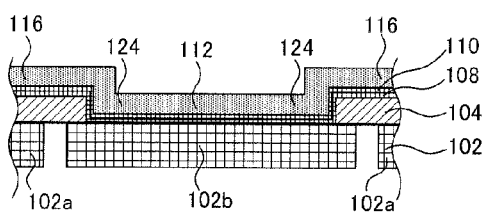
Figure 22E:
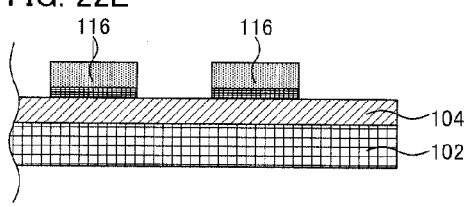

Subsequently, a resist pattern is formed on the metal support layer 102 and the conductive layer 112 by, for example, a DFR, and the resist pattern is removed by etching the metal support layer 102, the conductive layer 112, and the Cu sputtering layer 110 exposed from the resist pattern (FIGS. 21E and 22E). In this manner, the metal support layer 102 is separated, and a support section 102a and a terminal section 102b are formed. The wiring 116 is connected to the terminal section 102b through the conductive layer 112 (conductive layer 124 for connection).

Also, in this manner, the metal thin-film layer 108 is removed, except for a region directly below the wiring 116 and the conductive layer 124 for connection.

Figure 22F:
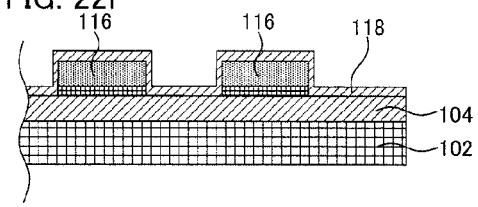

Subsequently, a cover layer 118 made of PI is formed on the conductive layer 112, a resist pattern is formed on the cover layer 118 by a DFR, and the resist pattern is removed by etching the cover layer 118 exposed from the resist pattern (FIGS. 21F and 22F). In this manner, the cover layer 118 is formed to cover the wiring 116.

Figure 22G:
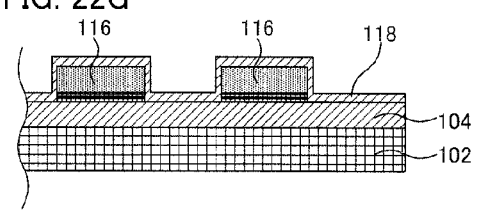

Subsequently, a resist pattern is formed on the insulating layer 104 by, for example, a DFR, and the resist pattern is removed by etching the insulating layer 104 exposed from the resist pattern (FIGS. 21G and 22G). In this manner, unnecessary portions of the insulating layer 104 are eliminated.

Figure 22H:
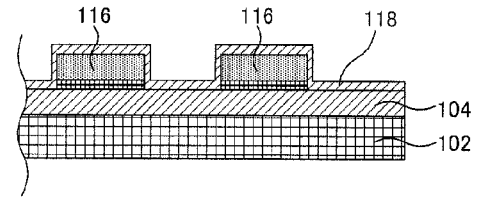

Subsequently, a resist pattern is formed on the metal support layer 102 by, for example, a DFR, and a wiring plated layer 120 including at least one of Ni and Au is formed on a front surface of the conductive layer 112 (conductive layer 124 for connection) exposed from the resist pattern and a rear surface of the terminal section 102b (FIGS. 21H and 22H).

Figure 22I:
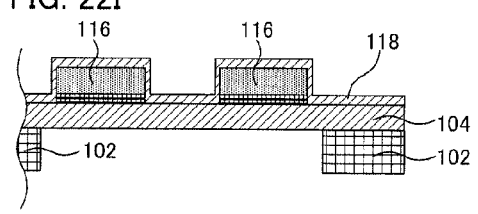

Subsequently, a resist pattern is formed on the metal support layer 102 by, for example, a DFR, and the metal support layer 102 exposed from the resist pattern is etched. In this manner, the metal support layer 102 is removed at the support section 102a, the terminal section 102b, and locations other than an outer frame that supports the flexible substrate for suspension (FIG. 22I). By the above manner, the flexible substrate for suspension is formed.

Furthermore, the flexible substrate for suspension including the conductor inside the via hole illustrated in FIGS. 1 to 4, the flexible substrate for suspension including the conductive layer for connection illustrated in FIGS. 5 to 7, and the flexible substrate for suspension including the conductive layer for connection illustrated in FIGS. 8 to 10 may be produced with a three-layer material, instead of the two-layer material as described above.

B. Flexible Substrate for Suspension

Next, a suspension of the present invention will be described. The flexible substrate for suspension of the present invention is characterized in that the flexible substrate for suspension comprises the above-described wiring circuit substrate.

According to the present invention, since the wiring circuit substrate is used in the flexible substrate for suspension, the wiring disconnection of the FL can be prevented and thus the connection reliability between the FL and the external circuit can be improved.

FIG. 1 is a schematic plan view illustrating an example of the flexible substrate for suspension of the present invention. The flexible substrate 10 for suspension illustrated in FIG. 1 comprises an element mounting region 12 for mounting an element at a leading end of one side, and a connecting region 14 for performing connection to the external circuit at a leading end of the other side. Furthermore, the flexible substrate 10 for suspension comprises a conductive layer 16 for wiring including wirings 16a to 16d for connecting the element mounting region 12 and the connecting region 14. The wirings 16a and 16b, and the wirings 16c and 16d form wiring pairs, respectively. One is for recording, and the other is for reproduction.

The flexible substrate for suspension of the present invention comprises at least the wiring circuit substrate. Since the contents of the wiring circuit substrate are identical to the contents described in "A. Wiring Circuit Substrate", a description thereof will be omitted herein.

C. Suspension

Next, a suspension of the present invention will be described. The suspension of the present invention is characterized in that the suspension comprises the above-described wiring circuit substrate.

According to the present invention, since the wiring circuit substrate is used in the suspension, the wiring disconnection of the FL can be prevented and thus the connection reliability between the FL and the external circuit can be improved.

Figure 23:
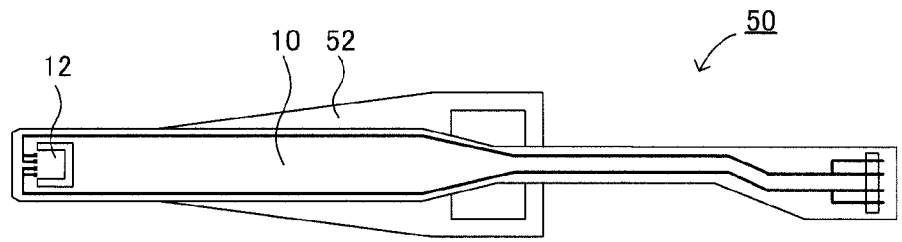
FIG. 23 is a schematic plan view illustrating an example of a suspension of the present invention.

FIG. 23 is a schematic plan view illustrating an example of the suspension of the present invention. The suspension 50 illustrated in FIG. 23 comprises the above-described flexible substrate 10 for suspension, and a load beam 52 provided on the surface of the flexible substrate 10 for suspension, which is opposite to the surface where the element mounting region 12 is formed.

The suspension of the present invention comprises at least the wiring circuit substrate and generally further comprises the load beam. Since the contents of the wiring circuit substrate are identical to the contents described in "A. Wiring Circuit Substrate", a description thereof will be omitted herein. Also, the load beam may use the same as a load beam used in a general suspension.

D. Suspension with Element

Next, the suspension with element of the present invention will be described. The suspension with element of the present invention comprises the above-described suspension, and the element mounted in the element mounting region of the suspension.

According to the present invention, since the suspension is used in the suspension with element, the wiring disconnection of the FL can be prevented and thus the connection reliability between the FL and the external circuit can be improved.

Figure 24:
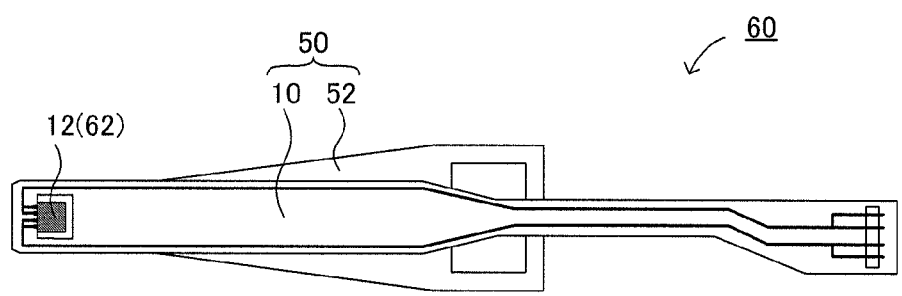
FIG. 24 is a schematic plan view illustrating an example of the suspension with element of the present invention.

FIG. 24 is a schematic plan view illustrating an example of the suspension with element of the present invention. The suspension 60 with element illustrated in FIG. 24 comprises the above-described suspension 50, and the element 62 mounted in the element mounting region 12 of the suspension 50.

The suspension with element of the present invention comprises at least the suspension and the element. Since the contents of the suspension are identical to the contents described in "C. Suspension", a description thereof will be omitted herein. Also, the element may use a magnetic head slider used in a general suspension with head.

E. Hard Disk Drive

Next, a hard disk drive of the present invention will be described. The hard disk drive of the present invention is characterized in that the hard disk drive comprises the above-described suspension with element.

According to the present invention, since the above-described suspension with element is used, the wiring disconnection of the FL can be prevented and thus the connection reliability between the FL and the external circuit can be improved.

Figure 25:
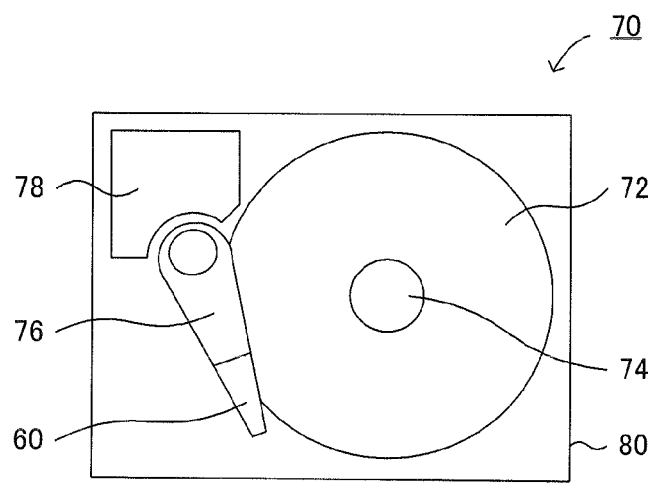
FIG. 25 is a schematic plan view illustrating an example of a hard disk drive of the present invention.

FIG. 25 is a schematic plan view illustrating an example of the hard disk drive of the present invention. The hard disk drive 70 illustrated in FIG. 25 comprises the above-described suspension 60 with element, a disk 72 on which the suspension 60 with element performs data read and write, a spindle motor 74 that rotates the disk 72, an arm 76 and a voice coil motor 78 that move the element of the suspension 60 with element, and a case 80 that seals the above members.

The hard disk drive of the present invention comprises at least the suspension with element and generally further comprises the disk, the spindle motor, the arm, and the voice coil motor. Since the contents of the suspension with element are identical to the contents described in "D. Suspension with Element", a description thereof will be omitted herein. Also, the other members may use the same members as those used in the general hard disk drive.

Hereinafter, the flexible substrate for suspension, the suspension, the suspension with element, the hard disk drive, and the method of producing the flexible substrate for suspension of the present invention will be described in detail.

F. Flexible Substrate for Suspension

The flexible substrate for suspension of the present invention will be described. The flexible substrate for suspension of the present invention comprises: a metal support layer; an insulating layer formed on the metal support layer; a conductive layer for wiring formed on the insulating layer; and an element mounting region, characterized in that the metal support layer includes: a support section that supports the insulating layer and the conductive layer for wiring; and a terminal section that is separated from the support section, the terminal section is connected to an element-side terminal included in an element to be mounted in the element mounting region, and the conductive layer for wiring includes an inter-terminal wiring that is connected to the terminal section by a connecting section.

According to the present invention, in the flexible substrate for suspension, the terminal section included in the metal support layer is used as the terminal section to be connected to the element-side terminal included in the element to be mounted in the element mounting region. Therefore, the mechanical strength of the terminal section to be connected to the element-side terminal can be increased more than the case of using the terminal section included in the conductive layer for wiring. This can prevent the deformation and/or wiring disconnection of the terminal section to be connected to the element-side terminal.

Also, since the mechanical strength of the terminal section is large due to the constituent material, the terminal section can be finely processed and the number of terminals included in the terminal section can be increased, as compared with the case of using the terminal section included in the conductive layer for wiring. Furthermore, since the metal support layer included in the terminal section can be formed thinly, the weight of the flexible substrate for suspension of the present invention can be reduced.

Moreover, due to the large mechanical strength of the terminal section, even when a defective element is mounted in the element mounting region and the terminal section is connected to the element-side terminal included in the defective element, the corresponding defective element is easily removed by detaching the terminal section from the element-side terminal included in the defective element. In this manner, the defective element can be replaced with a non-defective element.

Hereinafter, the flexible substrate for suspension of the present invention will be described in detail.

Figure 28:
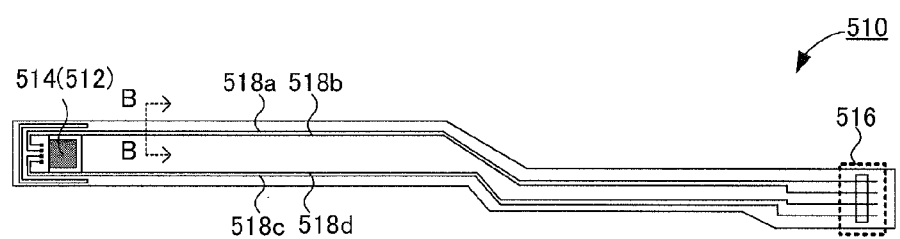
FIG. 28 is a schematic plan view illustrating a first example of a flexible substrate for suspension of the present invention.

FIG. 28 is a schematic plan view illustrating a first example of a flexible substrate for suspension of the present invention, and more specifically, a schematic plan view illustrating a flexible substrate for suspension used in a hard disk drive. The flexible substrate 510 for suspension illustrated in the example of FIG. 1 comprises an element mounting region 514 for mounting a slider 512 at a leading end of one side, and an external circuit connecting region 516 for performing connection to an external circuit at a leading end of the other side. Furthermore, the flexible substrate 510 for suspension comprises a conductive layer 518 for wiring including inter-terminal wirings 518a to 518d for connecting the element mounting region 514 and the external circuit connecting region 516. The inter-terminal wirings 518a and 518b, and the inter-terminal wirings 518c and 518d form wiring pairs, respectively. One is for recording, and the other is for reproduction.

Figure 29:
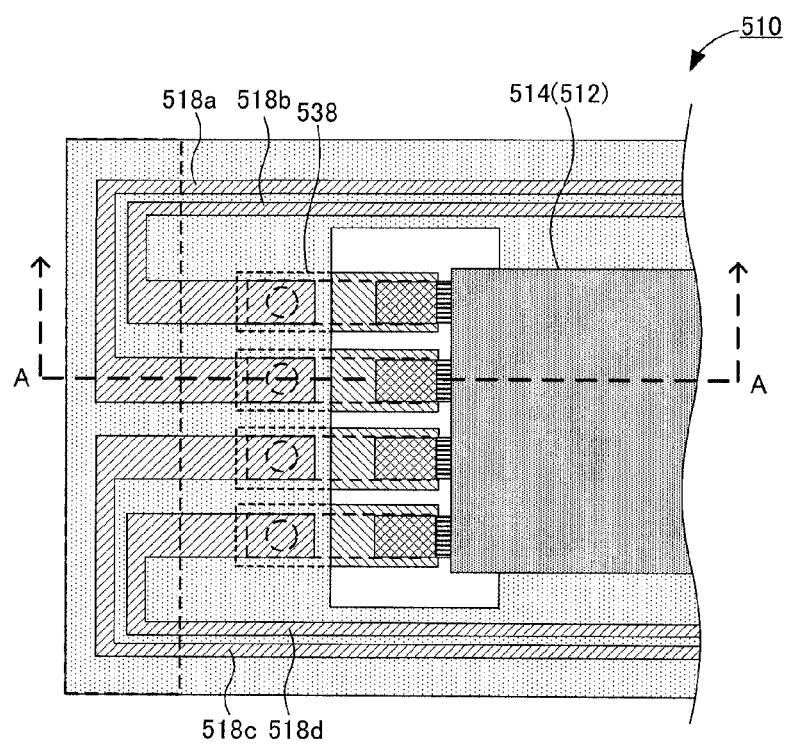
FIG. 29 is a schematic top view illustrating an element mounting region illustrated in FIG. 28.
Figure 30:
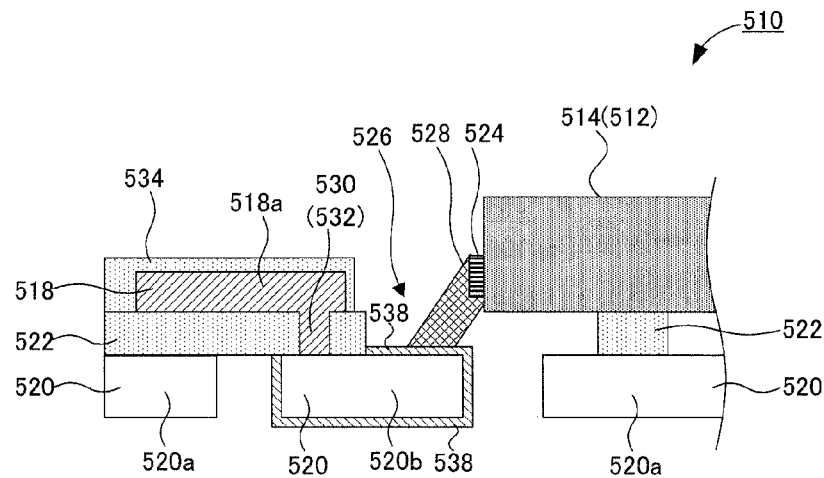
FIG. 30 is an A-A cross-sectional view of FIG. 29.

FIG. 29 is a schematic top view illustrating the element mounting region 514 illustrated in FIG. 28. FIG. 30 is an A-A cross-sectional view of FIG. 29. The flexible substrate 510 for suspension of the first example comprises a metal support layer 520 made of stainless steel (hereinafter, abbreviated as SUS), an insulating layer 522 made of polyimide on the metal support layer 520, and the above-described conductive layer 518 for wiring formed on the insulating layer 522 and made of Cu.

The metal support layer 520 includes a support section 520a that supports the insulating layer 522 and the conductive layer 518 for wiring, and a terminal section 520b that is separated from the support section 520a. In the element mounting region 514, the slider 512 is mounted on the support section 520a through the insulating layer 522. In the slider 512, a slider-side terminal 524 is provided to face the terminal section 520b. A removal section 526, in which the conductive layer 518 for wiring and the insulating layer 522 are removed, is formed between the terminal section 520b and the slider-side terminal 524, such that the terminal section 520b can be connected to the slider-side terminal 524. The terminal section 520b is exposed by the removal section 526 and is connected to the slider-side terminal 524 through a solder 528.

Also, via holes 530 passing from the conductive layer 518 for wiring side to the metal support layer 520 side are formed in the insulating layer 522. Furthermore, the via holes 530 are filled with conductors made of Cu. The inter-terminal wirings 518a to 518d included in the conductive layer 518 for wiring are connected to the terminal section 520b through the conductors 532 filled in the via holes, respectively. Also, the conductive layer 518 for wiring is covered by a cover layer 534 (omitted in FIG. 29).

In the flexible substrate 510 for suspension illustrated in FIGS. 28 to 30, the terminal section 520b employing the metal support layer 520 is used as the terminal section to be connected to the slider-side terminal 524. Therefore, the mechanical strength of the terminal section to be connected to the slider-side terminal 524 can be increased more than the case of using the terminal section employing the conductive layer 518 for wiring. This can prevent the deformation and/or wiring disconnection of the terminal section to be connected to the slider-side terminal 524. Hereinafter, the flexible substrate for suspension of the present invention will be described in detail.

1. Metal Support Layer

The metal support layer in the present invention includes the support section that supports the insulating layer and the conductive layer for wiring, and the terminal section that is separated from the support section. Also, the material of the metal support layer is not specially limited as long as the mechanical strength thereof is stronger than that of the conductive layer for wiring, but SUS is preferable. This is because the mechanical strength of SUS is stronger than that of copper that is commonly used as the material of the conductive layer for wiring. Incidentally, the mechanical strength as used herein means stiffness, yield strength, or the like (the same elsewhere in this specification). Hereinafter, the terminal section and the support section included in the metal support layer of the present invention will be described in detail.

(1) Terminal Section

The terminal section in the present invention is not specially limited as long as the terminal section is connected to the element-side terminal included in the element to be mounted in the element mounting region, but it is preferable that the terminal section is exposed by the removal section in which the insulating layer and the conductive layer for wiring are removed, as in the case where the terminal section 520b illustrated in FIGS. 29 and 30 is exposed by the removal section 526. This is because the terminal section can be connected to the element-side terminal on the conductive layer for wiring side with reference to the metal support layer, such that the terminal section 520b illustrated in FIGS. 29 and 30 can be connected to the slider-side terminal 524.

Also, it is preferable that a plated layer including at least one of Ni and Au is formed on a top surface and a bottom surface of the terminal section, as in a case where a wiring plated layer 538 is formed on a top surface and a bottom surface of the terminal section 520b illustrated in FIGS. 29 and 30. This is because when the terminal section is connected to the element-side terminal included in the element to be mounted in the element mounting region, the resistance between the terminal section and the element-side terminal is reduced.

Furthermore, it is preferable that a shape of the terminal section is adjusted so as to increase the mechanical strength of the terminal section. For example, it is preferable that the shape of the terminal section has a wide section expanding in a width direction substantially perpendicular to an extending direction of the terminal section in a portion intersecting with an edge section in the removal section. This is because the mechanical strength of the terminal section can be further increased. Also, it is preferable that the shape of the terminal section is adjusted so as to reduce the weight of the flexible substrate for suspension.

Also, it is preferable that the thickness of the terminal section, in a similar manner, is in a range of 3 μm to 30 μm, and particularly, in a range of 5 μm to 20 μm. Furthermore, the thickness of the terminal section is generally equal to the thickness of the support section, but may be thinner than the thickness of the support section. In this case, since the support section protrudes with respect to the terminal section, a short circuit between the terminal section and a terminal of an external circuit or the like can be suppressed when the terminal section is connected to the terminal of the external circuit, or the like. Also, by making the terminal section thinner than the support section, the weight of the flexible substrate for suspension can be reduced. Specifically, the weight can be reduced by making the thickness of the terminal section thinner in a range of 1 μm to 15 μm than the support section. Also, more particularly, it is preferable that the weight is reduced by making the thickness of the terminal section thinner in a range of 2 μm to 10 μm than the support section.

(2) Support Section

The support section in the present invention supports the insulating layer and the conductive layer for wiring and is separated from the terminal section. Herein, the separation of the support section from the terminal section means that the support section is electrically separated from the terminal section.

Also, it is preferable that the shape of the support section is adjusted so as to reduce the weight of the flexible substrate for suspension.

Furthermore, it is preferable that, although different according to a kind of the material, the thickness of the support section is in a range of 10 μm to 30 μm, particularly in a range of 15 μM to 25 μm, and more particularly in a range of 18 μm to 20 μm.

2. Connecting Section

The connecting section in the present invention is not specially limited as long as the connecting section connects the inter-terminal wiring to the terminal section, but three aspects may be considered. Hereinafter, the three aspects, the first to third aspects, will be described in detail.

(1) First Aspect of Connecting Section

The first aspect of the connecting section in the present invention is an aspect in which the connecting section is formed in the insulating layer by a conductor filled in the via hole passing from the conductive layer for wiring side to the metal support layer side.

A material of the conductor filled in the via hole of the first aspect is not specially limited as long as the inter-terminal wiring can be electrically conductive with the terminal section through the conductor filled in the via hole, but examples of the material of the conductor may include nickel (Ni), Cu, silver (Ag), gold (Au), and solder. Among them, nickel (Ni), Cu, or the like is preferable. This is because production costs can be reduced.

Also, examples of the method of forming the conductor filled in the via hole of the first aspect may include an electrolytic plating method.

Furthermore, it is preferable that the diameter of the conductor filled in the via hole of the first aspect is in a range of 20 μm to 200 μm, and particularly, in a range of 30 μm to 100 μm. This is because when smaller than this range, the connection reliability between the connecting section and the terminal section is lowered, and the resistance between the connecting section and the terminal section is increased; and when larger than this range, the wiring degree of freedom of the wiring included in the conductive layer for wiring is reduced.

In the flexible substrate 510 for suspension illustrated in FIGS. 29 to 30, the conductor 532 filled in the via hole is used as the first aspect of the connecting section. Also, the conductor 532 filled in the via hole is made of Cu.

Figure 31:
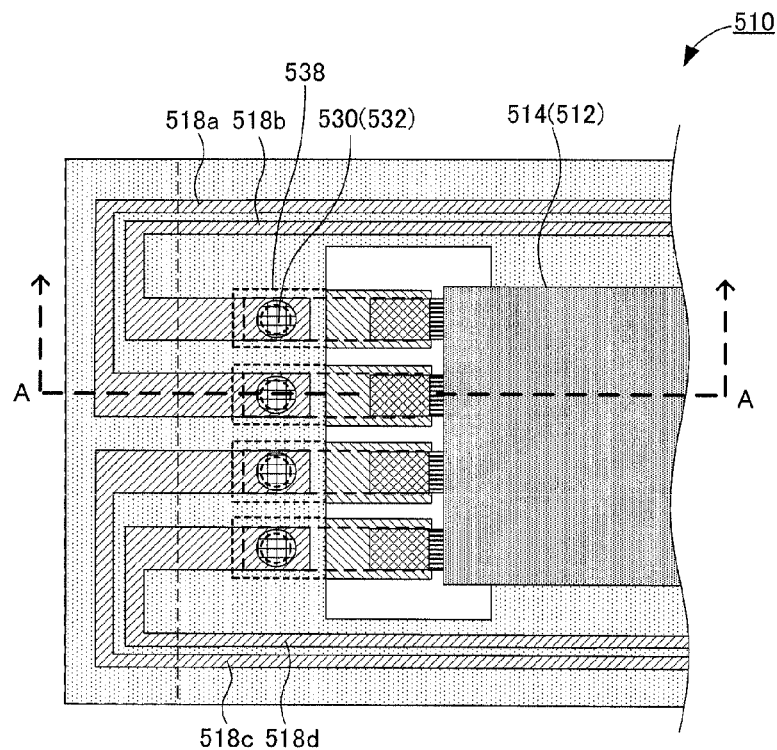
FIG. 31 is a schematic plan view of an element mounting region in a second example of the flexible substrate for suspension of the present invention.
Figure 32:
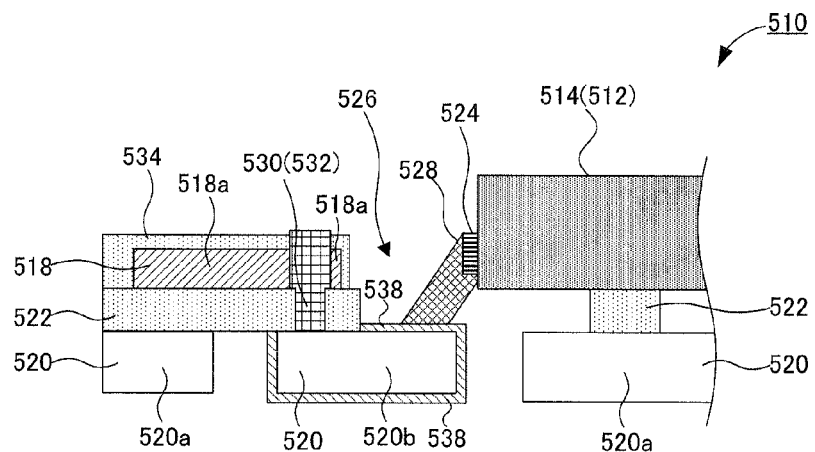
FIG. 32 is an A-A cross-sectional view of FIG. 31.

FIGS. 31 and 32 illustrate a second example of the flexible substrate for suspension of the present invention. FIG. 31 is a schematic plan view of an element mounting region in the second example of the flexible substrate for suspension of the present invention. FIG. 32 is an A-A cross-sectional view of FIG. 31. In the flexible substrate 510 for suspension of the second example, the conductor 532 filled in the via hole is used as the first aspect of the connecting section. Also, the conductor 532 filled in the via hole is made of Ni.

(2) Second Aspect of Connecting Section

The second aspect of the connecting section in the present invention is an aspect in which the connecting section is formed by the conductive layer for connection formed on the terminal section.

As the connecting section in the present invention, the second aspect is more preferable than the first aspect. This is because the area contacting the terminal section is larger in the conductive layer for connection of the second aspect than in the conductor filled in the via hole of the first aspect, and the resistance between the connecting section and the terminal section is further reduced as compared with the first aspect. Also, this is because when the element-side terminal is connected to the terminal section by ball bonding using solder, as described below, the connection area is increased and thus the connection reliability between the terminal section and the element-side terminal is increased.

Also, the material of the conductive layer for connection in the second aspect may be the same as that in the first example. Furthermore, examples of the method of forming the conductive layer for connection of the second aspect may include an electrolytic plating method.

The shape of the conductive layer for connection of the second aspect is not specially limited as long as the conductive layer for connection is formed on the terminal section in not an entire region but a partial region in a width direction that is defined as a vertical direction with respect to a direction of the element-side terminal side from a location connected to the inter-terminal wiring.

Also, the shape of the conductive layer for connection of the second aspect is not specially limited to how far the conductive layer for connection extends from the location connected to the inter-terminal wiring in the direction toward the end of the element-side terminal side on the terminal section, but it is preferable that the conductive layer for connection extends to the end of the element-side terminal side. This is because the area where the conductive layer for connection contacts the terminal section is increased and thus the resistance between the conductive layer for connection and the terminal section is further reduced. Also, the element-side terminal is electrically conductive with the inter-terminal wiring through the terminal section and is also electrically conductive with the inter-terminal wiring through only the conductive layer for connection. This is because the conductive layer for connection has higher conductivity than the terminal section and thus the resistance between the inter-terminal wiring and the element-side terminal is further reduced.

Furthermore, for example, when connected to the element-side terminal by an inter-terminal connecting section such as solder, which is to be described below, the shape of the conductive layer for connection of the second aspect may be provided with a concave section to be filled with the corresponding solder or the like, so as to increase the reliability of connection to the corresponding solder or the like.

Also, it is preferable that a plated layer including at least one of Ni and Au is formed on the surface of the conductive layer for connection. This is because when the terminal section is connected to the element-side terminal included in the element to be mounted in the element mounting region, the resistance between the terminal section and the element-side terminal is reduced.

Figure 33:
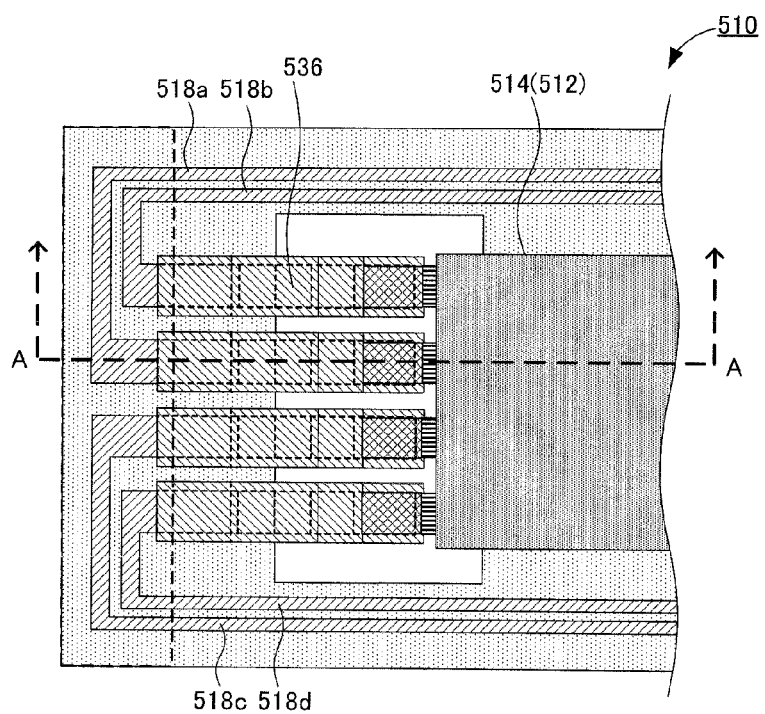
FIG. 33 is a schematic plan view of an element mounting region in a third example of the flexible substrate for suspension of the present invention.
Figure 34:
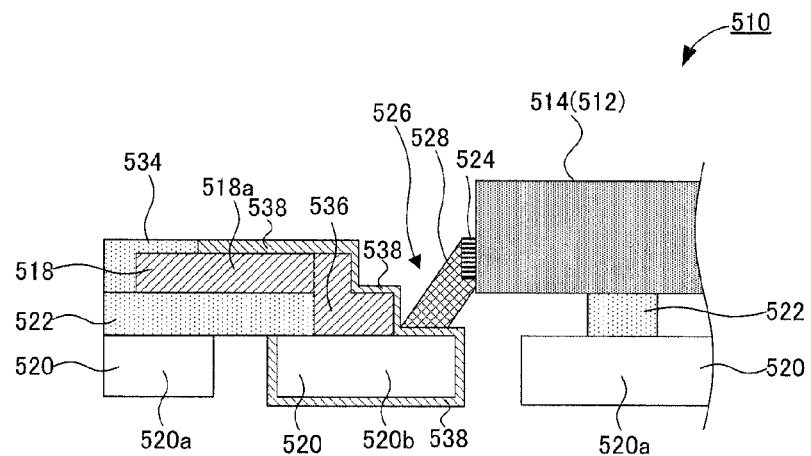
FIG. 34 is an A-A cross-sectional view of FIG. 33.

FIG. 33 is a schematic plan view of an element mounting region in a third example of the flexible substrate for suspension of the present invention. FIG. 34 is an A-A cross-sectional view of FIG. 33. In the flexible substrate 510 for suspension of the third example, the conductive layer 536 for connection formed on the terminal section 520*b* is used as the second aspect of the connecting section according to the present invention. The conductive layer 536 for connection is made of Cu. Furthermore, a wiring plated layer 538 including at least one of Ni and Au is formed on the surfaces of the conductive layer 536 for connection and the inter-terminal wirings 518*a* to 518*d*. Since the area contacting the terminal section 520*b* is larger in the conductive layer 536 for connection side than in the conductor 532 filled in the via hole illustrated in FIGS. 28 to 30, the resistance between the conductive layer 536 for connection and the terminal section 520*b* can be reduced more than the resistance between the conductor 532 inside the via hole illustrated in FIGS. 28 to 30 and the terminal section 520*b*.

Figure 35:
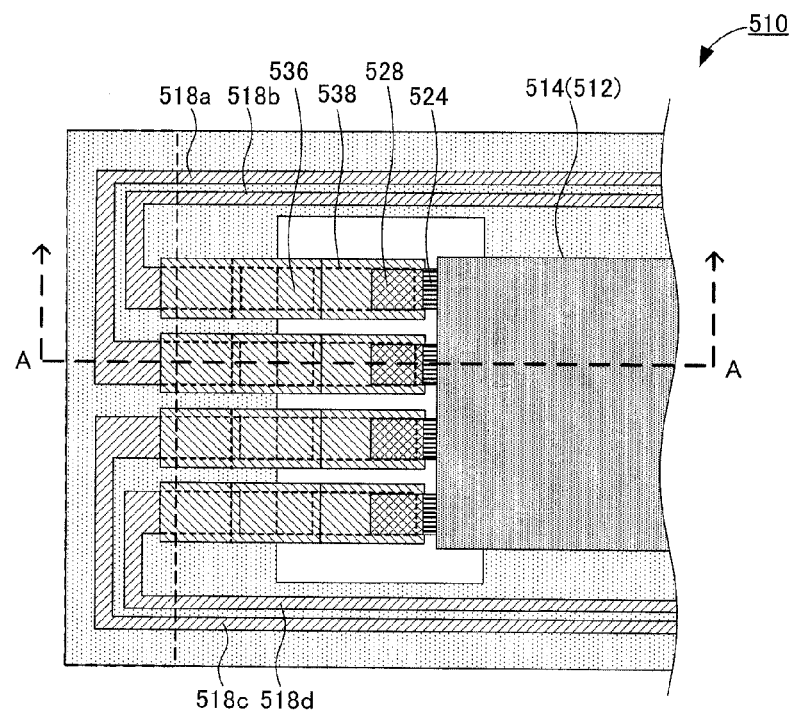
FIG. 35 is a schematic plan view of an element mounting region in a fourth example of the flexible substrate for suspension of the present invention.
Figure 36:
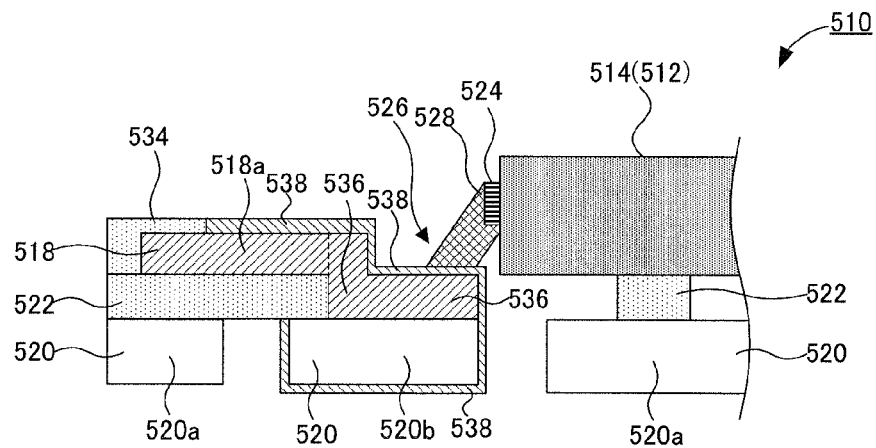
FIG. 36 is an A-A cross-sectional view of FIG. 35.

FIG. 35 is a schematic plan view of an element mounting region in a fourth example of the flexible substrate for suspension of the present invention. FIG. 36 is an A-A cross-sectional view of FIG. 35. In the flexible substrate 510 for suspension of the fourth example, the conductive layer 536 for connection formed on the terminal section 520*b* is used as the second aspect of the connecting section in the present invention. The conductive layer 536 for connection is formed from the location connected to the inter-terminal wirings 518*a* to 518*d* to the slider-side terminal 524 side. Therefore, as compared with the flexible substrate 510 for suspension illustrated in FIGS. 33 and 34, the resistance between the inter-terminal wirings 518*a* to 518*d* and the slider-side terminal 524 can be further reduced.

(3) Third Aspect of Connecting Section

The third aspect of the connecting section in the present invention is an aspect in which the connecting section is formed in the metal support layer and the insulating layer by a conductor filled in the via hole passing from the side of the metal support layer opposite to the insulating layer side to the conductive layer for wiring side of the insulating layer.

As the connecting section in the present invention, the third aspect is more preferable than the first aspect. In the first aspect, a land needs to be formed as a part of the conductive layer for wiring around the via hole on the insulating layer. On the contrary, in the third aspect, such a land need not be formed, and wiring degree of freedom of the wiring included in the conductive layer for wiring can be improved.

Also, the material of the conductor filled in the via hole of the third aspect may be the same as that in the first aspect. Furthermore, examples of the method of forming the conductor filled in the via hole of the third aspect may include an electrolytic plating method.

Furthermore, it is preferable that the diameter of the conductor filled in the via hole of the third aspect is in a range of 20 μm to 200 μm, and particularly, in a range of 30 μm to 100 μm. This is because when smaller than this range, the connection reliability between the connecting section and the terminal section is lowered, and the resistance between the connecting section and the terminal section is increased; and when larger than this range, the wiring degree of freedom of the wiring included in the conductive layer for wiring is reduced.

Figure 37:
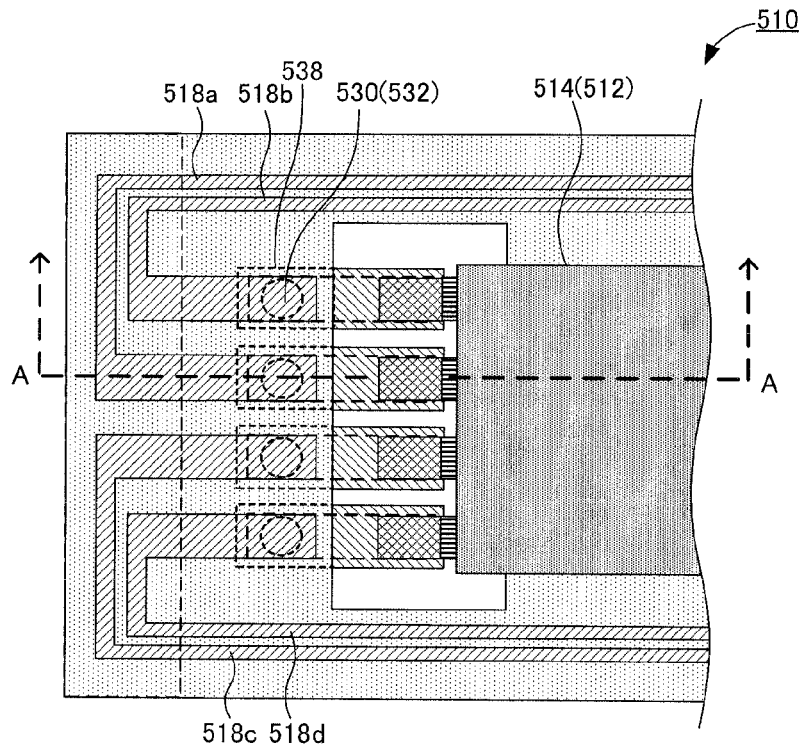
FIG. 37 is a schematic plan view of an element mounting region in a fifth example of the flexible substrate for suspension of the present invention.
Figure 38:
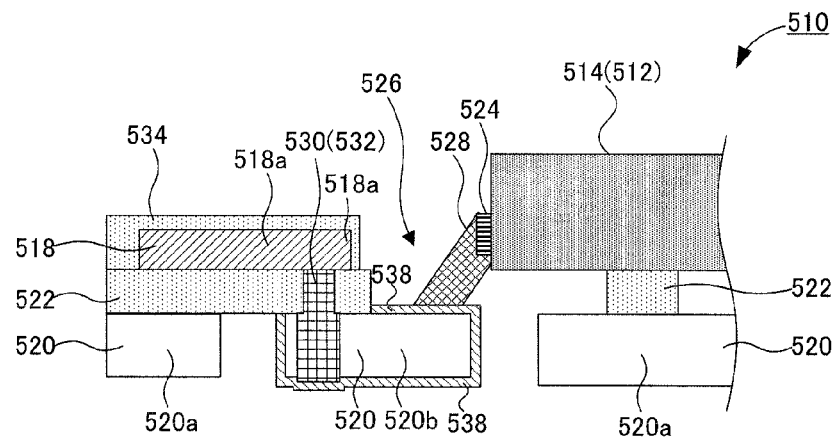
FIG. 38 is an A-A cross-sectional view of FIG. 37.

FIG. 37 is a schematic plan view of an element mounting region in a fifth example of the flexible substrate for suspension of the present invention. FIG. 38 is an A-A cross-sectional view of FIG. 37. In the flexible substrate 510 for suspension of the fifth example, in the metal support layer 520 and the insulating layer 522, the via hole 530 is formed to pass from the side of the metal support layer 520 opposite to the insulating layer 522 side to the conductive layer 518 for wiring side of the insulating layer 522, and the conductor 532 filled in the via hole is used as the third aspect of the connecting section in the present invention. Also, the conductor 532 filled in the via hole is made of Ni.

In the flexible substrate 510 for suspension of the fifth example, since the land need not be formed as a part of the conductive layer for wiring around the via hole of the conductive layer 518 for wiring, the wiring degree of freedom of the inter-terminal wirings 518*a* to 518*d* can be improved, as compared with the flexible substrate 510 for suspension of the first example illustrated in FIGS. 28 to 30.

3. Conductive Layer for Wiring

The conductive layer for wiring in the present invention includes the inter-terminal wirings that are connected to the terminal section by the connecting section. In the flexible substrate for suspension of the present invention, as described below in "I. Suspension with Element 1. Element to be Mounted in Element Mounting Region" section, the conductive layer for wiring in the present invention is an element to be mounted in the element mounting region and includes a slider and a heat-assisted element. The conductive layer for wiring further includes a slider-side terminal connecting wiring to be connected to a slider-side terminal included in the slider, when the inter-terminal wiring is connected to a heat-assisted element-side terminal included in the heat-assisted element through the terminal section.

Figure 39:
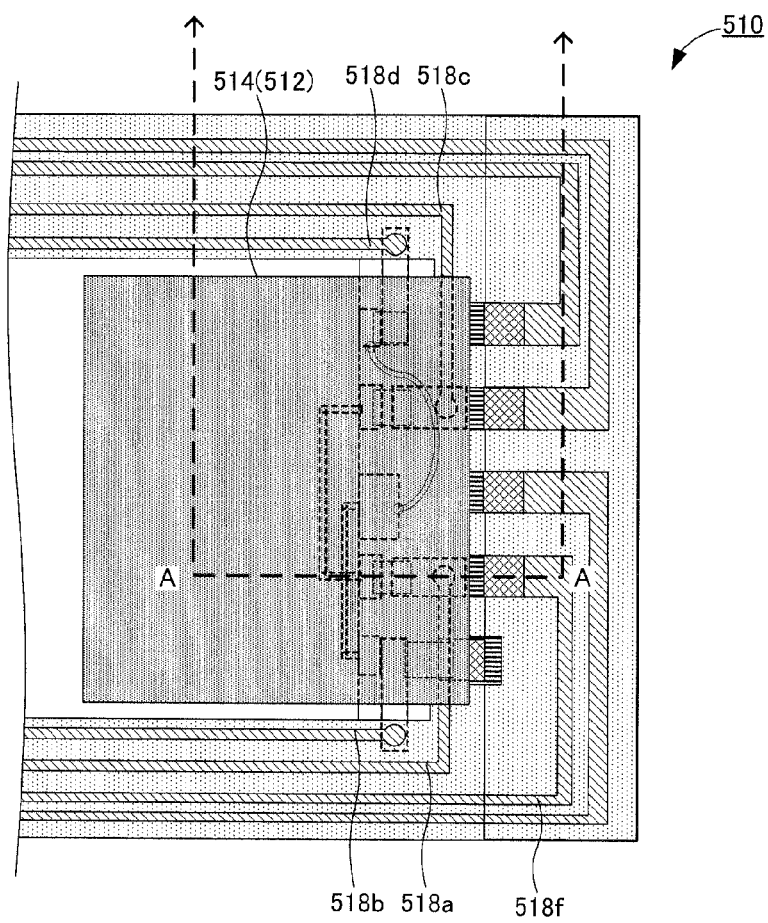
FIG. 39 is a schematic top view illustrating an element mounting region in a sixth example of the flexible substrate for suspension of the present invention.
Figure 40:
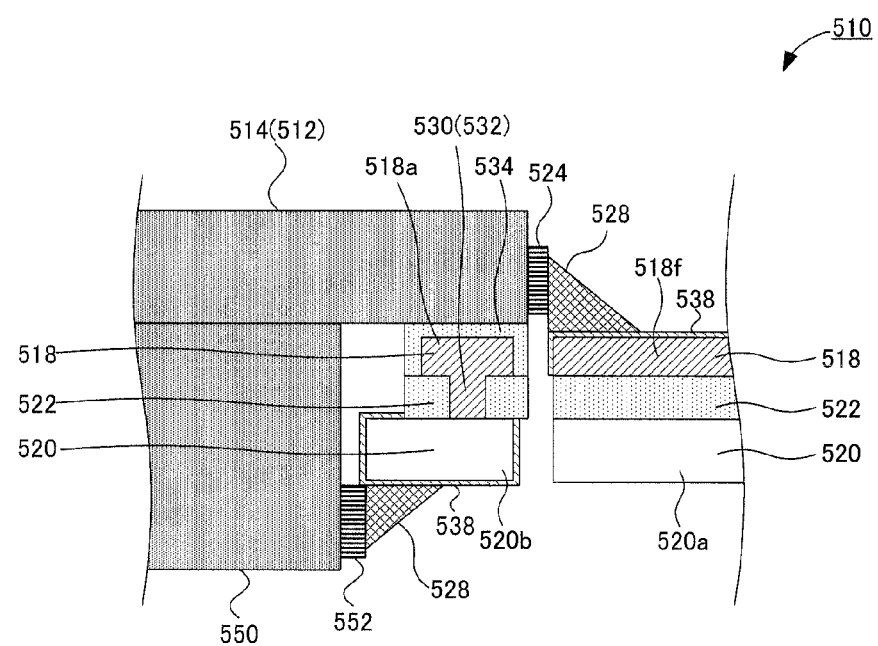
FIG. 40 is an A-A cross-sectional view of FIG. 39.

FIG. 39 is a schematic top view illustrating an element mounting region in a sixth example of the flexible substrate for suspension of the present invention. FIG. 40 is an A-A cross-sectional view of FIG. 39. The conductive layer 518 for wiring includes inter-terminal wirings 518a to 518d to be connected to the terminal section 520b that is to be connected to an LD element-side terminal 552 to be described below, and further includes a slider-side inter-terminal wiring 518f to be connected to the slider-side terminal 524, as the slider-side terminal connecting wiring.

4. Element Mounting Region

The element mounting region in the present invention is a region provided in the flexible substrate for suspension of the present invention, and a region where the element is to be mounted. The element mounting region in the present invention is not specially limited as long as the element mounting region is formed at a location where the terminal section is to be connected, in the element-side terminal included in the element to be mounted in the element mounting region in the present invention.

5. Insulating Layer

The insulating layer in the present invention is a layer that is formed on the metal support layer. Since the contents of the insulating layer in the present invention are identical to the contents described in "A. Wiring Circuit Substrate 4. Insulating Layer", a description thereof will be omitted herein.

6. Configurations Other than Flexible Substrate for Suspension

The flexible substrate for suspension of the present invention may further comprise a cover layer that covers the conductive layer for wiring. Examples of the material of the cover layer may include polyimide (PI). Also, the material of the cover layer may be a photosensitive material or a non-photosensitive material. Furthermore, the photosensitive material may be a positive type or may be a negative type. Also, the thickness of the cover layer is not specially limited as long as the cover layer is thick enough to protect the conductive layer for wiring.

G. Method of Producing Flexible Substrate for Suspension

Next, a method of producing a flexible substrate for suspension of the present invention will be described. The method of producing the flexible substrate for suspension of the present invention is a method of producing a flexible substrate for suspension, which produces the flexible substrate for suspension described above in "F. Flexible Substrate for Suspension" section, and is characterized in that the method of producing the flexible substrate for suspension comprises steps of: forming the terminal section, and forming the connecting section.

According to the present invention, the flexible substrate for suspension described above in "F. Flexible Substrate for Suspension" section can be produced. Therefore, as described in "F. Flexible Substrate for Suspension" section, it is possible to produce the flexible substrate for suspension in which the mechanical strength of the terminal section to be connected to the element-side terminal is increased as compared with the case of using the terminal section included in the conductive layer for wiring. That is, it is possible to produce the flexible substrate for suspension that can prevent the deformation and/or wiring disconnection of the terminal section to be connected to the element-side terminal.

Hereinafter, such a method of producing the flexible substrate for suspension will be described in detail with reference to examples.

FIGS. 41 and 42 are schematic process cross-sectional views illustrating a first example of the method of producing the flexible substrate for suspension of the present invention. The method of producing the flexible substrate for suspension of the first example is a method by which the flexible substrate 510 for suspension illustrated in FIGS. 28 to 30 is produced with a layered material. FIGS. 41A to 41H each illustrates a cross-section corresponding to the A-A cross-section of FIG. 29 and is a schematic process cross-sectional view illustrating the element mounting region. FIGS. 42A to 42H each illustrates a cross-section corresponding to the B-B cross-section of FIG. 28 and is a schematic process cross-sectional view illustrating the inter-terminal wirings. Hereinafter, the first example of the method of producing the flexible substrate for suspension of the present invention will be described with reference to FIGS. 41 and 42.

Figure 41A:
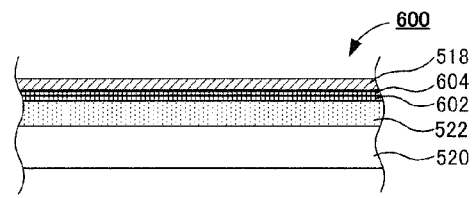
FIGS. 41A to 41H are schematic process cross-sectional views illustrating a first example of a method of producing a flexible substrate for suspension of the present invention.
Figure 42A:
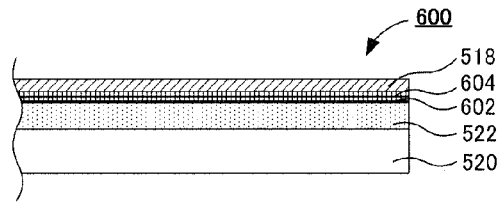
FIGS. 42A to 42H are schematic process cross-sectional views illustrating the first example of the method of producing the flexible substrate for suspension of the present invention.

First, a layered material 600 is prepared (FIGS. 41A and 42A). The layered material 600 includes a metal support layer 520 made of SUS, an insulating layer 522 formed on the metal support layer 520 and made of PI, a metal thin-film layer 602 formed on the insulating layer 522, a Cu sputtering layer 604 formed on the metal thin-film layer 602, and a conductive layer 518 for wiring formed on the Cu sputtering layer 604. The metal thin-film layer 602 is a Cr thin-film layer that is formed by a sputtering method.

Figure 41B:
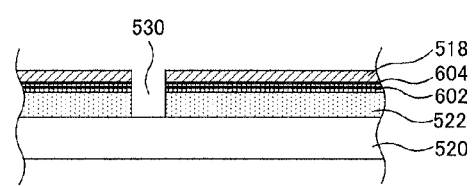
Figure 42F:
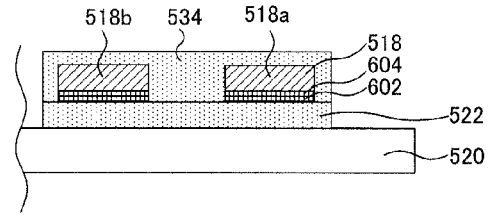
Figure 42B:
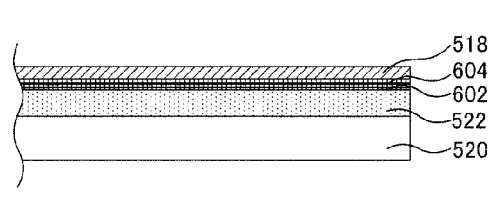

Subsequently, a resist pattern is formed on the top surface of the conductive layer 518 for wiring by a photolithography method, and the resist pattern is removed by etching the conductive layer 518 for wiring exposed from the resist pattern. Subsequently, the insulating layer 522 exposed from a region, where the conductive layer 518 for wiring is etched, is etched (FIGS. 41B and 42B). Therefore, a via hole 530 passing from the conductive layer 518 for wiring to the metal support layer 520 side is formed in the insulating layer 522.

Figure 41C:
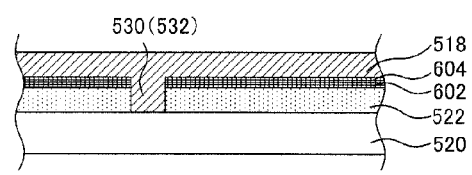
Figure 42G:
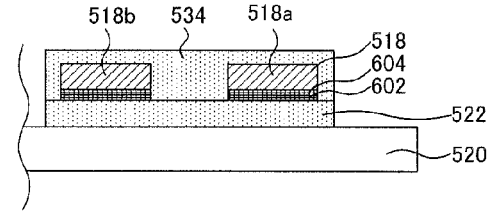
Figure 42C:
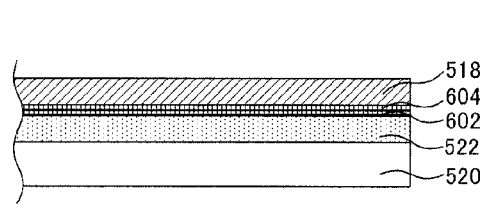

Subsequently, the conductive layer 518 for wiring is made thick by plating Cu on the top surface of the conductive layer 518 for wiring and the via hole 530 by electrolytic plating, and the via hole 530 is filled with a conductor 532 made of Cu (FIGS. 41C and 42C).

Figure 41D:
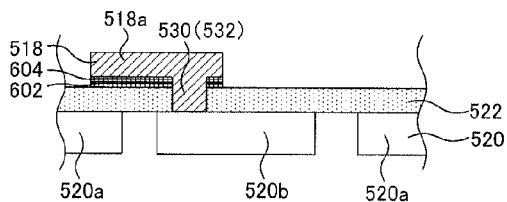
Figure 42H:
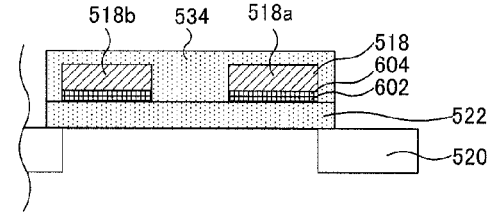
Figure 42D:
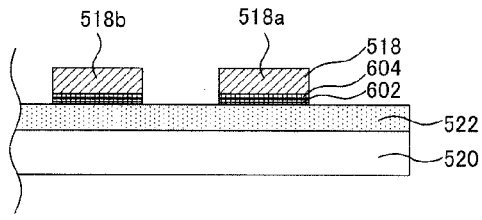

Subsequently, resist patterns are formed on the bottom surface of the metal support layer 520 and the top surface of the conductive layer 518 for wiring. Subsequently, the resist patterns are removed by etching the metal support layer 520, the conductive layer 518 for wiring, and the Cu sputtering layer 604 exposed from the resist patterns by an etchant such as ferric chloride or the like, and then, the metal thin-film layer 602 is removed (FIGS. 41D and 42D). In this manner, the metal support layer 520 is separated into a support section 520a and a terminal section 520b. Also, an inter-terminal wiring 518a and an inter-terminal wiring 518b are formed from the conductive layer 518 for wiring. The inter-terminal wiring 518a and the inter-terminal wiring 518b are connected to the terminal section 520b by the conductor 532 filled in the via hole.

Figure 41E:
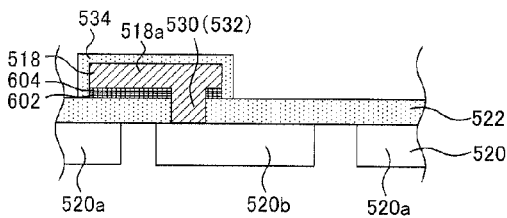
Figure 42E:
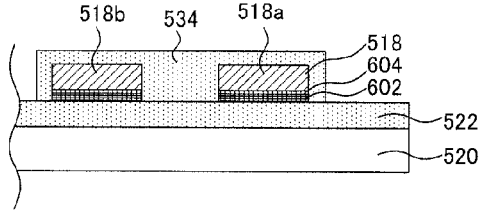

Subsequently, a cover layer 534 made of PI is formed on the top surfaces of the insulating layer 522 and the conductive layer 518 for wiring. Subsequently, a resist pattern is formed on the top surface of the cover layer 534. Subsequently, the resist pattern is removed by etching the cover layer 534 exposed from the resist pattern. Therefore, the cover layer 534 is formed to cover the inter-terminal wiring 518a and the inter-terminal wiring 518b (FIGS. 41E and 42E).

Figure 41F:
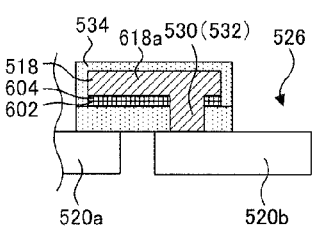
Figure 41F:
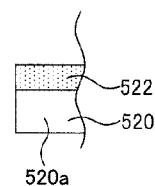

Subsequently, a resist pattern is formed on the top surfaces of the insulating layer 522, the conductive layer 518 for wiring, and the cover layer 534, such that a region of the insulating layer 522 desired to be removed is exposed. Subsequently, the resist pattern is removed by etching the insulating layer 522 exposed from the resist pattern (FIGS. 41F and 42F). Therefore, a removal section 526, in which a region located on the terminal section 520b is removed, is formed in the insulating layer 522.

Figure 41G:
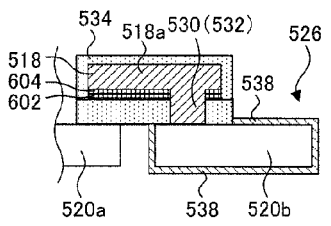
Figure 41G:
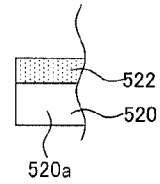

Subsequently, resist patterns are formed on the top surfaces of the metal support layer 520, the insulating layer 522, the conductive layer 518 for wiring, and the cover layer 534, and the bottom surface of the metal support layer 520, such that the top surface or the bottom surface of the terminal section 520b is exposed. Subsequently, a wiring plated layer 538 including at least one of Ni and Au is formed on the top surface or the bottom surface of the terminal section 520b exposed from the resist pattern (FIGS. 41G and 42G).

Figure 41H:
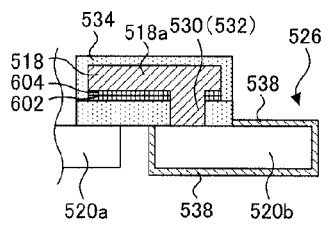
Figure 41H:
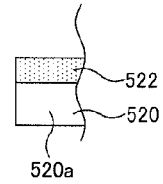

Subsequently, a resist pattern is formed on the bottom surface of the metal support layer 520, such that a part of the metal support layer 520 is exposed. Subsequently, in the metal support layer 520, a region exposed from the resist pattern is etched. In this manner, the metal support layer 520 is removed except for other necessary regions of the support section 520a and the terminal section 520b (FIGS. 41H and 42H). By the above manner, the flexible substrate 510 for suspension illustrated in FIGS. 28 to 30 is formed.

FIGS. 43 and 44 are schematic process cross-sectional views each illustrating a second example of the method of producing the flexible substrate for suspension of the present invention. The method of producing the flexible substrate for suspension of the second example is a method by which the flexible substrate 510 for suspension illustrated in FIGS. 31 and 32 is produced with a layered material. FIGS. 43A to 43H each illustrates a cross-section corresponding to the A-A cross-section of FIG. 31 and is a schematic process cross-sectional view illustrating the element mounting region. FIGS. 44A to 44H each illustrates a cross-section corresponding to the B-B cross-section of FIG. 28 and is a schematic process cross-sectional view illustrating the inter-terminal wirings. Hereinafter, the second example of the method of producing the flexible substrate for suspension of the present invention will be described with reference to FIGS. 43 and 44.

Figure 43A:
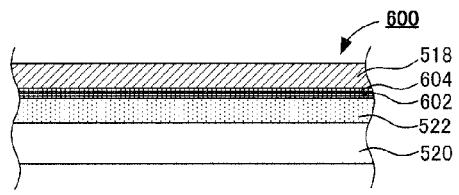
FIGS. 43A to 43H are schematic process cross-sectional views illustrating a second example of the method of producing the flexible substrate for suspension of the present invention.
Figure 44A:
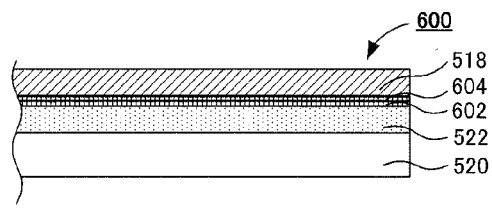
FIGS. 44A to 44H are schematic process cross-sectional views illustrating the second example of the method of producing the flexible substrate for suspension of the present invention.

First, a layered material 600 is prepared (FIGS. 43A and 44A). The layered material 600 includes a metal support layer 520 made of SUS, an insulating layer 522 formed on the metal support layer 520 and made of PI, a metal thin-film layer 602 formed on the insulating layer 522, a Cu sputtering layer 604 formed on the metal thin-film layer 602, and a conductive layer 518 for wiring formed on the Cu sputtering layer 604. The metal thin-film layer 602 is a Cr thin-film layer that is formed by a sputtering method.

Figure 43B:
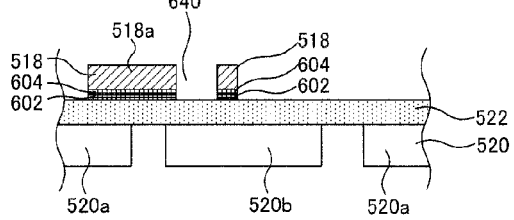
Figure 44B:
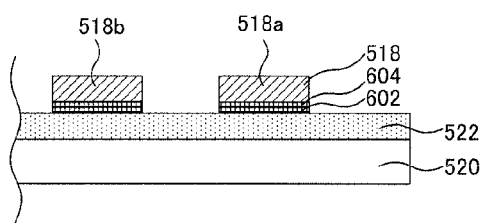

Subsequently, resist patterns are formed on the top surface of the conductive layer 518 for wiring and the bottom surface of the metal support layer 520 by a photolithography method, the resist patterns are removed by etching the metal support layer 520, the conductive layer 518 for wiring, and the Cu sputtering layer 604 exposed from the resist patterns by an etchant such as ferric chloride or the like, and then, the metal thin-film layer 602 is removed (FIGS. 43B and 44B). Therefore, an unnecessary region is removed from the conductive layer 518 for wiring, and also, an inter-terminal wiring 518a and an inter-terminal wiring 518b are formed. In this case, an opening 640 for via hole is formed to expose a region that forms a via hole 530 in the insulating layer 522. Also, the metal support layer 520 is separated into a support section 520a and a terminal section 520b.

Figure 43C:
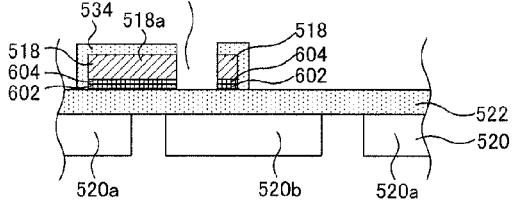
Figure 44C:
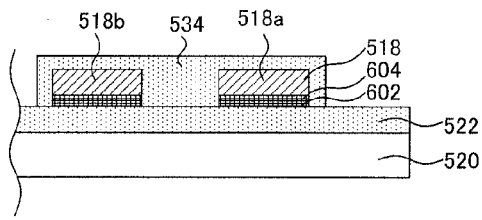

Subsequently, a cover layer 534 made of PI is formed on the top surface of the insulating layer 522 and the bottom surface of the metal support layer 520. Subsequently, a resist pattern is formed on the top surface of the cover layer 534. Subsequently, the resist pattern is removed by etching the cover layer 534 exposed from the resist pattern (FIGS. 43C and 44C). In this manner, the cover layer 534 is formed to cover the inter-terminal wiring 518a and the inter-terminal wiring 518b. In this case, the conductive layer 518 for wiring and the insulating layer 522 are directly exposed from the opening 640 for via hole.

Figure 43D:
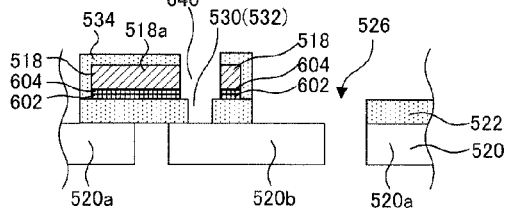
Figure 44D:
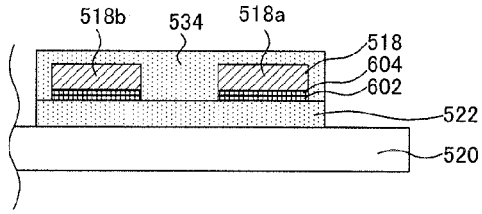

Subsequently, resist patterns are formed on the top surfaces of the insulating layer 522 and the cover layer 534, such that unnecessary regions of the insulating layer 522 are exposed. Subsequently, the resist patterns are removed by etching the insulating layer 522 exposed from the resist pattern (FIGS. 43D and 44D). Therefore, a removal section 526, in which a region located on the terminal section 520b is removed, is formed in the insulating layer 522. Also, in the insulating layer 522, a via hole 530 passing from the conductive layer 518 for wiring side to the metal support layer 520 side is formed in the region exposed to the opening 640 for via hole.

Figure 43E:
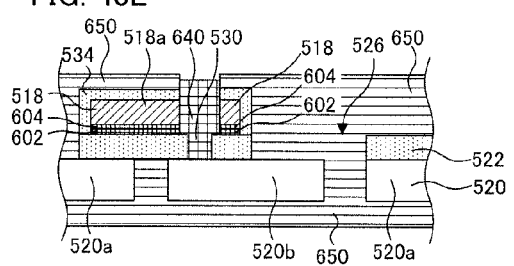
Figure 43F:
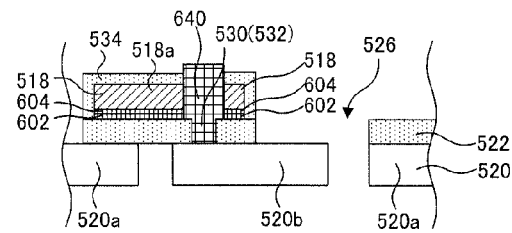
Figure 44E:
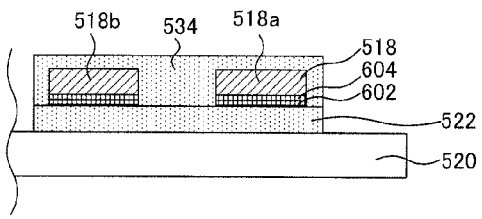
Figure 44F:
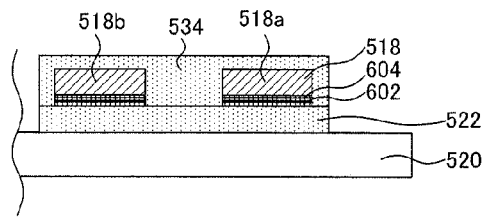

Subsequently, resist patterns 650 are formed on the top surfaces of the metal support layer 520, the insulating layer 522, and the conductive layer 518 for wiring, and the bottom surfaces of the metal support layer 520 and the insulating layer 522. In this case, the conductive layer 518 for wiring and the insulating layer 522 are directly exposed from the opening 640 for via hole. Subsequently, the via hole 530 is filled with a conductor made of Ni by electrolytic Ni plating (FIGS. 43E and 44E). Subsequently, the resist patterns are removed (FIGS. 43F and 44F).

Figure 43G:
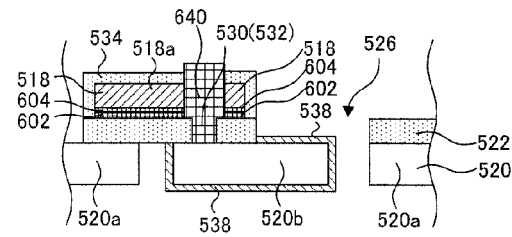
Figure 44G:
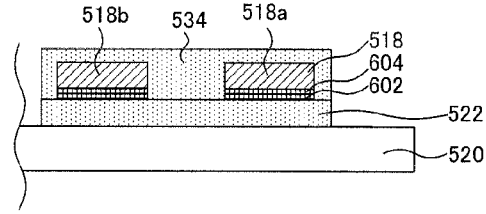

Subsequently, resist patterns are formed on the top surfaces of the metal support layer 520, the insulating layer 522, and the cover layer 534, and the bottom surface of the metal support layer 520, such that the top surface or the bottom surface of the terminal section 520b is exposed. Subsequently, a wiring plated layer 538 including at least one of Ni and Au is formed on the top surface or the bottom surface of the terminal section 520b exposed from the resist pattern (FIGS. 43G and 44G).

Figure 43H:
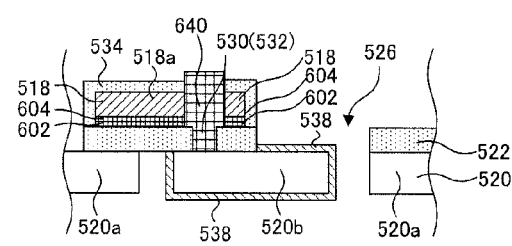
Figure 44H:
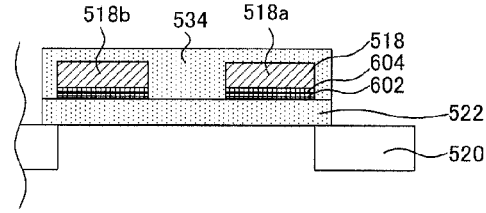

Subsequently, resist patterns are formed on the top surfaces of the metal support layer 520, the insulating layer 522, and the conductive layer 518 for wiring, and the bottom surfaces of the metal support layer 520 and the insulating layer 522. In this case, on the bottom surface of the metal support layer 520, the region of the metal support layer 520 to be removed is exposed from the resist pattern. Subsequently, the exposed metal support layer 520 is etched. In this manner, the metal support layer 520 is removed except for other necessary regions of the support section 520a and the terminal section 520b (FIGS. 43H and 44H). By the above manner, the flexible substrate 510 for suspension illustrated in FIGS. 31 and 32 is formed.

FIGS. 45 and 46 are schematic process cross-sectional views illustrating a third example of the method of producing the flexible substrate for suspension of the present invention. The method of producing the flexible substrate for suspension of the third example is a method by which the flexible substrate 510 for suspension illustrated in FIGS. 33 and 34 is produced with a two-layer material. FIGS. 45A to 45J each illustrates a cross-section corresponding to the A-A cross-section of FIG. 33 and is a schematic process cross-sectional view illustrating the element mounting region. FIGS. 46A to 46J each illustrates a cross-section corresponding to the B-B cross-section of FIG. 28 and is a schematic process cross-sectional view illustrating the inter-terminal wirings. Hereinafter, the third example of the method of producing the flexible substrate for suspension of the present invention will be described with reference to FIGS. 45 and 46.

Figure 45A:
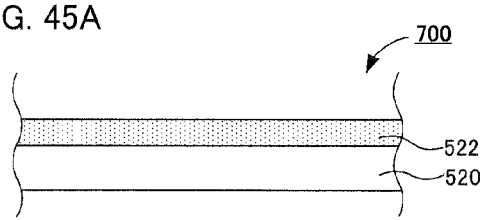
FIGS. 45A to 45J are schematic process cross-sectional views illustrating a third example of the method of producing the flexible substrate for suspension of the present invention.
Figure 46A:
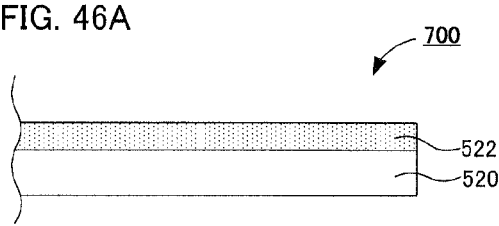
FIGS. 46A to 46J are schematic process cross-sectional views illustrating the third example of the method of producing the flexible substrate for suspension of the present invention.

First, a two-layer material 700 is prepared (FIGS. 45A and 46A). The two-layer material 700 includes a metal support layer 520 made of SUS, and an insulating layer 522 formed on the metal support layer 520 and made of PI.

Figure 45B:
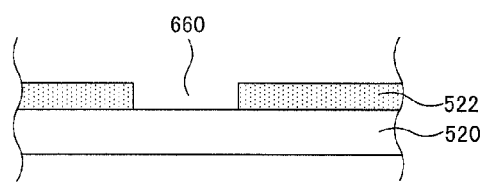

Subsequently, a resist pattern is formed on the top surfaces of the metal support layer 520 and the insulating layer 522, and the resist pattern is removed by etching the insulating layer 522 exposed from the resist pattern. Therefore, an insulating layer removal section 660 is formed (FIGS. 45B and 46B).

Figure 45C:
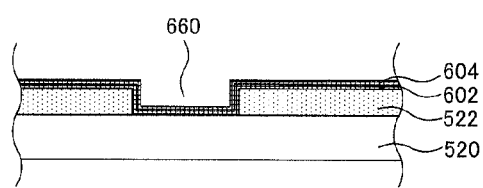

Subsequently, on the top surface of the insulating layer 522 and the surface exposed to the insulating layer removal section 660 in the insulating layer 522 and the metal support layer 520, a metal thin-film layer (for example, Cr thin-film layer or Ni thin-film layer) 602 is formed by a sputtering method. Subsequently, on the surface of the metal thin-film layer 602, a Cu sputtering layer 604 is formed by a sputtering method (FIGS. 45C and 46C).

Figure 45D:
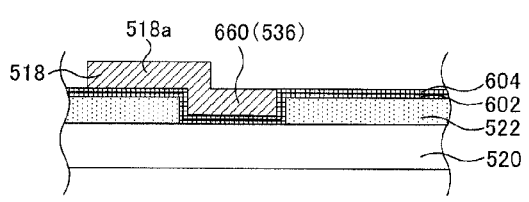

Subsequently, on the surface of the Cu sputtering layer 604, a resist pattern is formed to expose the region exposed to the insulating layer removal section 660 and the region where an inter-terminal wiring 518a and an inter-terminal wiring 518b to be described below are to be formed. Subsequently, on the surface of the Cu sputtering layer 604 exposed from the resist pattern, a conductive layer 518 for wiring including an inter-terminal wiring 518a and an inter-terminal wiring 518b is formed on the insulating layer 522 by electrolytic Cu plating, and a conductive layer 536 for connection is formed in the insulating layer removal section 660 (FIGS. 45D and 46D). In this case, the inter-terminal wiring 518a and the inter-terminal wiring 518b are connected to a region of the metal support layer 520, which is to be a terminal section 520b to be described below, by the conductive layer 536 for connection.

Figure 45E:
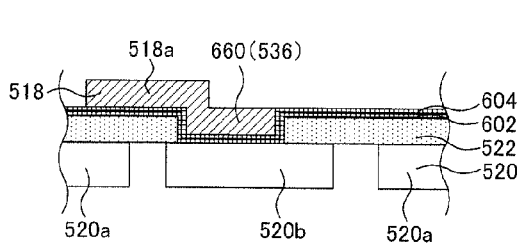

Subsequently, a resist pattern is formed on the bottom surface of the metal support layer 520. Subsequently, in the metal support layer 520, the region exposed from the resist pattern is etched, and then, the resist pattern is removed (FIGS. 45E and 46E). In this manner, the metal support layer 520 is separated into a support section 520a and a terminal section 520b. The inter-terminal wiring 518a and the inter-terminal wiring 518b are separated from the support section 520a and are connected to the terminal section 520b by the conductive layer 536 for connection.

Figure 45F:
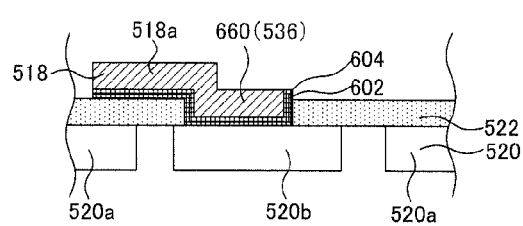
Figure 46F:
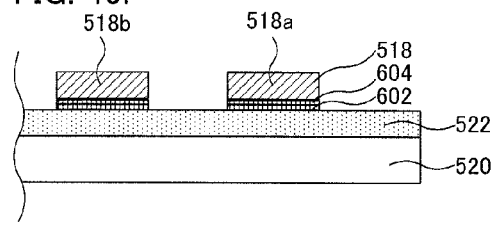
Figure 46B:
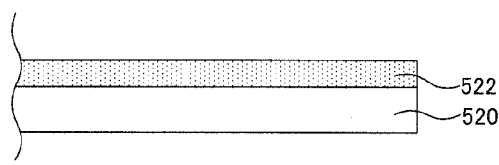

Subsequently, in the metal thin-film layer 602 and the Cu sputtering layer 604, the region where the conductive layer 518 for wiring is not formed thereon is etched (FIGS. 45F and 46F). In this manner, the inter-terminal wiring 518a and the inter-terminal wiring 518b are electrically separated from each other.

Figure 45G:
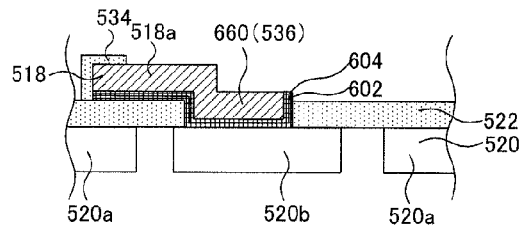
Figure 46G:
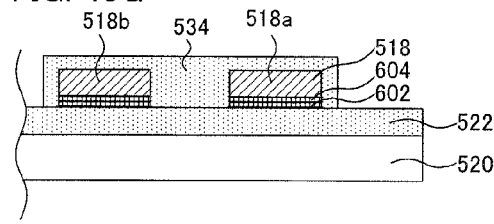
Figure 46C:
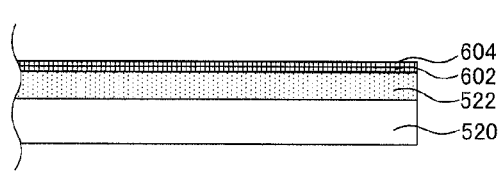

Subsequently, a cover layer 534 made of PI is formed on the top surfaces of the insulating layer 522 and the conductive layer 518 for wiring. Subsequently, resist patterns are formed on the top surface of the cover layer 534 and the bottom surfaces of the metal support layer 520 and the insulating layer 522. Subsequently, the resist pattern is removed by etching the cover layer 534 exposed from the resist pattern (FIGS. 45G and 46G). In this manner, the cover layer 534 is formed to cover the inter-terminal wiring 518a and the inter-terminal wiring 518b.

Figure 45H:
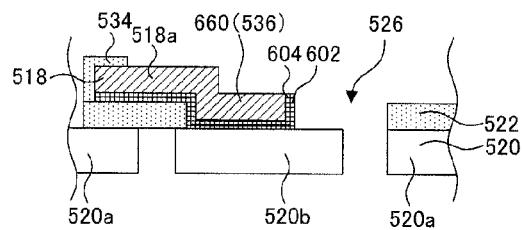
Figure 46H:
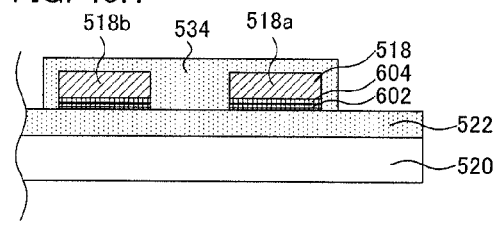
Figure 46D:
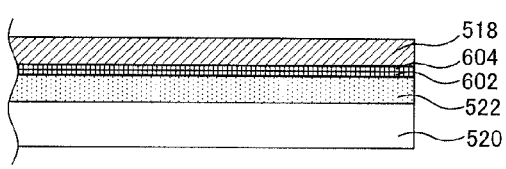

Subsequently, resist patterns are formed on the top surface of the cover layer 534 and the bottom surfaces of the metal support layer 520 and the insulating layer 522, such that a part of the top surface of the insulating layer 522 is exposed. The resist pattern is removed by etching the region of the insulating layer 522 exposed from the resist pattern (FIGS. 45H and 46H). Therefore, a removal section 526, in which the region of the insulating layer 522 located on the terminal section 520b is removed, is formed.

Figure 45I:
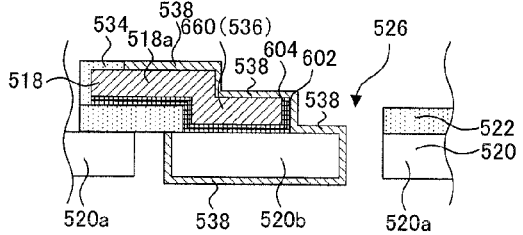
Figure 45J:
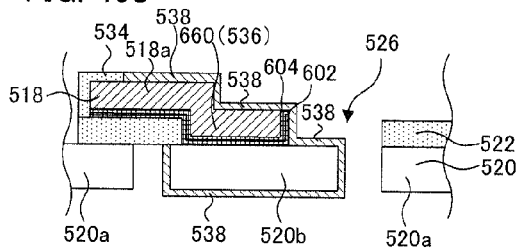
Figure 46I:
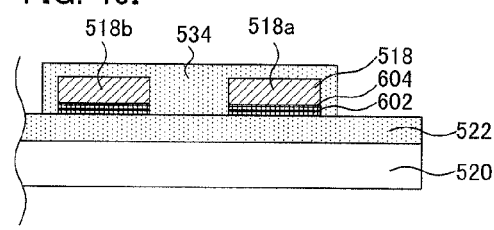
Figure 46E:
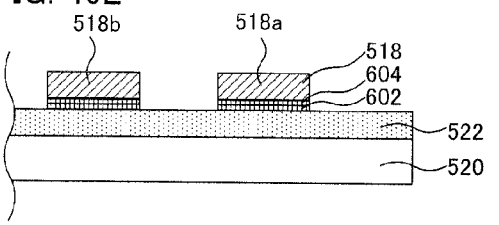
Figure 46J:
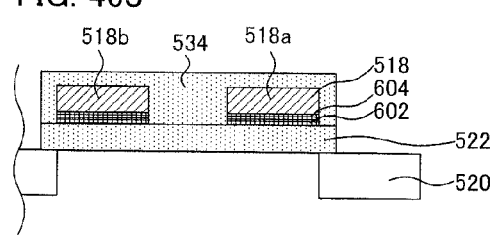

Subsequently, resist patterns are formed on the top surfaces of the metal support layer 520, the insulating layer 522, the conductive layer 518 for wiring, and the cover layer 534, and the bottom surfaces of the metal support layer 520 and the insulating layer 522, such that the top surface and the bottom surface of the terminal section 520b and the top surface of the conductive layer 536 for connection are exposed. Subsequently, on the top surface and the bottom surface of the terminal section 520b and the top surfaces of the conductive layer 536 for connection, the inter-terminal wiring 518a, and the inter-terminal wiring 518b, a wiring plated layer 538 including at least one of Ni and Au is formed in the region exposed from the resist pattern (FIGS. 45I and 46I).

Subsequently, a resist pattern is formed on the bottom surface of the metal support layer 520, such that a part of the metal support layer 520 is exposed. Subsequently, in the metal support layer 520, a region exposed from the resist pattern is etched. In this manner, the metal support layer 520 is removed except for other necessary regions of the support section 520a and the terminal section 520b (FIGS. 45H and 46H). By the above manner, the flexible substrate 510 for suspension illustrated in FIGS. 33 and 34 is formed.

FIGS. 47 and 48 are schematic process cross-sectional views illustrating a fourth example of the method of producing the flexible substrate for suspension of the present invention. The method of producing the flexible substrate for suspension of the fourth example is a method by which the flexible substrate 510 for suspension illustrated in FIGS. 37 and 38 is produced with a layered material. FIGS. 47A to 47H each illustrates a cross-section corresponding to the A-A cross-section of FIG. 37 and is a schematic process cross-sectional view illustrating the element mounting region. FIGS. 48A to 48H each illustrates a cross-section corresponding to the B-B cross-section of FIG. 28 and is a schematic process cross-sectional view illustrating the inter-terminal wirings. Hereinafter, the fourth example of the method of producing the flexible substrate for suspension of the present invention will be described with reference to FIGS. 47 and 48.

Figure 48A:
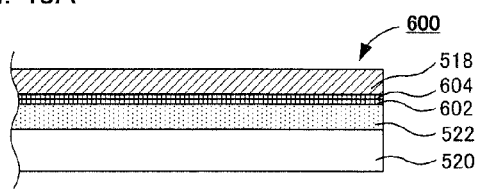
FIGS. 48A to 48H are schematic process cross-sectional views illustrating the fourth example of the method of producing the flexible substrate for suspension of the present invention.

First, a layered material 600 is prepared (FIGS. 47A and 48A). The layered material 600 includes a metal support layer 520 made of SUS, an insulating layer 522 formed on the metal support layer 520 and made of PI, a metal thin-film layer 602 formed on the insulating layer 522, a Cu sputtering layer 604 formed on the metal thin-film layer 602, and a conductive layer 518 for wiring formed on the Cu sputtering layer 604. The metal thin-film layer 602 is a Cr thin-film layer that is formed by a sputtering method.

Figure 48F:
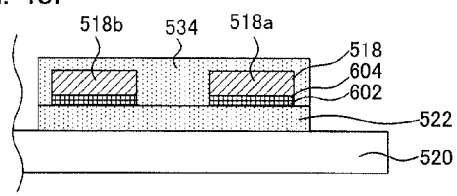
Figure 48B:
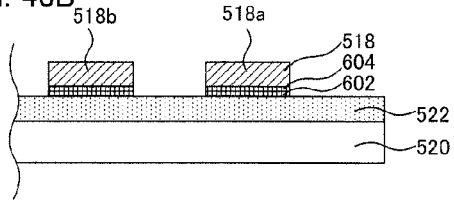

Subsequently, resist patterns are formed on the top surface of the conductive layer 518 for wiring and the bottom surface of the metal support layer 520 by a photolithography method, the resist patterns are removed by etching the metal support layer 520, the conductive layer 518 for wiring, and the Cu sputtering layer 604 exposed from the resist patterns by an etchant such as ferric chloride or the like, and then, the metal thin-film layer 602 is removed (FIGS. 47B and 48B). Therefore, an unnecessary region is removed from the conductive layer 518 for wiring, and also, an inter-terminal wiring 518a and an inter-terminal wiring 518b are formed. Also, the metal support layer 520 is separated into a support section 520a and a terminal section 520b. Furthermore, in order to expose the region to form a via hole 530 to be described below, an opening 740 for via hole passing from the bottom surface side of the metal support layer 520 to the insulating layer 522 side is formed in the terminal section 520b, such that the opening 740 is overlapped with the inter-terminal wiring 518a and the inter-terminal wiring 518b in a planar view of the top surface of the conductive layer 518 for wiring.

Figure 48G:
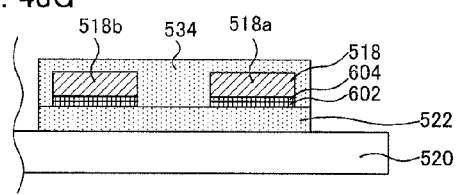
Figure 48C:
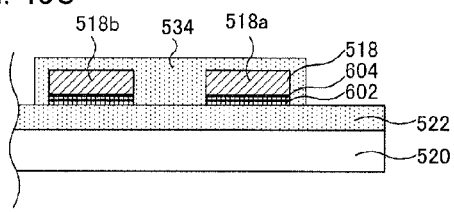

Subsequently, a cover layer 534 made of PI is formed on the top surface of the insulating layer 522 and the bottom surface of the metal support layer 520. Subsequently, a resist pattern is formed on the top surface of the cover layer 534. Subsequently, the resist pattern is removed by etching the cover layer 534 exposed from the resist pattern (FIGS. 47C and 48C). In this manner, the cover layer 534 is formed to cover the inter-terminal wiring 518a and the inter-terminal wiring 518b.

Figure 48H:
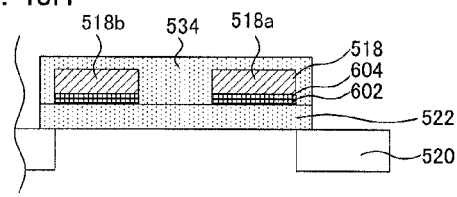
Figure 48D:
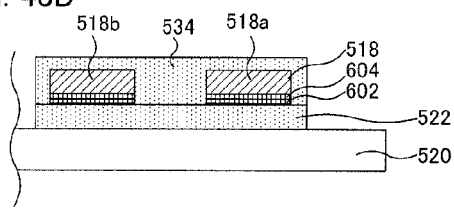

Subsequently, on the top surfaces of the cover layer 534 and the insulating layer 522 and the bottom surfaces of the metal support layer 520 and the insulating layer 522, a resist pattern is formed such that an unnecessary region of the insulating layer 522 is exposed. Subsequently, the resist patterns are removed by etching the insulating layer 522 exposed from the resist pattern (FIGS. 47D and 48D). Therefore, a removal section 526, in which a region located on the terminal section 520b is removed, is formed in the insulating layer 522. Also, by etching the insulating layer 522 exposed to the opening 740 for via hole, a via hole 530 passing from the surface of the insulating layer 522 side of the metal support layer 520 to the surface of the insulating layer 522 side of the conductive layer 518 for wiring is formed.

Figure 48E:
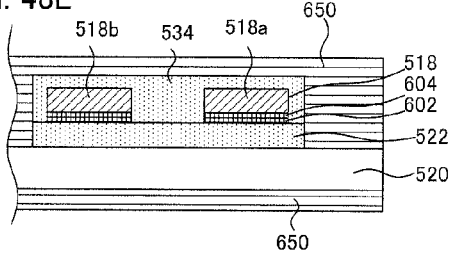

Subsequently, on the top surfaces of the metal support layer 520, the insulating layer 522, and the cover layer 534 and the bottom surfaces of the metal support layer 520 and the insulating layer 522, a resist pattern 650 is formed such that the metal support layer 520 and the insulating layer 522 are exposed from the via hole 530. Subsequently, the metal thin-film layer 602 and the Cu sputtering layer 604 inside the via hole 530 are removed by etching. Subsequently, the via hole 530 is filled with a conductor made of Ni by electrolytic Ni plating (FIGS. 47E and 48E). Subsequently, the resist pattern is removed (FIGS. 47F and 48F). Therefore, the inter-terminal wiring 518a and the inter-terminal wiring 518b are connected to the terminal section 520b by the conductor 532 filled in the via hole.

Subsequently, resist patterns are formed on the top surfaces of the metal support layer 520, the insulating layer 522, and the cover layer 534, and the bottom surface of the metal support layer 520, such that the top surface or the bottom surface of the terminal section 520b is exposed. Subsequently, a wiring plated layer 538 including at least one of Ni and Au is formed on the top surface or the bottom surface of the terminal section 520b exposed from the resist pattern (FIGS. 47G and 48G).

Subsequently, resist patterns are formed on the top surfaces of the metal support layer 520, the insulating layer 522, and the cover layer 534, and the bottom surfaces of the metal support layer 520 and the insulating layer 522. In this case, on the bottom surface of the metal support layer 520, an unnecessary region of the metal support layer 520 is exposed from the resist pattern. Subsequently, the exposed metal support layer 520 is etched. In this manner, the metal support layer 520 is removed except for other necessary regions of the support section 520a and the terminal section 520b (FIGS. 47H and 48H). By the above manner, the flexible substrate 510 for suspension illustrated in FIGS. 37 and 38 is formed.

H. Suspension

Next, the suspension of the present invention will be described. The suspension of the present invention comprises the above-described flexible substrate for suspension.

According to the present invention, since the above-described flexible substrate for suspension is used in the suspension, the mechanical strength of the terminal section to be connected to the element-side terminal can be increased more than the case where the conductive layer for wiring is used as the terminal section. This can prevent the deformation and/or wiring disconnection of the terminal section to be connected to the element-side terminal.

Since specific examples of the suspension of the present invention are identical to the contents described above with reference to FIG. 23, a description thereof will be omitted herein.

The suspension of the present invention comprises at least the flexible substrate for suspension and generally further comprises the load beam. Since the contents of the flexible substrate for suspension are identical to the contents described in "F. Flexible Substrate for Suspension", a description thereof will be omitted herein. Also, the load beam may use the same as the load beam used in the general suspension.

I. Suspension with Element

Next, the suspension with element of the present invention will be described. The suspension with element of the present invention comprises the above-described suspension, and the element to be mounted in the element mounting region of the above-described suspension.

According to the present invention, since the above-described suspension is used in the suspension with element, the mechanical strength of the terminal section to be connected to the element-side terminal can be increased more than the case where the conductive layer for wiring is used as the terminal section. This can prevent the deformation and/or wiring disconnection of the terminal section to be connected to the element-side terminal.

Since specific examples of the suspension with element of the present invention are identical to the contents described above with reference to FIG. 24, a description thereof will be omitted herein.

The suspension with element of the present invention comprises at least the suspension and the element. Since the contents of the suspension are identical to the contents described in "H. Suspension", a description thereof will be omitted herein. Next, the suspension with element of the present invention will be described in detail.

1. Element to be Mounted in Element Mounting Region

First, the element to be mounted in the element mounting region in the present invention will be described. The element to be mounted in the element mounting region includes the element-side terminal to which the terminal section included in the above-described metal support layer is to be connected. Examples of the element to be mounted in the element mounting region may include a slider and a heat-assisted element. Herein, the heat-assisted element is an element that assists recording of data in a magnetic disk by heating a data recording region of the magnetic disk when data is recorded in the magnetic disk by using a magnetic head mounted on a slider. Examples of the heat-assisted element may include an LD element and a microwave generating element.

Also, as the element-side terminal included in the element to be mounted in the element mounting region, first and second examples may be taken. Hereinafter, the first and second examples will be described in detail. The first example of the element-side terminal is a terminal that is provided in the conductive layer for wiring side with reference to the metal support layer.

The first example of the element-side terminal is connected to the terminal section through the removal section in which the insulating layer and the conductive layer for wiring are removed, such that the slider-side terminal 524 illustrated in FIGS. 29 and 30 is connected to the terminal section 520*b* through the removal section 526. As the first example of the element-side terminal, it is preferable that the element-side terminal is provided on the surface facing the metal support layer in the element to be mounted in the element mounting region.

Figure 49:
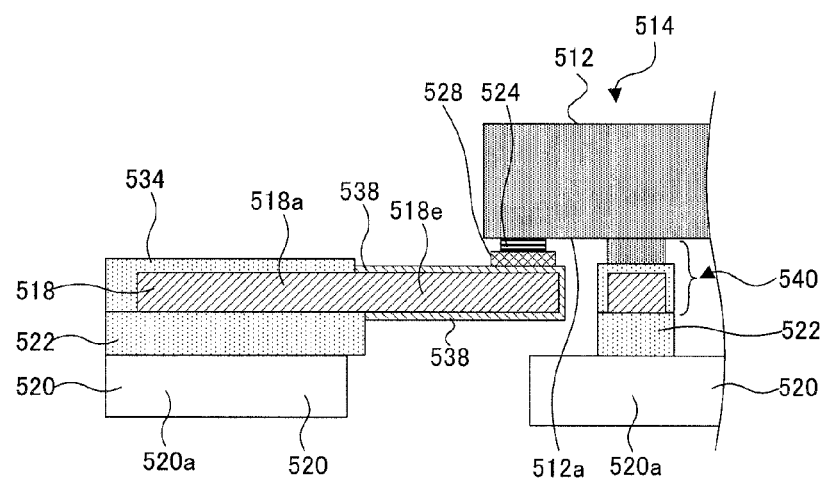
FIG. 49 is a schematic cross-sectional view of an element mounting region in a suspension with element of the prior art.
Figure 50:
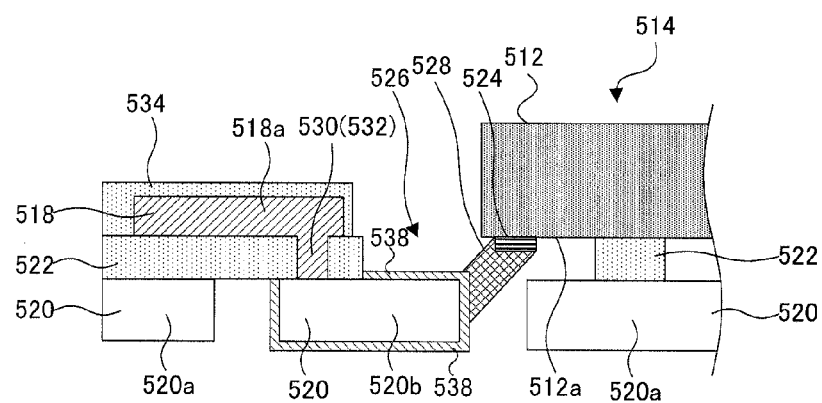
FIG. 50 is a schematic cross-sectional view of an element mounting region in another example of the suspension with element of the present invention.

Herein, FIG. 49 is a schematic cross-sectional view of an element mounting region of a conventional suspension with element in which a terminal section included in a conductive layer for wiring is used as a terminal section to be connected to an element-side terminal. FIG. 50 is a schematic cross-sectional view of an element mounting region in another example of the suspension with element of the present invention. Hereinafter, the reason why, as the first example of the element-side terminal, it is preferable that the element-side terminal is provided on the surface facing the metal support layer in the element to be mounted in the element mounting region will be described with reference to FIGS. 49 and 50.

The suspension with element illustrated in FIGS. 49 and 50 includes a slider-side terminal 524 as the first example of the element-side terminal. The slider-side terminal 524 is provided on a surface 512*a* of a slider 512 facing the metal support layer 520.

In the conventional suspension with element illustrated in FIG. 49, a terminal section 518*e* included in a conductive layer 518 for wiring is used as the terminal section to be connected to the slider-side terminal 524. When the terminal section 518*e* is connected to the slider-side terminal 524 by solder or the like, it is necessary to provide a member 540 for height adjustment on the insulating layer 522 under the slider 512 so as to adjust the slider-side terminal 524 to be located at a position higher than the terminal section 518*e*. Therefore, in the conventional flexible substrate 510 for suspension, since the element mounting region 514 becomes thick and the weight increases, there occurs a problem that attitude control becomes difficult. Also, the terminal section 518*e* needs to extend to directly below the slider-side terminal 524. Therefore, since the weight of the slider-side terminal 524 is loaded to the terminal section 518*e*, there occurs a problem such as the deformation of the terminal section 518*e*.

On the contrary, in the suspension with element of the example of the present invention as illustrated in FIG. 50, the terminal section 520*b* included in the metal support layer 520 is used as the terminal section to be connected to the slider-side terminal 524. Therefore, it is unnecessary to adjust the height of the slider-side terminal 524 by using the member 540 for height adjustment as described above. Therefore, it is possible to solve the above-described problem that attitude control becomes difficult due to the increase of the weight. Also, the terminal section 520*b* can be connected to the slider-side terminal 524 by solder 528 or the like, without extension of the terminal section 520*b* as described above. This can solve the problem that the terminal section 520*b* is deformed because the weight of the slider-side terminal 524 is loaded.

As described above, when the element-side terminal provided on the surface facing the metal support layer in the element to be mounted in the element mounting region is used as the first example of the element-side terminal, the suspension with element of the present invention can solve the problem that attitude control becomes difficult because the element mounting region becomes thick and the weight increases. Also, it is possible to solve the problem that the terminal section is deformed because the weight from the slider-side terminal is loaded to the terminal section.

Also, the second example of the element-side terminal is a terminal that is provided on a side opposite to the conductive layer for wiring side with reference to the metal support layer.

In the element-side terminal of the second example, the terminal section included in the metal support layer can be connected without passing through the removal section in which the insulating layer and the conductive layer for wiring are removed.

The flexible substrate 510 for suspension of the sixth example illustrated in FIGS. 39 and 40 includes a slider 512 and an LD element 550 as the element to be mounted in the element mounting region 514. The slider 512 is formed over the conductive layer 518 for wiring, and the LD element 550 is formed under the slider 512 such that the LD element 550 is overlapped with the slider 512 in the schematic top view of FIG. 39.

The LD element 550 includes, as the second example of the element-side terminal, an LD element-side terminal 552 provided on a side opposite to the conductive layer 518 for wiring side with reference to the metal support layer 520. The LD element-side terminal 552 can be connected to the terminal section 520*b* without passing through the removal section 526 illustrated in FIGS. 29 and 30.

2. Inter-terminal Connecting Section

In the suspension with element of the present invention, the element-side terminal included in the element to be mounted in the element mounting region of the above-described suspension is connected to the above-described terminal section. The element-side terminal is connected to the above-described terminal section by an inter-terminal connecting section such as solder or the like. In the case where the terminal section included in the conductive layer for wiring is used as the terminal section to be connected to the element-side terminal, the inter-terminal connecting section in the present invention is not specially limited as long as there occurs the problem that the terminal section included in the conductive layer for wiring is deformed or disconnected by heat generated when forming the inter-terminal connecting section. Examples of the inter-terminal connecting section may include solder, gold, and copper. The solder, the gold, and the copper are formed by ball bonding or laser soldering. This is because an Au layer is formed on the surface of the element-side terminal by a plating method or a vacuum film formation (deposition method or sputtering method), and solder melted by laser or ultrasonic wave is easily wet-spread on the surface of the Au layer, and therefore, adhesion between the Au layer of the element-side terminal and the connecting section between the wiring plated layer formed in the terminal section and the inter-terminal connecting section becomes excellent.

3. Suspension with Element

Next, the suspension with element of the present invention will be described. Although not specially limited, the suspension with element of the present invention comprises a slider and a heat-assisted element as the element to be mounted in the element mounting region. The heat-assisted element includes, as the element-side terminal to be connected to the terminal section, a heat-assisted element-side terminal provided on a side opposite to the conductive layer for wiring side with reference to the metal support layer, and the slider includes a slider-side terminal provided on the conductive layer for wiring side with reference to the metal support layer. It is preferable that the conductive layer for wiring includes a slider-side terminal connection wiring to be connected to the slider-side terminal.

This is because when the flexible substrate for suspension comprises the slider and the heat-assisted element as the element to be mounted in the element mounting region, the slider-side terminal can be provided at a location close to the conductive layer for wiring. Therefore, when the slider-side terminal is connected to the slider-side terminal connection wiring, not wire bonding but ball bonding can be used. In this manner, when the flexible substrate for suspension of the present invention is used in a hard disk drive or the like, a wire connecting the slider-side terminal to the slider-side terminal connection wiring can be prevented from being disconnected by air resistance generated by a disk rotating at high speed within a hard disk drive to be described below. Also, it is possible to take a structure that exposes the heat-assisted element from the removal section, in which the metal support layer is removed, to the lower side of the metal support layer. Therefore, when the flexible substrate for suspension is used in the hard disk drive or the like, the discharge of heat generated from the heat-assisted element can be accelerated, and thus, it is possible to prevent a temperature rise of the heat-assisted element that generates heat. Furthermore, since the flexible substrate for suspension has high heat dissipation, high energy saving performance can be maintained.

The flexible substrate 510 for suspension illustrated in FIGS. 39 and 40 is an example of the flexible substrate for suspension that achieves such effects. The flexible substrate 510 for suspension comprises a slider 512 and an LD element 550 as the slider and the heat-assisted element. Also, the LD element 550 includes an LD element-side terminal 552 provided on a side opposite to the conductive layer 518 for wiring with reference to the metal support layer 520, as the element-side terminal provided on the side opposite to the conductive layer for wiring side with reference to the metal support layer. Furthermore, the slider 512 includes a slider-side terminal 524 provided on the conductive layer 518 for wiring with reference to the metal support layer 520, as the slider terminal. Furthermore, the conductive layer 518 for wiring includes a slider-side inter-terminal wiring 518f to be connected to the slider-side terminal 524, as the slider-side inter-terminal wiring. In this manner, when the flexible substrate 510 for suspension is used in the hard disk drive or the like, the wire connecting the slider-side terminal 524 included in the slider 512 to the slider-side inter-terminal wiring 518f can be prevented from being disconnected by air resistance or the like. Also, it is possible to take a structure that exposes the LD element 550 from the removal section 526, in which the metal support layer 520 is removed, to the lower side of the metal support layer 520. Therefore, when the flexible substrate 510 for suspension is used in the hard disk drive or the like, the discharge of heat generated from the LD element 550 can be accelerated.

Furthermore, in the flexible substrate 510 for suspension, the terminal section 520 included in the metal support layer 520 and the slider-side inter-terminal wiring 518f included in the conductive layer 518 for wiring can be used as the terminal section to be connected to the LD element-side terminal 552 and the terminal section to be connected to the slider-side terminal 524, respectively. Therefore, the wiring degree of freedom is improved. Also, since the terminal section 520 included in the metal support layer 520 is used as the terminal section to be connected to the LD element-side terminal 552, heat dissipation of the terminal section to be connected to the LD element-side terminal 552 is improved.

J. Hard Disk Drive

Next, a hard disk drive of the present invention will be described. The hard disk drive of the present invention comprises the above-described suspension with element.

According to the present invention, since the above-described suspension with element is used in the hard disk drive, the mechanical strength of the terminal section to be connected to the element-side terminal can be increased more than the case where the conductive layer for wiring is used as the terminal section. This can prevent the deformation and/or wiring disconnection of the terminal section to be connected to the element-side terminal.

Since specific examples of the hard disk drive of the present invention are identical to the contents described above with reference to FIG. 25, a description thereof will be omitted herein.

The hard disk drive of the present invention comprises at least the suspension with element and generally further comprises the disk, the spindle motor, the arm, and the voice coil motor. Since the contents of the suspension with element are identical to the contents described in "I. Suspension with Element", a description thereof will be omitted herein. Also, the other members may use the same members as those used in the general hard disk drive.

Also, the present invention is not limited to the above embodiments. The above embodiments are exemplary, and any case will fall within the technical scope of the present invention as long as it has substantially the same configuration as and achieves the same effect as the technical scope described in claims of the present invention.

EXAMPLES

Hereinafter, the present invention will be described in more detail with reference to examples.

Example 1

First, the two-layer material 100 illustrated in FIGS. 17A and 18A was prepared. Herein, the metal support layer 102 was SUS 304 of 20 μm thick, and the insulating layer 104 was PI of 10 μm thick. Subsequently, as illustrated in FIGS. 17B and 18B, the via hole 106 was formed in the insulating layer 104 by etching the metal support layer 102 and the insulating layer 104.

Subsequently, as illustrated in FIGS. 17C and 18C, the metal thin-film layer 108 made of Cr was formed on the metal support layer 102 exposed from the insulating layer 104 by the sputtering method, and then, the Cu sputtering layer 110 was formed on the metal thin-film layer 108 by the sputtering method.

Subsequently, as illustrated in FIGS. 17D and 18D, the conductive layer 112 made of copper was formed on the Cu sputtering layer 110 by the electrolytic plating. At this time, the conductive layer 112 is also formed inside the via hole 106, and thus, the conductor 114 is formed inside the via hole.

Subsequently, as illustrated in FIGS. 17E and 18E, the resist pattern was formed on the metal support layer 102 and the conductive layer 112 by the DFR, and the metal support layer 102, the conductive layer 112, and the Cu sputtering layer 110 exposed from the resist pattern were etched. In this manner, the metal support layer 102 was separated into the support section 102a and the terminal section 102b. Also, the wiring 116 was formed.

Furthermore, in order to prevent short-circuit of the wiring 116, the metal thin-film layer 108 was removed, except for the region directly below the wiring 116.

Subsequently, as illustrated in FIGS. 17F and 18F, the cover layer 118 made of PI was formed on the conductive layer 112, the resist pattern was formed on the cover layer 118 by the DFR, and the cover layer 118 exposed from the resist pattern was etched. In this manner, the cover layer 118 was formed to cover the wiring 116.

Subsequently, as illustrated in FIGS. 17G and 18G, the resist pattern was formed on the insulating layer 104 by the DFR, and the insulating layer 104 exposed from the resist pattern was etched. Subsequently, as illustrated in FIGS. 17H and 18H, the resist pattern was formed by the DFR, and the wiring plated layer 120 made of Ni and Au was formed on the front surface and the rear surface of the terminal section 102b exposed from the resist pattern.

Subsequently, as illustrated in FIG. 18I, the resist pattern was formed on the metal support layer 102 by the DFR, and the metal support layer 102 exposed from the resist pattern was etched. In this manner, the metal support layer 102 was removed at the support section 102a, the terminal section 102b, and locations other than the outer frame supporting the flexible substrate for suspension. By the above manner, the flexible substrate for suspension including the FL provided with the terminal section 102b of the metal support layer 102 was obtained.

Example 2

First, the two-layer material 100 illustrated in FIGS. 19A and 20A was prepared. Herein, the metal support layer 102 was SUS 304 of 20 μm thick, and the insulating layer 104 was PI of 10 μm thick. Subsequently, as illustrated in FIGS. 19B and 20B, the opening 122 was formed in the insulating layer 104 by etching the metal support layer 102 and the insulating layer 104.

Subsequently, as illustrated in FIGS. 19C and 20C, the metal thin-film layer 108 made of Cr was formed to 0.05 μm on the metal support layer 102 exposed from the insulating layer 104 by the sputtering method, and then, the Cu sputtering layer 110 was formed to 0.3 μm on the metal thin-film layer 108 by the sputtering method.

Subsequently, as illustrated in FIGS. 19D and 20D, the conductive layer 112 made of copper was formed to 9 μm on the metal thin-film layer 110 by the electrolytic plating. Subsequently, as illustrated in FIGS. 19E and 20E, the resist pattern was formed on the metal support layer 102 and the conductive layer 112 by the DFR, and the metal support layer 102, the conductive layer 112, and the Cu sputtering layer 110 exposed from the resist pattern were etched. In this manner, the metal support layer 102 was separated into the support section 102a and the terminal section 102b. Also, the wiring 116 and the conductive layer 124 for connection were formed.

Furthermore, in order to prevent short-circuit of the wiring 116, the metal thin-film layer 108 was removed, except for the region directly below the wiring 116.

Subsequently, as illustrated in FIGS. 19F and 20F, the cover layer 118 made of PI was formed on the conductive layer 112, the resist pattern was formed on the cover layer 118 by the DFR, and the cover layer 118 exposed from the resist pattern was etched. In this manner, the cover layer 118 was formed to cover the wiring 116. Subsequently, as illustrated in FIGS. 19G and 20G, the resist pattern was formed on the insulating layer 104 by the DFR, and the insulating layer 104 exposed from the resist pattern was etched.

Subsequently, as illustrated in FIGS. 19H and 20H, the resist pattern was formed by the DFR, and the wiring plated layer 120 made of Ni and Au was formed on the front surface and the rear surface of the terminal section 102b exposed from the resist pattern.

Subsequently, as illustrated in FIG. 20I, the resist pattern was formed on the metal support layer 102 by the DFR, and the metal support layer 102 exposed from the resist pattern was etched. In this manner, the metal support layer 102 was removed at the support section 102a, the terminal section 102b, and locations other than the outer frame supporting the flexible substrate for suspension. By the above manner, the flexible substrate for suspension including the FL provided with the terminal section 102b of the metal support layer 102 was obtained.

Comparative Example 1

FIGS. 26 and 27 are schematic process cross-sectional views illustrating Comparative Example 1 of the method of producing the substrate for wiring circuit of the present invention.

Figure 26A:
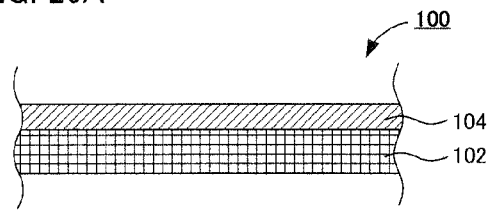
FIGS. 26A to 26G are schematic process cross-sectional views illustrating Comparative Example 1 of the method of producing the substrate for wiring circuit of the present invention.
Figure 27A:
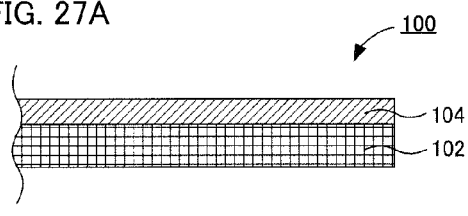
FIGS. 27A to 27H are schematic process cross-sectional views illustrating Comparative Example 1 of the method of producing the substrate for wiring circuit of the present invention.

In Comparative Example 1, first, the two-layer material 100 illustrated in FIGS. 26A and 27A was prepared. Herein, the two-layer material including the metal support layer 102 that was SUS 304 of 20 μm thick, and the insulating layer 104 that was PI of 10 μm thick, was prepared.

Figure 26F:
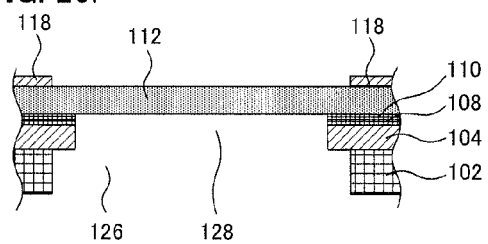
Figure 26B:
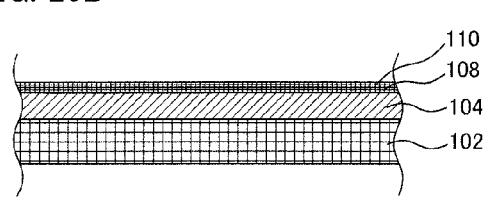
Figure 27B:
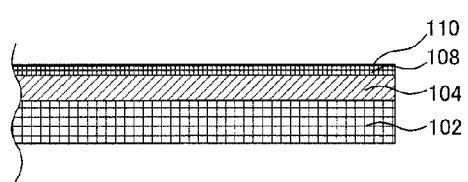

Subsequently, as illustrated in FIGS. 26B and 27B, the metal thin-film layer 108 made of Cr was formed to 0.05 μm on the insulating layer 104 by the sputtering method, and then, the Cu sputtering layer 110 was formed to 0.3 μm on the metal thin-film layer by the sputtering method.

Figure 26G:
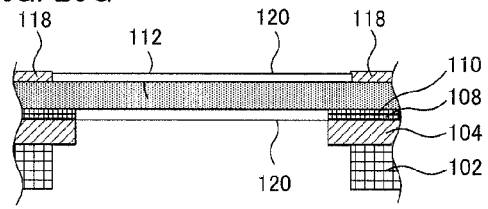
Figure 26C:
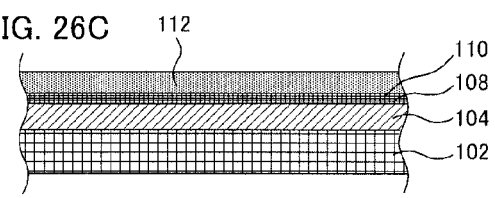
Figure 27C:
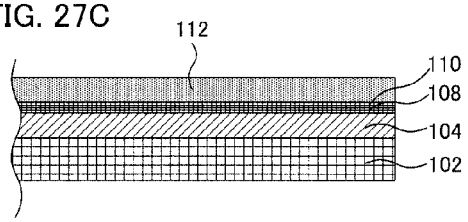

Subsequently, as illustrated in FIGS. 26C and 27C, the conductive layer 112 made of copper was formed to 9 μm on the Cu sputtering layer 110 by the electrolytic plating.

Figure 26D:
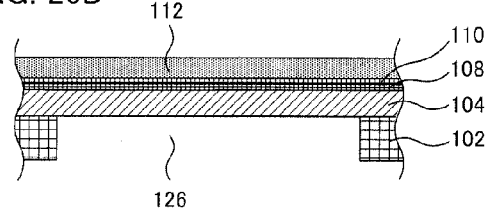
Figure 26E:
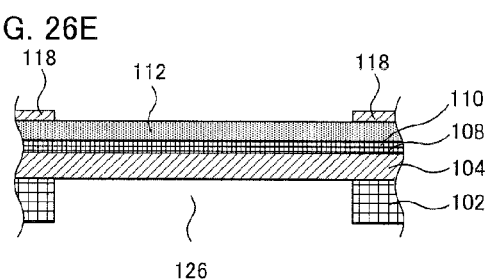
Figure 27D:
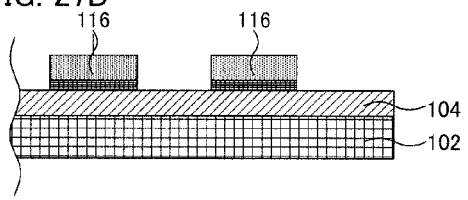

Subsequently, as illustrated in FIGS. 26D and 27D, the resist pattern was formed on the metal support layer 102 and the conductive layer 112 by the DFR, and the metal support layer 102, the conductive layer 112, and the Cu sputtering layer 110 exposed from the resist pattern were etched. In this manner, in the metal support layer 102, the opening 126 was formed at the location for formation of the FL. Subsequently, the wiring 116 was formed.

Furthermore, in order to prevent short-circuit of the wiring 116, the metal thin-film layer 108 was removed, except for the region directly below the wiring 116.

Figure 27E:
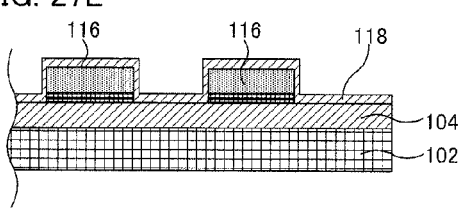

Subsequently, as illustrated in FIGS. 265 and 27E, the cover layer 118 made of PI was formed on the conductive layer 112, the resist pattern was formed on the cover layer 118 by the DFR, and the cover layer 118 exposed from the resist pattern was etched. In this manner, the cover layer 118 was formed to cover the wiring 116.

Figure 27F:
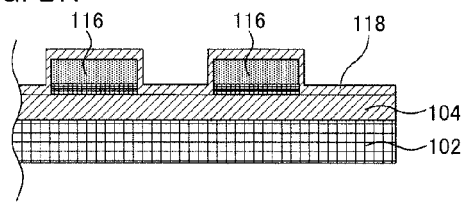
Figure 27G:
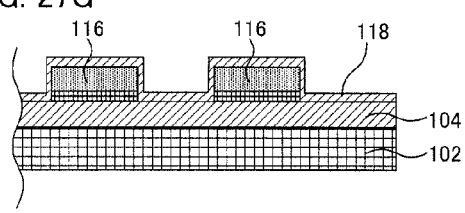

Subsequently, as illustrated in FIGS. 26F and 27F, the resist pattern was formed on the insulating layer 104 by the DFR, and the insulating layer 104 exposed from the resist pattern was etched. In this manner, in the insulating layer 104, the opening 128 was formed at the location for formation of the FL.

Subsequently, as illustrated in FIG. 26G, the wiring plated layer 120 made of Ni and Au was formed on the front surface of the conductive layer 112 exposed from the cover layer 118 and the rear surface of the conductive layer 112 exposed to the opening 128.

Figure 27H:
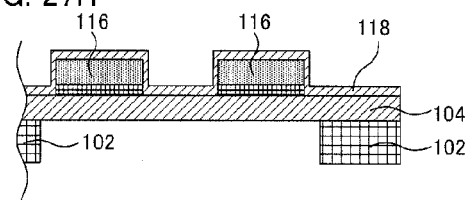

Subsequently, as illustrated in FIG. 27H, the resist pattern was formed on the metal support layer 102 by the DFR, and the metal support layer 102 exposed from the resist pattern was etched. In this manner, the metal support layer 102 was removed, except for the outer frame supporting the flexible substrate for suspension. By the above manner, the flexible substrate for suspension including the FL provided with the conductive layer 112 was obtained.

[Evaluation]

In the flexible substrates for suspension obtained in examples 1 and 2 and Comparative Example 1, after the FL was connected to the terminal of the external circuit made of a gold pad by applying ultrasonic vibration by using the bonding tool, a peeling test was performed to measure connection strength. The results are shown in Table 1.

TABLE 1

|  | EXAMPLE 1 | EXAMPLE 2 | COMPARATIVE EXAMPLE 1 |
|---|---|---|---|
| PEELING TEST STRENGTH (mN) | 590 | 590 | 490 |

From Table 1, the peeling test strength of Examples 1 and 2 was increased more than Comparative Example 1. It is considered that while the FL according to Comparative Example 1 is provided with the conductive layer 112 made of copper, the FL according to Examples 1 and 2 is provided with the terminal section 102b of the metal support layer 102 made of SUS 304.

REFERENCE SIGNS LIST 10 flexible substrate for suspension
12 element mounting region
14 connecting region
16 conductive layer for wiring
16a wiring
18 metal support layer
20 insulating layer
22 opening
24 support section
26 terminal section
28 conductor inside via hole
30 separating section
510 flexible substrate for suspension
514 element mounting region
518 conductive layer for wiring
518a inter-terminal wiring
520 metal support layer
520a support section
520b terminal section
522 insulating layer
532 conductor inside via hole
536 conductive layer for connection

The invention claimed is:

1. A wiring circuit substrate, comprising:
a metal support layer;
an insulating layer formed on the metal support layer;
a conductive layer for wiring formed on the insulating layer; and
an opening formed so as to open at a same location in the insulating layer and the conductive layer for wiring,
wherein the metal support layer includes:
a support section that supports the insulating layer and the conductive layer for wiring, and
a terminal section that extends from one edge side to the other edge side of the opening, the terminal section being separated from the support section; and
the conductive layer for wiring includes a wiring that is connected to the terminal section by a connecting section, and
wherein the connecting section is a conductor inside a via hole formed in the insulting layer, and
the conductive layer for wiring further comprises a separating section that is formed between the conductor inside the via hole and the opening, the separating section being separate from the wiring.

2. The wiring circuit substrate according to claim 1, wherein a plated layer including at least one of Ni and Au are formed on a front surface and a rear surface of the terminal section.

3. A method of producing a wiring circuit substrate, which produces the wiring circuit substrate according to claim 2, the method comprising steps of:
forming the terminal section;
connecting the wiring to the terminal section by the connecting section; and
forming the plated layers each including at least one of Ni and Au on front surfaces and rear surfaces of the terminal section and the connecting section.

4. A flexible substrate for suspension, comprising:
the wiring circuit substrate according to claim 1.

5. A suspension, comprising:
the wiring circuit substrate according to claim 1.

6. A suspension with element, comprising:
the suspension according to claim 5; and
an element mounted in an element mounting region of the suspension.

7. A hard disk drive, comprising the suspension with element according to claim 6.

8. A flexible substrate for suspension, comprising:
a metal support layer;
an insulating layer formed on the metal support layer;
a conductive layer for wiring formed on the insulating layer; and
an element mounting region,
wherein the metal support layer includes:
a support section that supports the insulating layer and the conductive layer for wiring, and
a terminal section that is separated from the support section;
the terminal section is connected to an element-side terminal included in an element to be mounted in the element mounting region; and
the conductive layer for wiring includes an inter-terminal wiring that is connected to the terminal section by a connecting section, and
wherein the terminal section is a cantilever structure having a communicative opening in a longitudinal direction end of the terminal section, in which a metal support layer opening, an insulating layer opening and an opening for a conductive layer for wiring coincide in a plan view in the communicative opening.

9. The flexible substrate for suspension according to claim 8, wherein the connecting section is a conductor filled in a via hole that is formed in the insulating layer and passes from a side of the conductive layer for wiring to a side of the metal support layer.

10. The flexible substrate for suspension according to claim 8, wherein the connecting section is a conductor filled in a via hole that is formed in the metal support layer and the insulating layer and passes from a side of the metal support layer opposite to a side of the insulating layer to a side of the conductive layer for wiring of the insulating layer.

11. The flexible substrate for suspension according to claim 8, wherein the connecting section is a conductive layer for connection formed on the terminal section.

12. The flexible substrate for suspension according to claim 8, wherein a plated layer including at least one of Ni and Au is formed on a front surface and a rear surface of the terminal section.

13. A method of producing a flexible substrate for suspension, which produces the flexible substrate for suspension according to claim 8, the method comprising steps of:
forming the terminal section; and
forming the connecting section.

14. A suspension, comprising the flexible substrate for suspension according to claim 8.

15. A suspension with element, comprising:
the suspension according to claim 14; and
an element to be mounted in the element mounting region.

16. The suspension with element according to claim 15, wherein the element-side terminal included in the element to be mounted in the element mounting region is provided on a surface facing the metal support layer in the element to be mounted in the element mounting region.

17. The suspension with element according to claim 15, wherein an element-side terminal included in the element to be mounted in the element mounting region is provided in a side opposite to a side of the conductive layer for wiring with reference to the metal support layer.

18. The suspension with element according to claim 15, wherein the suspension with element includes a slider and a heat-assisted element as the element to be mounted in the element mounting region, the heat-assisted element includes, as an element-side terminal to be connected to the terminal section, a heat-assisted element-side terminal provided in a side opposite to a side of the conductive layer for wiring with reference to the metal support layer, the slider includes a slider-side terminal provided in the side of the conductive layer for wiring with reference to the metal support layer, and the conductive layer for wiring includes a slider-side terminal connection wiring to be connected to the slider-side terminal.

19. A hard disk drive, comprising the suspension with element according to claim 15.

20. The flexible substrate for suspension according to claim 8, wherein the insulating layer is formed on the terminal section.

21. The flexible substrate for suspension according to claim 20, wherein an insulating layer is formed in at least a part of a region between the adjacent terminal portions and is formed to be consecutive to the insulating layer formed on the terminal portion.

22. The flexible substrate for suspension according to claim 8, wherein the insulating layer and the conductive layer for wiring are formed in this order on the terminal section.

23. The flexible substrate for suspension according to claim 8, wherein the terminal section is exposed by a removal section in which the insulating layer and the conductive layer for wiring are removed.

24. The flexible substrate for suspension according to claim 8, wherein the connecting section Is provided on a leading end side which is opposite to an external circuit connecting region when viewed from an end of an external circuit connecting region side in the element mounting region.

* * * * *